(12) United States Patent
Takeuchi et al.

(10) Patent No.: US 7,064,691 B2
(45) Date of Patent: Jun. 20, 2006

(54) NOISE SUPPRESSION CIRCUIT, ASIC, NAVIGATION APPARATUS, COMMUNICATION CIRCUIT, AND COMMUNICATION APPARATUS HAVING THE SAME

(75) Inventors: Hideki Takeuchi, Tokyo (JP); Masami Murakata, Tokyo (JP); Masaaki Yamada, Tokyo (JP); Reiko Nojima, Tokyo (JP); Takashi Ishioka, Tokyo (JP); Mutsunori Igarashi, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 668 days.

(21) Appl. No.: 10/213,065

(22) Filed: Aug. 7, 2002

(65) Prior Publication Data

US 2003/0011500 A1 Jan. 16, 2003

Related U.S. Application Data

(62) Division of application No. 09/146,035, filed on Sep. 2, 1998, now Pat. No. 6,459,331.

(30) Foreign Application Priority Data

| Sep. 2, 1997 | (JP) | ................................. P9-237303 |
| Sep. 11, 1997 | (JP) | ................................. P9-247202 |
| Mar. 26, 1998 | (JP) | ................................. P10-079156 |

(51) Int. Cl.
*H03M 7/20* (2006.01)
*H04B 1/38* (2006.01)
*H04L 5/16* (2006.01)
*H04H 7/00* (2006.01)

(52) U.S. Cl. ....................... 341/102; 375/219; 455/3.06

(58) Field of Classification Search .................. 341/58, 341/59, 102; 375/295, 219, 222; 379/387.02, 379/399.02; 455/3.06, 550.1, 403; 348/14.01; 327/551, 554
See application file for complete search history.

(56) References Cited

U.S. PATENT DOCUMENTS 4,486,739 A * 12/1984 Franaszek et al. ............ 341/59
4,965,883 A * 10/1990 Kirby ........................... 714/49

(Continued)

FOREIGN PATENT DOCUMENTS

JP 59-212027 11/1984

(Continued)

OTHER PUBLICATIONS

Takashima et al., "Noise Suppression Scheme for Giga-Scale DRAM with Hundreds of I/Os", 1996, pp. 43-49, no month.

*Primary Examiner*—Patrick Wamsley
(74) *Attorney, Agent, or Firm*—Foley & Lardner LLP

(57) ABSTRACT

A noise suppression circuit encompasses an internal circuit, a bypass capacitor, first and second transistors. The internal circuit has high and low level terminals, and the low level terminal is connected to a low level power supply line. The internal circuit is supplied with enable and inverted enable signals. The first transistor has a first control electrode, and one main electrode is connected to the high level terminal. The first control electrode is supplied with the inverted enable signal. The bypass capacitor is connected between the other main electrode of the first transistor and the low level power supply line. The second transistor is connected between the other main electrode of the first transistor and a high level power supply line. The second transistor has a second control electrode supplied with the enable signal. The second transistor is not conductive when the internal circuit is active.

3 Claims, 40 Drawing Sheets

U.S. PATENT DOCUMENTS

| | | | |
|---|---|---|---|
| 5,022,051 A * | 6/1991 | Crandall et al. | 375/292 |
| 5,367,187 A | 11/1994 | Yuen | |
| 5,612,694 A * | 3/1997 | Jedwab et al. | 341/94 |
| 5,692,021 A * | 11/1997 | Walker | 375/354 |
| 5,764,648 A * | 6/1998 | Yamane et al. | 370/516 |
| 5,825,824 A * | 10/1998 | Lee et al. | 375/292 |
| 6,047,175 A * | 4/2000 | Trompower | 455/452.1 |
| 6,191,647 B1 | 2/2001 | Tanaka et al. | |
| 6,198,413 B1 * | 3/2001 | Widmer | 341/59 |
| 6,215,982 B1 * | 4/2001 | Trompower | 455/63.3 |
| 6,351,501 B1 * | 2/2002 | Murdock | 375/292 |
| 6,510,324 B1 * | 1/2003 | Fukumura | 455/550.1 |
| 6,621,427 B1 * | 9/2003 | Greenstreet | 341/58 |
| 6,636,166 B1 * | 10/2003 | Sessions et al. | 341/63 |
| 6,661,360 B1 * | 12/2003 | Lambert | 341/131 |
| 6,711,258 B1 * | 3/2004 | Sung | 379/390.01 |
| 6,876,315 B1 * | 4/2005 | Widmer | 341/58 |
| 6,906,996 B1 * | 6/2005 | Ballantyne | 370/204 |
| 6,987,947 B1 * | 1/2006 | Richenstein et al. | 455/3.06 |

FOREIGN PATENT DOCUMENTS

JP         360217724         10/1985

* cited by examiner

GN

DIN

Q

VDD 203 nMOS TRANSISTOR COLUMN
204 pMOS TRANSISTOR COLUMN 262  263

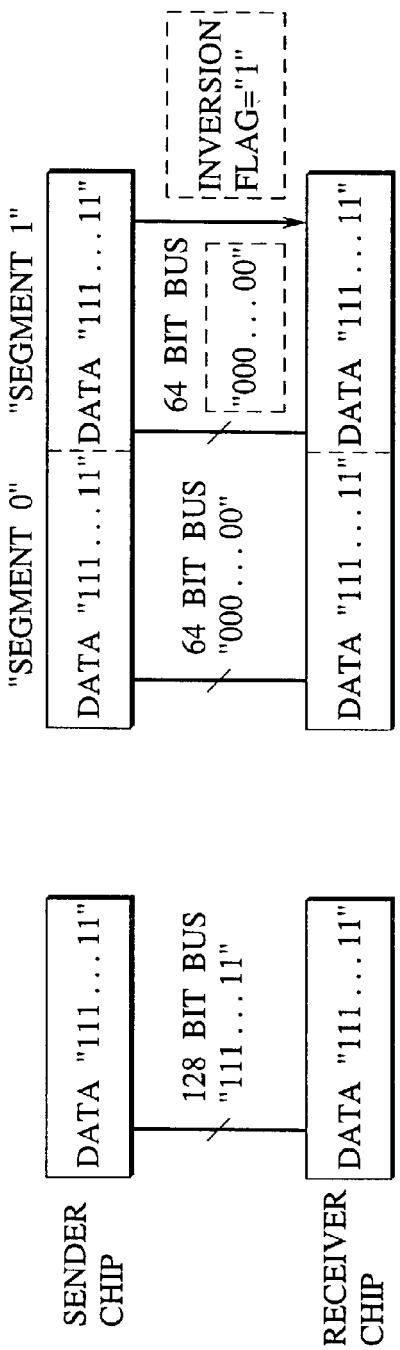
FIG.7B PRIOR ART
FIG.7A PRIOR ART
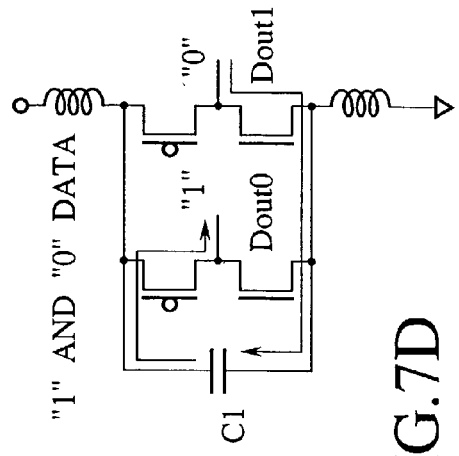
FIG.7D PRIOR ART
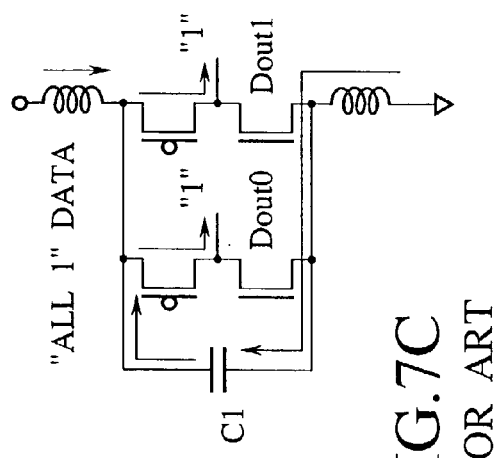
FIG.7C PRIOR ART

FIG.8
PRIOR ART

| | BLOCK 0 | BLOCK 1 | BLOCK 2 | BLOCK 3 | |
|---|---|---|---|---|---|
| FLAG | 0......15 | 16... 31 | 32.... 47 | 48.... 63 | |
| | 0 0........0 | 0..... 0 | 0 1......1 | 10101010 | (BEFORE SENDING) |
| | 1 0........0 | 1......1 | 1 1......1 | 01010101 | (AFTER ENCODING) |

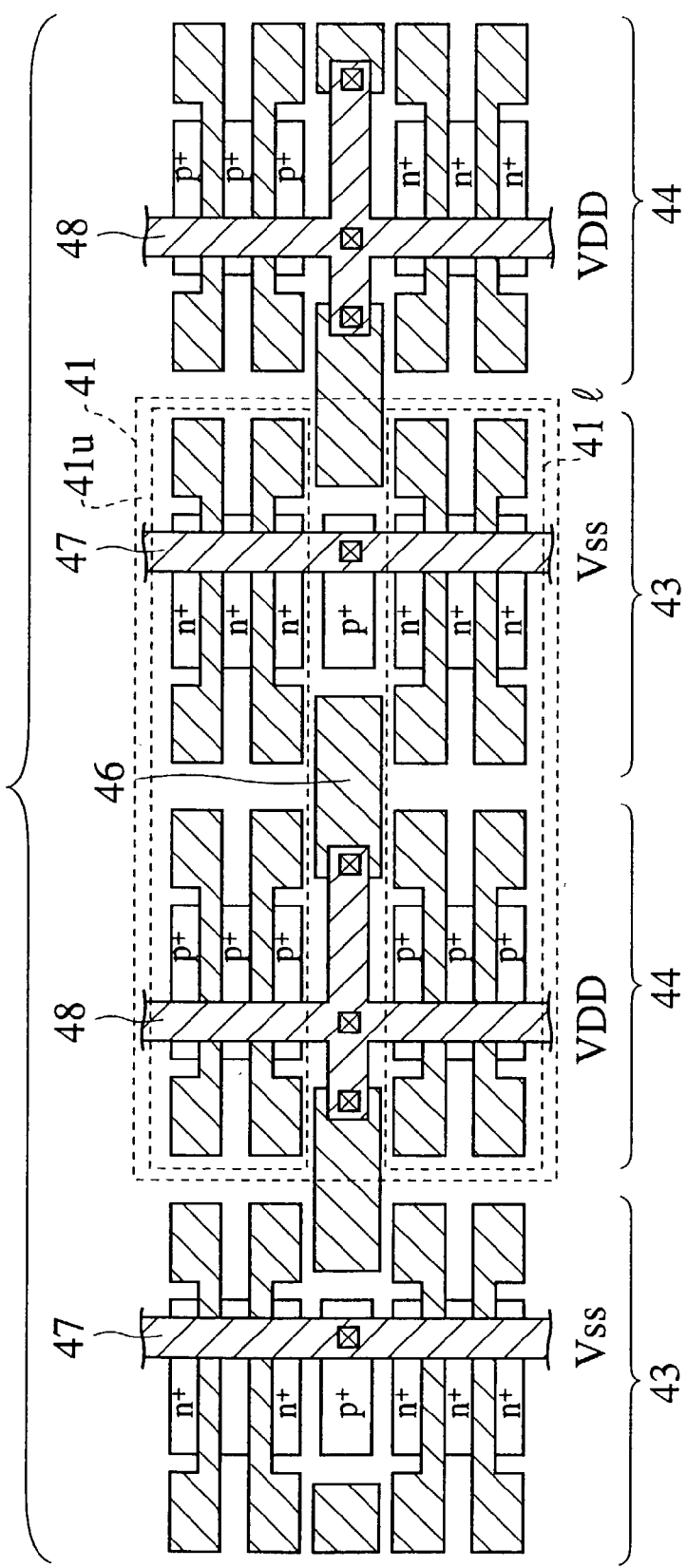

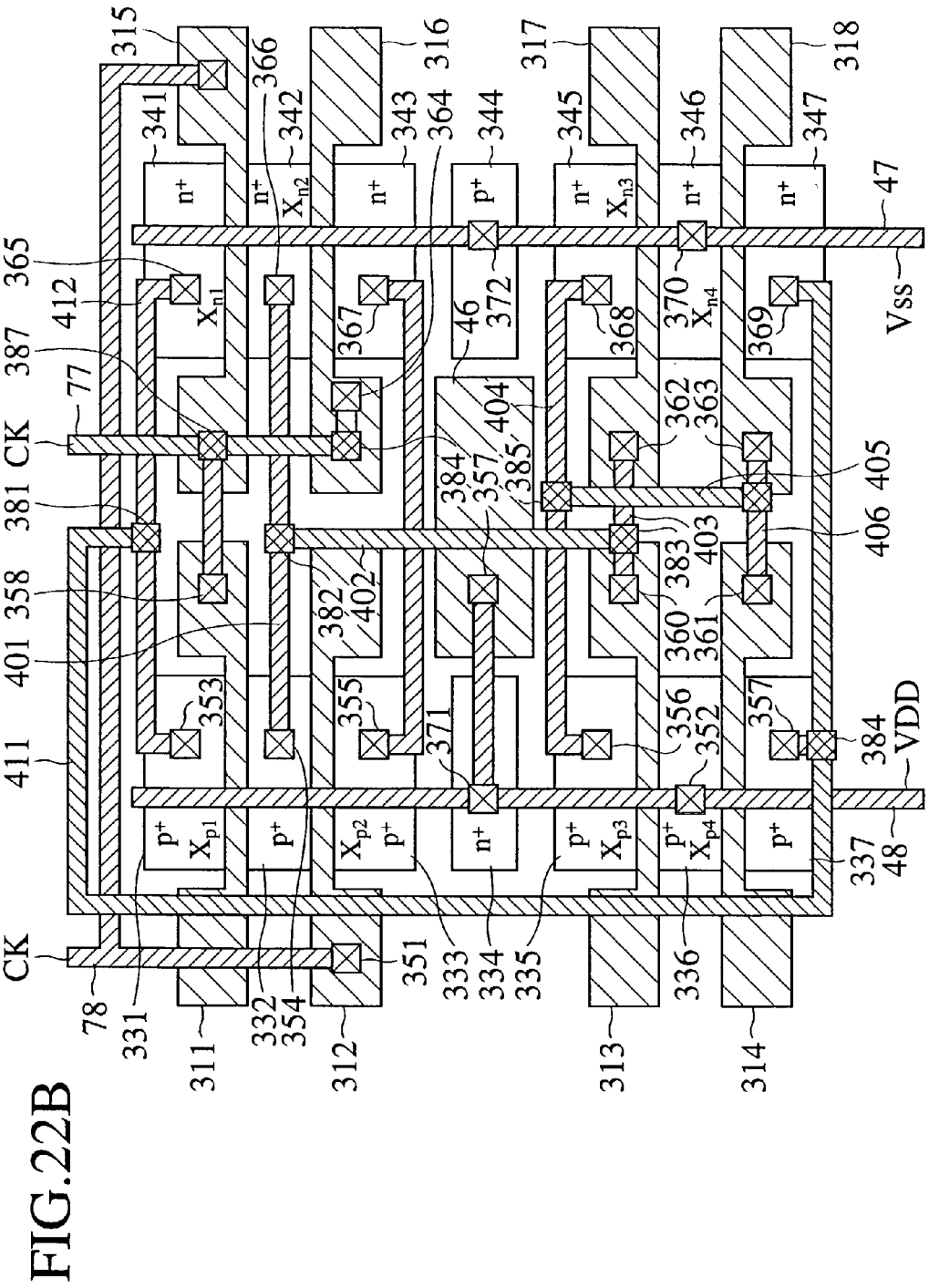

FIG.28A

| 4 BIT DATA | → | 6 BIT DATA |
|---|---|---|
| $(x_0, x_1, x_2, x_3)$ | → | $(y_0, y_1, y_2, y_3, y_4, y_5)$ |
| (0,0,0,0) | → | (0,0,1,1,1,0) |
| (0,0,0,1) | → | (0,0,0,1,1,1) |
| (0,0,1,0) | → | (0,0,1,0,1,1) |
| (0,0,1,1) | → | (0,0,1,1,0,1) |
| (0,1,0,0) | → | (0,1,0,0,1,1) |
| (0,1,0,1) | → | (0,1,0,1,0,1) |
| (0,1,1,0) | → | (0,1,1,0,0,1) |
| (0,1,1,1) | → | (0,1,1,1,0,0) |
| (1,0,0,0) | → | (1,0,0,0,1,1) |
| (1,0,0,1) | → | (1,0,0,1,1,0) |
| (1,0,1,0) | → | (1,0,1,0,1,0) |
| (1,0,1,1) | → | (1,0,1,1,0,0) |
| (1,1,0,0) | → | (1,1,0,0,1,0) |
| (1,1,0,1) | → | (1,1,0,1,0,0) |
| (1,1,1,0) | → | (1,1,1,0,0,0) |
| (1,1,1,1) | → | (1,1,0,0,0,1) |

FIG.28B

| NAME | MATHEMATICAL SYMBOL | CIRCUIT SYMBOL |
|---|---|---|
| NOT | -(over bar) | —▷o— |
| OR | + | —⊃— |
| AND | · | —⊃— |
| EXCLUSIVE-OR | ⊕ | —⊅— |

FIG.28C

| EQUATION |
|---|
| $y_0 = x_0$ |
| $y_1 = x_1$ |
| $y_2 = x_2 \oplus (\overline{x}_0 \cdot \overline{x}_1 \cdot \overline{x}_2 \cdot \overline{x}_3 + x_0 \cdot x_1 \cdot x_2 \cdot x_3)$ |
| $y_3 = x_3 \oplus (\overline{x}_0 \cdot \overline{x}_1 \cdot \overline{x}_2 \cdot \overline{x}_3 + x_0 \cdot x_1 \cdot x_2 \cdot x_3)$ |
| $y_4 = \overline{x}_3 \oplus (\overline{x}_1 \cdot \overline{x}_2 \cdot x_3 + x_1 \cdot x_2 \cdot \overline{x}_3)$ |
| $y_5 = \overline{x}_0 \oplus (\overline{x}_1 \cdot \overline{x}_2 \cdot x_3 + x_1 \cdot x_2 \cdot \overline{x}_3)$ |

NOISE SUPPRESSION CIRCUIT, ASIC, NAVIGATION APPARATUS, COMMUNICATION CIRCUIT, AND COMMUNICATION APPARATUS HAVING THE SAME

This application is a divisional of U.S. patent application Ser. No. 09/146,035, filed Sep. 2, 1998, now U.S Pat. No. 6,459,331, which is incorporated herein in its entirety.

BACKGROUND OF THE INVENTION

1. Field of the Invention

The present invention relates to a technique to suppress an electromagnetic radiation noise, and more particularly to a switching noise suppression circuit to suppress a switching noise of a circuit in which an activation and a inactivation are repeated by an enable signal, a built-in noise filter type data holding circuit in which this switching noise suppression circuit is built, a car navigation apparatus which comprises this built-in noise filter type data holding circuit, a communication circuit for sending and receiving a digital signal through data buses and a communication apparatus which comprises this circuit. Moreover, the present invention relates to a technique to suppress an electromagnetic radiation noise in an application-specific integrated circuit (ASIC).

2. Description of the Related Art

Recently, an environment problem of an electromagnetic radiation has been largely taken up. The generation of an EMI (electromagnetic interference) noise may cause another electronic apparatus to be erroneously operated, which may result in a serious trouble.

The EMI noise is roughly classified into the three basic types listed below:

(1) a conduction noise from a power supply line;
(2) a leakage noise from a port; and
(3) a radiation noise from an LSI surface.

The (1) conduction noise from the power supply line depends on a waveform of a power supply current, and is conducted/radiated with the power supply line as an antenna. In a case of the (2) leakage noise from the port, a change of a potential of the power supply is conducted/radiated from a pin of an LSI, such as a port and the like, with an external wire as an antenna. The (3) radiation noise from the LSI surface is mainly radiated from the LSI surface to space with a current loop as an antenna.

Among them, the conduction noise from the power supply line has the largest possibility of having a bad influence on other electronic apparatuses. Thus, the counter-plan thereof is of urgent necessity. As for this conduction noise from the power supply line, a change of a signal inputted to a circuit causes the power supply current to be changed, which results in the generation of the noise. This is typically referred to as a switching noise. Conventionally, an RC filter is inserted as shown in FIG. 1, in order to suppress such a switching noise.

In FIG. 1, a capacitor C is referred to as "a bypass capacitor", and a resistor R is referred to as "a limiter resistor". For example, the bypass capacitor C is made of the gate capacitance of transistors constituting an LSI. The limiter resistor R is made of a polysilicon-resistor or an aluminum resistor which is mounted on the predetermined portions of a semiconductor chip constituting the LSI. Moreover, in FIG. 1, an enable signal GN is a signal based on a clock signal, and an internal circuit 101 is constituted by, for example, a latch.

FIGS. 2A to 2D are views of showing waves at respective nodes when the circuit shown in FIG. 1 is simulated by using simulation program with integrated circuit emphasis (SPICE). Then, FIG. 2A shows a voltage waveform of the enable signal GN, FIG. 2B shows a voltage waveform of an input signal DIN, FIG. 2C shows a voltage waveform of an output signal Q and FIG. 2D shows a current waveform of a high level power supply line VDD.

When the enable signal GN is triggered to the internal circuit 101 connected to the high level power supply line VDD, the power supply current flows. If the activation current GN is similarly repeated for each constant period as shown in FIG. 2A, the power supply current also has a constant period as can be seen from FIG. 2D. An electromagnetic wave radiated by this power supply current can be determined by using the Maxwell equations. However, a noise analysis is usually performed by performing a Fourier analysis on the power supply current and using a spectrum represented as a transmission amount (dB) to a reference value for each frequency.

FIG. 3 shows the spectrum to the power supply current shown in FIG. 2D. A reference value of a noise level shown on a vertical axis in FIG. 3 is assumed to be 1 A. Hereafter, a reference value is assumed to be 1 A when the spectrum of the noise is similarly shown. It is presumed that a smaller transmission amount (dB) has a lower noise level. Similarly, the power of a radiation can be represented by using the spectrum. However, it is omitted.

In FIG. 1, when the enable signal GN is triggered and the internal circuit 101 is operated, a current is supplied from the high level power supply line VDD and further a current is supplied from charges accumulated in the bypass capacitor C. At this time, the current running through the high level power supply line VDD is limited by the limiter resistor R. Thus, the sudden change of the power supply current becomes small. This results in the reduction of the noise level as compared with a case having no RC filter.

In the prior art shown in FIG. 1, the noise filter constituted by the limiter resistor R and the bypass capacitor C as shown in FIG. 1 is used to suppress the switching noise. However, especially, since many latches used in an integrated circuit are simultaneously operated in synchronization with a clock, the power supply current suddenly flows to thereby generate the switching noise. At this time, if the capacitance of the bypass capacitor C is small and a load current is large, the switching noise may exceed an allowable value.

That is, in the conventional configuration in FIG. 1, the load current consumed by the internal circuit 101 is directly supplied from the high level power supply line VDD to thereby cause the sudden flow of the power supply current. Hence, it is necessary to mount the bypass capacitor C having a large capacitance in order to sufficiently suppress the switching noise generated at that time.

However, it is conventionally difficult to insert the bypass capacitor having the large capacitance in the view of a limitation of a chip area, a cost and the like when the RC filter is inserted into the chip of the LSI. After all, the consideration of the chip area and the cost leads to the unavoidable utilization of the bypass capacitor having the small capacitance for them. In this case, it is very difficult to sufficiently suppress the switching noise generated by the sudden change of the power supply current. In the present condition, it is also impossible to deal with the generation of the switching noise which exceeds the allowable value.

Incidentally, a semicustom design methodology of using a gate array and a standard cell has been mainly used as an approach of designing the LSI in order to respond to a requirement of shortening a turn around time (TAT) of a product and a system. In the gate array, as shown in FIG. 4A, a master chip in which basic cells 201 composed of a plurality of transistors are arranged in a form of a grid is made in advance, and then any metal interconnect is disposed on the master chip in accordance with a request of a client. The gate array has a feature of shortening the TAT of the chip, since various logic circuits can be formed only by changing the metal layer.

The conventional basic cells 201*u* and 201*l* shown in FIG. 4A have two n channel MOS transistors (hereafter, referred to as an nMOS transistor) and two p channel MOS transistors (hereafter, referred to as a pMOS transistor), respectively. A substrate contact region 202 is formed between the upper basic cell 201*u* and lower basic cell 201*l*. Contact holes are formed on this substrate contact region 202 to establish the ohmic contact between the metal interconnect on an upper level and the well region on a lower level. A signal line, a ground line and the power supply line are wired with the metal interconnect (conductive layer) on the upper level such as an aluminum layer and the like, although they are not shown in FIG. 4A.

On the other hand, in a cell base LSI, standard cells having a desired logic function are formed in advance on a wafer, and a chip is formed by combining these standard cells in accordance with a request of a client. FIG. 4B shows an example of a layout of a standard cell. The standard cell 261 is composed an nMOS transistor region 262 having the two nMOS transistors and a pMOS transistor region 263 having the two pMOS transistors. A substrate contact region 202 is formed between the adjacent standard cells similarly to FIG. 4A. In the semicustom design methodology of using the gate array and the standard cell as mentioned above, the connection between the signal line, the ground line and the power supply line can be selectively performed by using a CAD tool and the like.

The above mentioned EMI noise is generated even in the LSI manufactured by using the semicustom architecture of using the gate array, the standard cell and the like. Accordingly, other electronic apparatuses may be erroneously operated by the EMI noise generated in the semicustom LSI. For this reason, conventionally, the suppression of the EMI noise is tried by disposing the RC filter similar to that of FIG. 1 within the chip or outside an LSI package.

In the gate array and the standard cell architectures, the bypass capacitor C is formed by using a gate oxide film of a transistor, and the limiter resistor R is formed by using a doped polysilicon resistor or an aluminum resistor. In the semicustom LSI, it is easy to form the bypass capacitor by using the gate oxide film of the transistor. However, the capacitance of the bypass capacitor per unit area on a device formation surface can not be made so large. Moreover, many transistors are required in order to form a desired capacitance of the bypass capacitor. For this reason, the capacitance necessary for the noise filter can not be obtained, and further the switching noise can not be sufficiently suppressed. That is, this implies that it is impossible to attain the sufficient effect for the suppression of the EMI noise.

On the other hand, in a case of designing the LSI chip, a synchronization circuit synchronizing with a system clock inputted from the exterior is typically designed in order to protect against a timing obstacle. For this reason, numerous flip-flops and numerous clock buffer cells which are operated on the basis of the clock are mounted within the LSI chip. In these flip-flops and clock buffer cells, a switching is brought about within the flip-flop on the basis of the logic of the clock. If a large current is dynamically consumed as mentioned above, the change of the current is observed as the EMI noise at the exterior through the parasitic inductance of the chip.

In order to suppress the EMI noise, two counter-plans listed below are effective:

(a) A first counter-plan is a method of reducing the power dissipation to thereby reduce the change of the current which causes the generation of the noise; and (b) A second counter-plan is a method of mounting numerous bypass capacitors on a chip so that the change of the power supply voltage becomes small.

The former will be described later. As for the latter, a method in which the bypass capacitor is formed within the LSI chip and then the transient change of the electric power is absorbed by the bypass capacitor is proposed in the cell-base LSI. However, basic cells 1 having predetermined structures are mounted on a whole surface, in the LSI of the master slice type, such as the gate array and the like. These basic cells 1 are used to form a logic circuit. Hence, it is technically difficult to freely form the bypass capacitor cells on the chip. Now, there is no method to effectively suppress the EMI noise.

Incidentally, the advancement of the semiconductor process technique enables memories, such as DRAM and the like, to be mixed and mounted on the gate array and the standard cell. For example, FIG. 5A is a schematic layout of showing an example of a chip on which a gate array 111 and a DRAM macro cell 112 are mixed and mounted. FIG. 5B is a schematic layout of showing an example of a chip on which cell columns 103 of standard cells metal interconnects 104 and the DRAM cell 112 are mixed and mounted. In the DRAM macro cell 112, a memory cell is composed of a transistor and a capacitor. In short, the capacitor is located at each memory cell. The miniaturization of the size of the memory cell is required in conjunction with the DRAM having a larger capacitance. Typically, the capacitor is manufactured by a trench process and the like in order to make the capacitance larger.

FIG. 6 is a sectional view of a capacitor C constituting the memory cell of the DRAM manufactured by the trench process. A diffusion layer 105 is formed along a side wall of a trench (groove), an insulator layer 106 is formed on a top surface of the diffusion layer 105, and a doped polysilicon layer 107 is formed on a top layer of the insulator layer 106. The capacitor C is constituted by the diffusion layer 105, the insulator layer 106 and the doped polysilicon layer 107. Then, charges are accumulated in the portion of the insulator layer 106. The capacitance sufficient to store data for each memory cell can be obtained by making the groove deeper and accordingly making the area of the side wall larger.

As mentioned above, the capacitor having the trench structure can obtain the large capacitance with a small area. However, there is no attempt of using this type capacitor as the bypass capacitor to suppress the noise.

Next, a method of reducing the current change which causes the noise will be explained with a data bus as an example. If the currents having the same direction simultaneously run through many signal lines of the data buses, a strong EMI noise is generated. In a logic gate composed of a CMOS transistor circuit, an operational current which occurs in a simultaneous switching and runs out from a power supply line or runs into a ground line becomes the largest when all outputs of the logic gate are at a high level or a low level. If such an operational current is large, the large operational current runs through a parasitic resister and a parasitic inductance to thereby make the generated voltage drop larger. As a result, it is difficult to insure the stable operation of the circuit.

For example, a technique disclosed in Japanese Patent Application Laying Open (KOKAI) No.59-212027 is well known as the prior art to solve the above mentioned defects. And, a technique disclosed in a document shown in FIGS. 7A to 7C is also well known which is entitled "Noise Suppression Scheme for Giga-Scale DRAM with Hundred of I/Os" written by Daizaburo Takashima., et al., and published in Technical Report of Electronic Information Communication Society, SDM96-73, ICD96-93 (1996–08) pp. 43–46.

In such a prior art, for example, when data of 64 bits is sent and received, the data of 64 bits is divided into even-numbered blocks, for example, four blocks as shown in FIG. 8, and a flag bit is established for each two blocks. In such a state, an absolute value of a difference between the numbers of "0" and "1" is calculated for the data at each block. If the absolute values are larger than 16, or a half of 32, in a block 0 and a block 1 all in all, the flag bits corresponding to the block 0 and the block 1 are inverted from 0 to 1. All the data at the block 1 are inverted from "0" to "1", encoded and outputted to the data bus. The same process is performed in a block 2 and a block 3.

If data of four bits, for example, (1, 1, 1, 1) is sent and received through a data bus 123 of four bits between a sender chip 121 and a receiver chip 122 as shown in FIG. 9A, the data of four bits is divided into two blocks composed of data of two bits. Then, the data (1, 1) at one block is inverted to (0, 0) and encoded by an encoder 124, the flag bit is inverted from 0 to 1, the encoded data and flag bit are sent through the data bus 123, and the sent data is decoded to the original data of four bits by a decoder 125. In this way, the numbers of "0" and "1" sent through the data bus are made equal to each other to thereby suppress the above mentioned noise.

However, in such a prior art, the flag bits are required by a half of the number of the divided blocks. Thus, the number of the data buses is increased as the number of the bits of the data to be sent is increased. When the number of the bits of the data to be sent is increased, even if data at part of the blocks is inverted, there may be a case that the numbers of "0" and "1" are not equal to each other in all the data. Hence, in order to reduce the difference between the numbers of "0" and "1" to make the numbers substantially equal to each other, the data to be sent must be divided into many blocks.

As explained above, in the conventional method of sending and receiving the digital signal in which a common phase power supply noise is suppressed, it is necessary to divide the data to be sent into many blocks to then establish the flag bits at the respective blocks, in order to improve the suppression effect. For this reason, numerous flag bits are required. Thus, the buses to send and receive the flag bits are required in addition to the buses corresponding to the number of the bits of the data to be sent and received. This results in the problem of the increase of the number of the data buses.

SUMMARY OF THE INVENTION

The present invention is proposed in view of the above mentioned conventional problems. It is therefore an object of the present invention to provide a switching noise suppression circuit in which it is not necessary that the capacitance of the bypass capacitor be larger than necessary.

It is another object of the present invention to provide a switching noise suppression circuit which can extremely suppress a switching noise even if using the bypass capacitor having a small capacitance.

It is still another object of the present invention to provide a built-in noise filter type data holding circuit which can extremely suppress a switching noise even if using the bypass capacitor having the small capacitance.

It is still another object of the present invention to provide a switching noise suppression circuit which can reduce a circuit formation area.

It is still another object of the present invention to provide a switching noise suppression circuit which can reduce a current running through a power supply line to correctly suppress the switching noise.

It is still another object of the present invention to provide a switching noise suppression circuit which can perform a supplement to a leak current from a circuit to surely keep a state when the circuit is inactive.

It is still another object of the present invention to provide a new structure of obtaining a bypass capacitor with a narrow area and a large capacitance and provide an application-specific integrated circuit (ASIC) which can deal with the EMI noise without any modification of a cell size.

It is still another object of the present invention to provide an ASIC which can surely suppress the EMI noise without making a manufacturing process and a chip layout complex.

It is still another object of the present invention to provide a sending and receiving circuit which can minimize the common phase power supply noise without making the data buses larger when data is sent.

It is still another object of the present invention to provide a sending and receiving circuit which can keep the increase of the data buses to a minimum to thereby reduce the common phase power supply noise to a minimum level or to a value close to the minimum level when the data is sent.

It is still another object of the present invention to provide a communication apparatus, such as a portable information communication apparatus and the like, which keeps the increase of the number of the data buses to a minimum to thereby suppress the common phase power supply noise.

It is still another object of the present invention to provide a communication apparatus, such as a portable information communication apparatus and the like, which can minimize the unnecessary electromagnetic radiation to thereby avoid the obstacle to the sending and receiving operation resulting from the unnecessary electromagnetic wave.

It is still another object of the present invention to provide a car navigation apparatus which can suppress the generation of the EMI noise, such as a switching noise and the like, as a whole system.

In view of the above mentioned objects, a first feature of the present invention is a noise suppression circuit which has a high and a low level terminals and at least comprises an internal circuit in which this low level terminal is connected to a low level power supply line, a first transistor in which one main electrode is connected to the high level terminal of this internal circuit, a bypass capacitor connected between the other main electrode of the first transistor and the low level power supply line, and a second transistor connected between the other main electrode of the first transistor and a high level power supply line. Now, the first transistor is conductive when the internal circuit is active, and is not conductive when the internal circuit is inactive. The second transistor is not conductive when the internal circuit is active, and is conductive when the internal circuit is inactive According to the noise suppression circuit in accordance with the first feature of the present invention, the current is supplied from only the bypass capacitor when the internal circuit is operated, and thereby the power supply is disconnected from the circuit. Thus, there is no sudden change of the power supply current. Accordingly, it is not necessary that the capacitance of the bypass capacitor be larger than necessary. Hence, even if the bypass capacitor having a small capacitance (a capacitance equal to or less than that of the conventional condenser) is used, it is possible to sufficiently suppress the switching noise A second feature of the present invention relates to a method of forming a bypass capacitor used for the noise suppression circuit (noise filter). Especially, it relates to a method of forming a bypass capacitor which can be applied to a semicustom design methodology which uses the gate array or the standard cell. In an application-specific integrated circuit (ASIC) represented by the gate array or the standard cell, a pMOS column composed of a plurality of pMOS transistors and an nMOS column composed of a plurality of nMOS transistors are formed on a semiconductor chip. That is, the second feature of the present invention is an ASIC constituted by: a first nMOS transistor region composed of a plurality of nMOS transistors in the nMOS column; a first pMOS transistor region which is composed of a plurality of pMOS transistors in this pMOS column and is situated adjacently to the first nMOS transistor region; a low level power supply line connected to the nMOS transistor; a high level power supply line connected to the pMOS transistor; and a bypass capacitor disposed on the semiconductor chip except source regions, drain regions and gate regions of the respective transistors in the first nMOS transistor region and the first pMOS transistor region. The bypass capacitor is connected between the high and low level power supply lines. "A bypass capacitor disposed on the semiconductor chip except source regions, drain regions and gate regions of the transistors" implies, for example, that the bypass capacitor is formed on the semiconductor chip, such as a substrate contact region between the basic cells constituting the gate arrays, a wiring channel between device columns and the like. Moreover, a bypass capacitor having a trench structure may be formed on an outside edge of the basic cell.

As mentioned above, the formation of the bypass capacitor on the semiconductor chip except the source regions, the drain regions and the gate regions of the transistors can obtain the bypass capacitor having a large capacitance. Thus, the counter-plan of the EMI noise can be carried out without the modification of the cell size. In short, according to the second feature of the present invention, the bypass capacitor is formed on the empty space between adjacent basic cells by using a doped polysilicon layer and the like so that a dynamic current running through the basic cell can be supplied from the bypass capacitor. Hence, it is possible to reduce the change of the voltage of the power supply line to surely suppress the EMI noise radiated from the power supply line.

A third feature of the present invention relates to a technique of reducing the change of the current which causes the generation of the noise. That is, the third feature of the present invention lies in a communication circuit, or a sending and receiving circuit, comprises an encoder for encoding an m-bit bit column pattern from an n-bit transmission data, m data buses for sending and receiving the m-bit bit column pattern obtained by the encoder and a decoder for receiving the m-bit bit column pattern sent through the data buses and then decoding the m-bit bit column pattern to the corresponding n-bit transmission data. Especially, the encoder according to the third feature of the present invention encodes all bit column patterns in the n-bit transmission data composed of "0" and "1" by correlating to the m-bit (m>n) bit column pattern in which the numbers of "0" and "1" are equal to each other.

According to the third feature of the present invention, the number of the data buses to be newly added is set to be less than two times the transmission data, and the numbers of "0" and "1" in the transmission data are made equal to each other. Hence, it is possible to minimize the common power supply noise without making the data buses larger when the data is sent.

A fourth feature of the present invention also relates to a technique of reducing the change of the current which causes the generation of the noise, similarly to the third feature. That is, the fourth feature of the present invention lies in a communication circuit comprises an encoder for encoding to an n-bit encoding bit column pattern and then adding a flag bit to the encoded transmission data, an (n+1) data buses for sending the n-bit encoding bit column pattern and the flag bit obtained by the encoder, and a decoder for receiving the n-bit encoding bit column pattern and the flag bit sent through the data buses and then decoding the n-bit encoding bit column pattern to which the flag bit is added, to the corresponding n-bit transmission data. Especially, the encoder according to the fourth feature of the present invention is characterized to encode the transmission data, in which the difference between the numbers of "0" and "1" in the transmission data of n bits composed of "0" and "1" is equal to or greater than a predetermined number, by correlating with an n-bit encoding bit column pattern, in which the difference between the numbers of "0" and "1" is increased by two each from "0" in the order of decreasing difference between the numbers of "0" and "1", in a one-to-one relationship.

According to the fourth feature of the present invention, the number of the data buses to be newly added is set to be the least one, and the numbers of "0" and "1" in the transmission data are made equal to each other, or the difference between the numbers of "0" and "1" is reduced to a minimum. Hence, the increase of the data buses can be kept to a minimum to thereby reduce the common phase power supply noise to a minimum level or to a value close to the minimum level when the data is sent.

A fifth feature of the present invention relates to a communication apparatus comprising the encoder, the data buses and the decoder used in the communication circuit of the third feature. That is, the communication apparatus comprises a first AD converter, a first encoder connected to the first A/D converter, first m data buses connected to the first encoder, a transmission memory connected to the first data buses, second m data buses connected to the transmission memory, a decoder connected to the second data buses, a first D/A converter connected to this decoder, a transmitter signal processor connected to the first D/A converter, and a wireless transmitter connected to the transmitter signal processor. Then, the first A/D converter converts a first analog signal to be sent into a first n-bit digital signal composed of "0" and "1". The first encoder encodes all bit column patterns composed of the first n-bit digital signal, by correlating with a first m-bit (m>n) bit column pattern, in which the number of "0" is equal to the number of "1", in a one-to-one relation ship. A first decoder receives the first m-bit bit column pattern sent through the second data buses and then decodes the first m-bit bit column pattern to the corresponding second n-bit transmission data.

It is natural that a receiving side can be implemented similarly.

According to the fifth feature of the present invention, the communication apparatus, such as the portable information communication apparatus and the like, which mutually converts the analog signal and the digital signal, comprises the communication circuit of the third feature of the present invention. Thus, it is possible to minimize the unnecessary electromagnetic radiation to thereby avoid the obstacle to the sending and receiving operation resulting from the unnecessary electromagnetic wave.

A sixth feature of the present invention relates to a communication apparatus comprising the encoder, the data buses and the decoder used in the sending and receiving circuit of the fourth feature. That is, the communication apparatus comprises a first AD converter, a first encoder connected to the first A/D converter, first (n+1) data buses connected to the first encoder, a transmission memory connected to the first data buses, second (n+1) data buses connected to the transmission memory, a decoder connected to the second data buses, a first D/A converter connected to this decoder, a transmitter signal processor connected to this first D/A converter, and a wireless transmitter connected to the transmitter signal processor. Then, the first A/D converter converts a first analog signal to be sent into a first n-bit digital signal composed of "0" and "1". The first encoder encodes all bit column patterns composed of the first n-bit digital signal, by correlating the transmission data in which the difference between the numbers of "0" and "1" is equal to or greater than a predetermined value, with a second n-bit encoding bit column pattern, in which the difference between the numbers of "0" and "1" is increased by two each in the order of decreasing difference between the numbers of "0" and "1", in a one-to-one relation ship, and then adds a first flag bit to the encoded transmission data. A first decoder receives the second n-bit encoding bit column pattern and the first flag bit sent through the second data buses and then decodes the second n-bit encoding bit column pattern to which the first flag bit is added, to the corresponding third n-bit transmission data.

It is natural that a receiving side can be implemented similarly.

According to the sixth feature of the present invention, the communication apparatus, such as a portable information communication apparatus and the like, which mutually converts the analog signal and the digital signal, comprises the communication circuit of the fourth feature of the present invention. Thus, it is possible to minimize the unnecessary electromagnetic radiation to thereby avoid the obstacle to the sending and receiving operation resulting from the unnecessary electromagnetic wave.

The seventh feature of the present invention relates to a car navigation apparatus to which the switching noise suppression circuit in the first feature is applied. That is, the seventh feature of the present invention is a car navigation apparatus which comprises a main controller for controlling a whole operation of the apparatus, a Global Positioning System (GPS) receiver for receiving radio waves from a GPS satellite, a memory medium controller for controlling a memory medium in which map information is stored, and a display for displaying various information including the map information. This main controller has a latch circuit containing the switching noise filter in the first feature. That is, the main controller according to the seventh feature of the present invention has a noise suppression circuit provided with: a latch circuit having a high and a low level terminals wherein the low level terminal is connected to a low level power supply line and wherein the latch circuit is activated/deactivated by an enable; a first transistor, wherein one main electrode is connected to the high level terminal of the latch circuit, wherein when the latch circuit is active, the first transistor is conductive, and wherein when the latch circuit is inactive, the first transistor is not conductive; a bypass capacitor connected between the other main electrode of this first transistor and the low level power supply line; and a second transistor which is connected between the other main electrode of the first transistor and the high level terminal, and is not conductive when the latch circuit is active, and is conductive when the latch circuit is inactive.

According to the car navigation apparatus in accordance with the seventh feature of the present invention, a built-in noise filter type data holding circuit in accordance with the first feature of the present invention is mounted. Therefore, it is possible to provide the effectiveness similar to that of the first feature of the present invention to thereby suppress the generation of the EMI noise as the whole system.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF DRAWING

FIGS. 7A to 7D are views showing conventional examples of sending and receiving signals;

FIG. 8 is a view showing another conventional example of sending and receiving signals;

FIG. 19A is a view showing an example in which doped polysilicon layers for bypass capacitors are connected to high level power supply lines running on pMOS transistor columns;

FIG. 22B is a layout of the flip-flop in FIG. 22A;

FIG. 28A is a view showing an example of conversions of transmission data;

FIG. 28B is a view explaining the mathematical symbols and circuit symbols employed following FIGS. 28C to;

FIG. 28C is a view showing logic equations to perform the conversions shown in 28A;

DETAILED DESCRIPTION OF THE EMBODIMENTS

Figure 1:
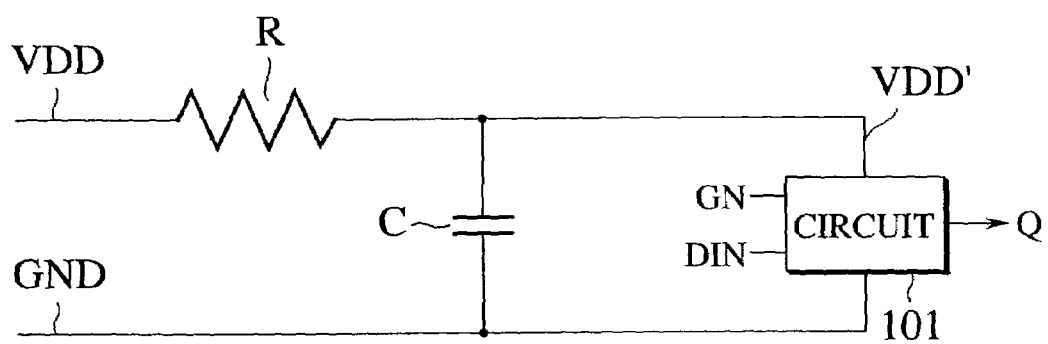
FIG. 1 is a view showing a configuration of a conventional noise filter.
Figure 2A:
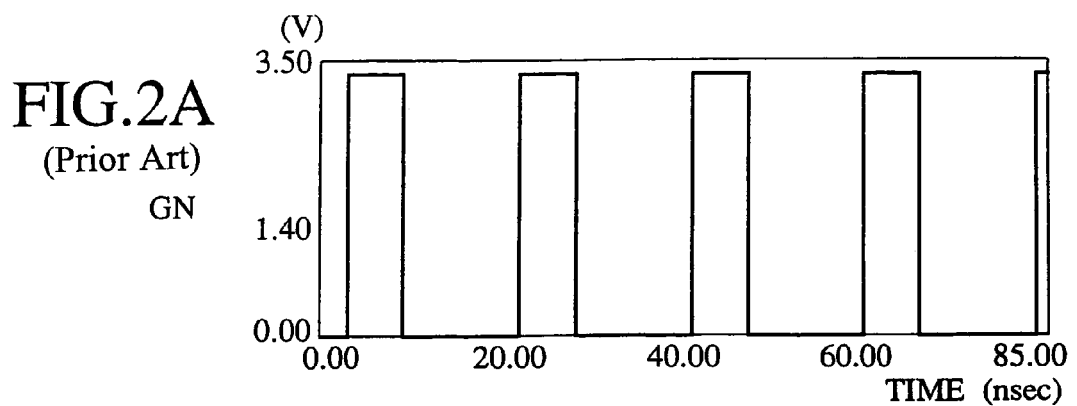
FIG. 2A is a voltage waveform of an enable signal GN when the conventional circuit shown in FIG. 1 is simulated by using SPICE simulation.
Figure 2B:
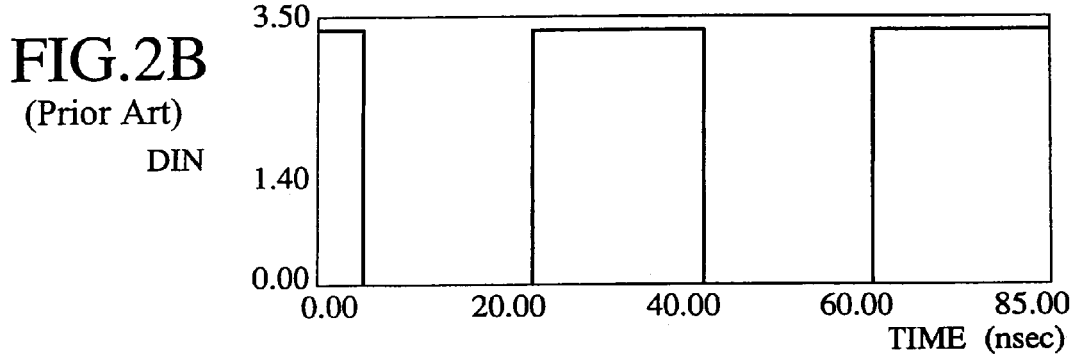
FIG. 2B is a voltage waveform of an input signal DIN when the conventional circuit shown in FIG. 1 is simulated by using the SPICE simulation.
Figure 2C:
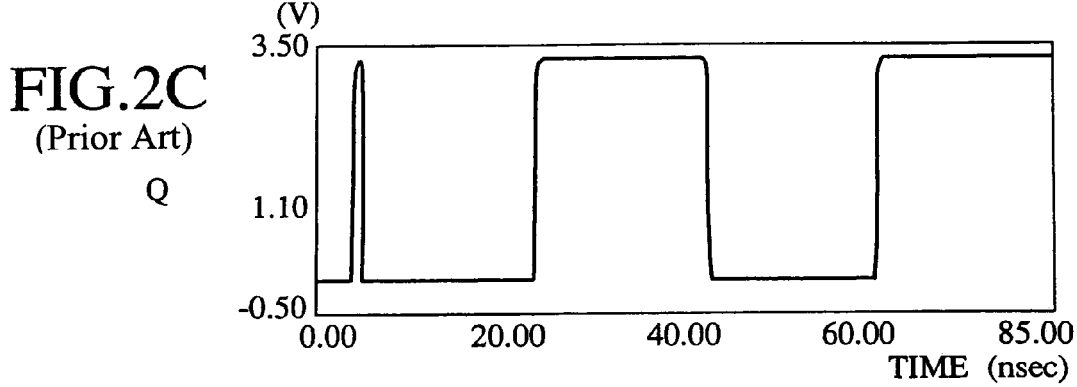
FIG. 2C is a voltage waveform of an output signal Q when the conventional circuit shown in FIG. 1 is simulated by using the SPICE simulation.
Figure 2D:
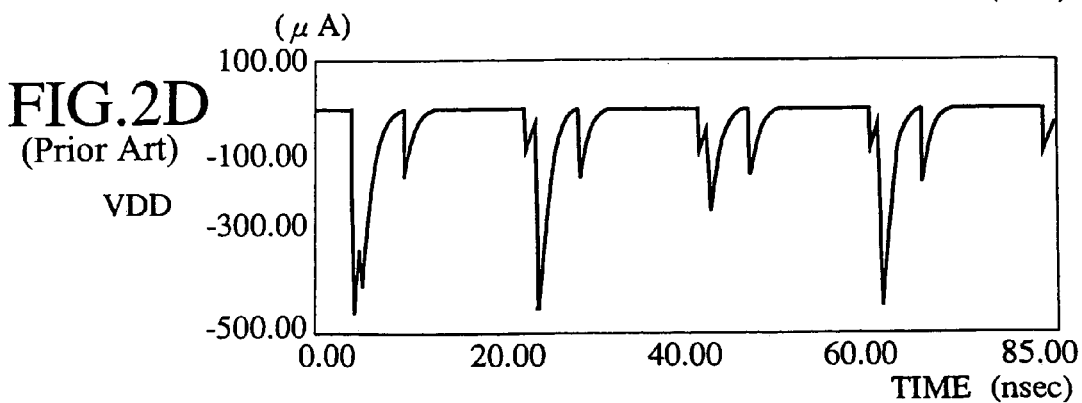
FIG. 2D is a current waveform of a high level power supply line VDD when the conventional circuit shown in FIG. 1 is simulated by using the SPICE simulation.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

First Embodiment

Figure 10:
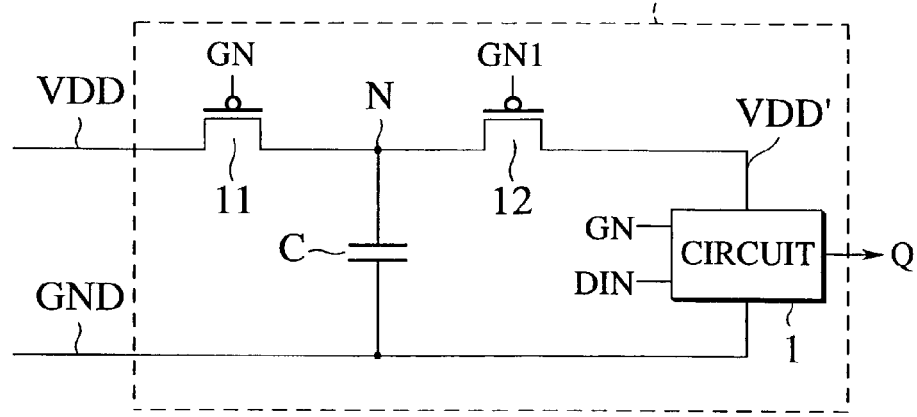
FIG. 10 is a circuit diagram of a switching noise suppression circuit according to a first embodiment of the present invention.
Figure 11:
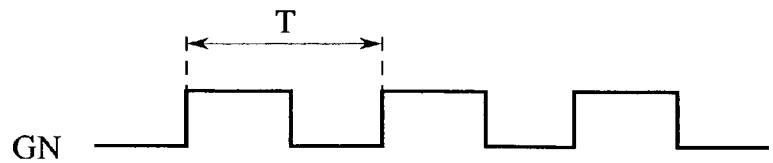
FIG. 11 is a view of a waveform of an enable signal GN in the switching noise suppression circuit shown in FIG. 10.

FIG. 10 is a circuit diagram of a switching noise suppression circuit 790 according to a first embodiment of the present invention. The switching noise suppression circuit (noise filter) 790 in the first embodiment of the present invention comprises an internal circuit 1, a first transistor 12, a second transistor 11 and a bypass capacitor C. The internal circuit has a high level terminal $V_{DD}$' and a low level terminal wherein the low level terminal is connected to a low level power supply line GND. The first transistor 12 and second transistor 11 are connected in series between a high level power supply line $V_{DD}$ and the internal circuit 1. That is, one main electrode of the first transistor 12 is connected to the high level terminal $V_{DD}$' of the internal circuit. The bypass capacitor C is connected between the low level power supply line GND and a node N situated midway between the other main electrode of the first transistor 12 and second transistor 11. The internal circuit 1 is activated, for example, when the enable signal GN is at an "H" level, and deactivated when at an "L" level. That is, the enable signal GN alternately repeats the "H" level and the "L" level at a predetermined period T as shown in FIG. 11. Accordingly, the internal circuit 1 becomes activated/deactivated, respectively.

The second transistor 11 and the first transistor 12 are constituted by pMOS transistors in the first embodiment of the present invention, and controlled so as to be turned on and off by an enable signal GN and an inversion signal GNI thereof, respectively. Moreover, an on-state resistance $r_{DS(on)}$ of the second transistor 11 is set to be larger than that of the first transistor 12.

It is desirable that the amount of charges accumulated in the bypass capacitor C is equal to the charge $Q_d$ consumed by the internal circuit 1. The capacitance of the bypass capacitor C is a value in which this value $Q_d$ is divided by a voltage across the bypass capacitor C.

An operation of the noise filter in the first embodiment of the present invention will be explained below. When the enable signal GN is in the "H" level and thereby the internal circuit 1 is at an active state, the first transistor 12 is at a conductive state and thereby a current is supplied from the bypass capacitor C to the internal circuit 1. At this time, since the second transistor 11 is at a non-conductive state, the current does not run through the high level power supply line $V_{DD}$. On the other hand, when the enable signal GN is in the "L" level, the second transistor 11 is at the conductive state, and the first transistor 12 is at the non-conductive state. Thus, the charges are supplied from the high level power supply line $V_{DD}$ to the bypass capacitor C. At this time, the on-state resistance $r_{DS(on)}$ of the second transistor 11 is set to be large, which extremely reduces the current running through the high level power supply line $V_{DD}$. Hence, the noise can be sufficiently suppressed.

In this way, in the first embodiment of the present invention, since the load current consumed by the internal circuit 1 is not supplied from the high level power supply line $V_{DD}$, a sudden power supply current does not flow. Thus, it is not necessary that the capacitance of the bypass capacitor C be larger than necessary. The minimum capacitance necessary for the operation of the internal circuit 1 can sufficiently suppress the switching noise. Hence, even the bypass capacitor C using a gate oxide film of a transistor in a gate array or a standard array can sufficiently carry out the function (Incidentally, of course, the bypass capacitor C can be formed in a substrate contact region of a gate array, or in a wring channel of a standard cell and the like as shown in fourth to eighth embodiments of the present invention described later).

Second Embodiment

Figure 12:
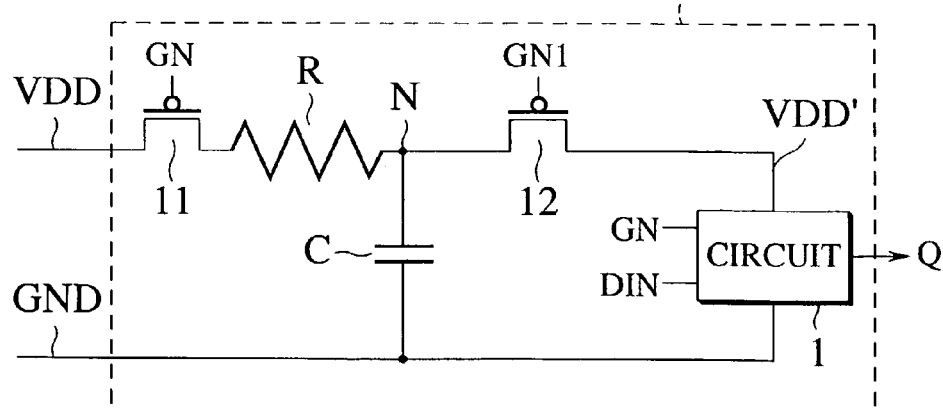
FIG. 12 is a circuit diagram of a switching noise suppression circuit according to a second embodiment of the present invention.

FIG. 12 is a circuit diagram of a switching noise suppression circuit 790 according to a second embodiment of the present invention. Then, the same or similar reference numerals are applied to the elements common to those in FIG. 1, and the explanations thereof are omitted.

As for a noise filter according to the second embodiment of the present invention, a limiter resistor R is inserted in series between the second transistor 11 and the node N in the configuration of FIG. 10. In the first embodiment of the present invention, it is necessary to make a length of a gate of the second transistor 11 longer, in order to make the on-state resistance $r_{DS(on)}$ of the second transistor 11 larger, which results in the increase of the circuit formation area. However, since the limiter resistor R is inserted in the second embodiment of the present invention, the on-state resistance $r_{DS(on)}$ of the second transistor 11 can be made correspondingly smaller. Hence, the circuit formation area can be made smaller than that of the first embodiment.

The effect of the second embodiment of the present invention is similar to that of the first embodiment. A value of the limiter resistor R shown in FIG. 12 can be given by the following equation:

$$R = T/(\alpha \times C) \quad (1)$$

where T is the period of the enable signal GN shown in FIG. 11, C is the capacitance of the bypass capacitor and $\alpha$ is a constant. The larger the value of $\alpha$, the noise is suppressed more effectively, however larger value of a cause slower recovery of voltage applied to the internal circuit. Then $\alpha$ is determined by the experience, to the value between 2 and 4.

Similarly to the first embodiment, the gate oxide film of the transistor in the integrated circuit may be used for the bypass capacitor C. Moreover, it is allowable to use the bypass capacitor C formed in the substrate contact region of the gate array, or in the wiring channel of a standard cell and the like as shown in fourth to eighth embodiments of the present invention described later.

Third Embodiment

Figure 13A:
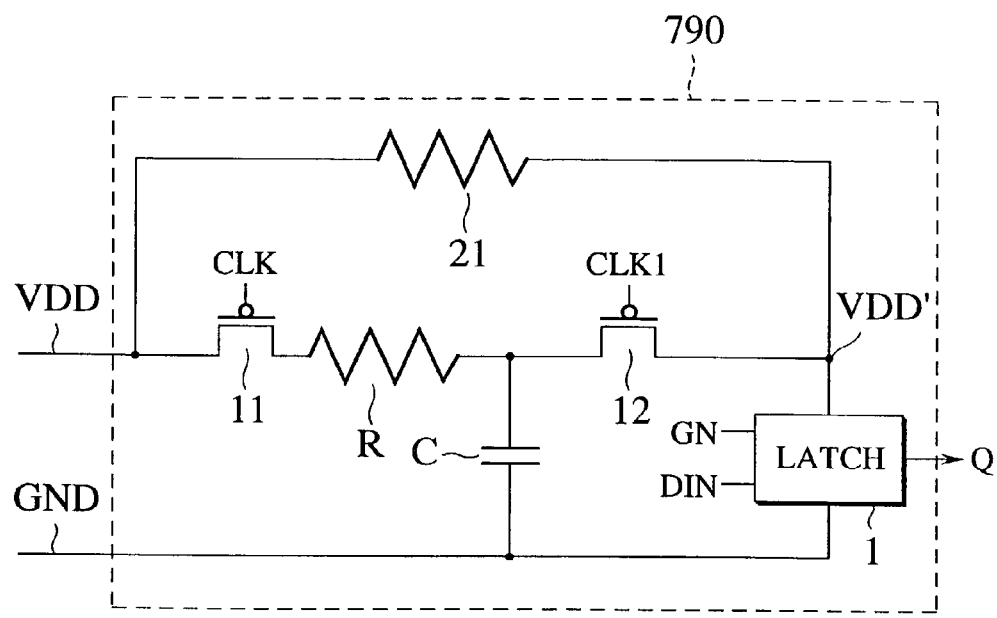
FIG. 13A is a circuit diagram of a switching noise suppression circuit according to a third embodiment of the present invention.
Figure 13B:
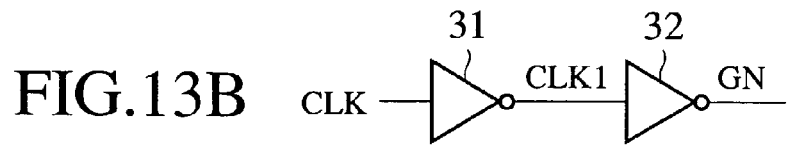
FIG. 13B is a view showing a configuration of a signal generation circuit of an enable signal GN in the switching noise suppression circuit according to the third embodiment of the present invention.
Figure 13C:
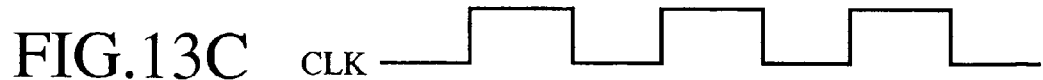
FIG. 13C is a view of a wave in a clock signal CLK used for the switching noise suppression circuit according to the third embodiment of the present invention.

FIGS. 13A, 13B and 13C are views to explain a switching noise suppression circuit 790 according to a third embodiment of the present invention. That is, FIG. 13A is a circuit diagram of the switching noise suppression circuit, FIG. 13B is a configuration view of a signal generation circuit of an enable signal GN and FIG. 13C is a view showing a waveform of a clock signal CLK.

As for a noise filter according to the third embodiment of the present invention, the internal circuit 1 is constituted by a latch. And a resistor 21 is connected in parallel to the configuration in FIG. 12 explained in the second embodiment. Namely, the resistor 21 is connected parallel to the second transistor 11, the limiter resistor R and the first transistor 12 between the high level power supply line $V_{DD}$ and the latch 1.

This resistor 21 is mounted to supplement a current by considering a leak current $I_{LEAK}$ generated when the state of the latch 1 is held. A resistance $R_{21}$ of the resistor 21 is substantially equal to a value in which a difference between a power supply voltage $V_{DD}$ and a voltage $V_{DD'}$ on the high level power supply side of the latch is divided by the leak current $I_{LEAK}$ ($R_{21}=V_{DD}-V_{DD'}/I_{LEAK}$) and becomes very large. For this reason, the power supply current running through this resistor 21 is very slight. Thus, it is possible to ignore the generation of the noise at this time.

The clock signal CLK for controlling an on/off operation of the second transistor 11 is a signal having a phase identical to that of the enable signal GN of the latch 1. A signal CLK1 for controlling an on/off operation of the first transistor 12 is the signal having a phase opposite to that of the enable signal GN of the latch 1. Moreover, the signal CLK1 and the enable signal GN are generated by two-stage inverters 31, 32 with the clock signal CLK as an input, as shown in FIG. 13B. The clock signal CLK periodically repeats the "H" level and the "L" level, as shown in FIG. 13C.

Figure 14A:
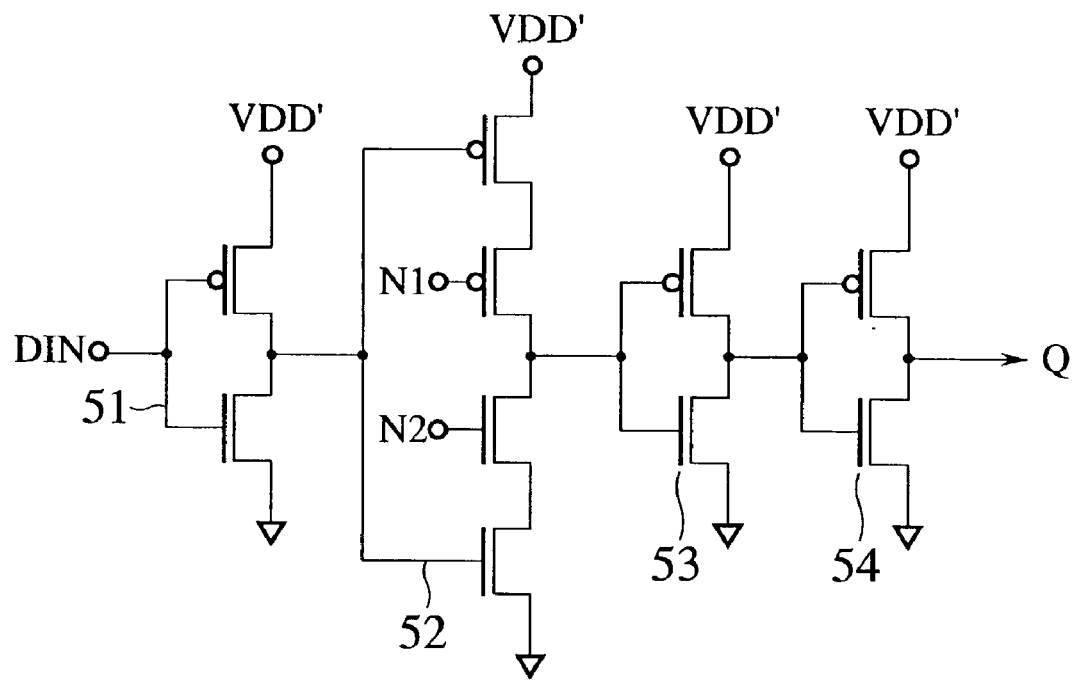
FIG. 14A is a circuit configuration of the latch 1 in FIG. 13A.

FIG. 14A is an internal circuit diagram of the latch 1 shown in FIG. 13A. This latch circuit 1 has a CMOS transistor inverter 51 to which an input signal DIN is applied. A tri-state inverter 52, a CMOS transistor inverter 53 and a CMOS transistor inverter 54 are sequentially connected to an output side of the CMOS transistor inverter 51. An output signal Q is outputted from a final stage CMOS transistor inverter 54.

Figure 14B:
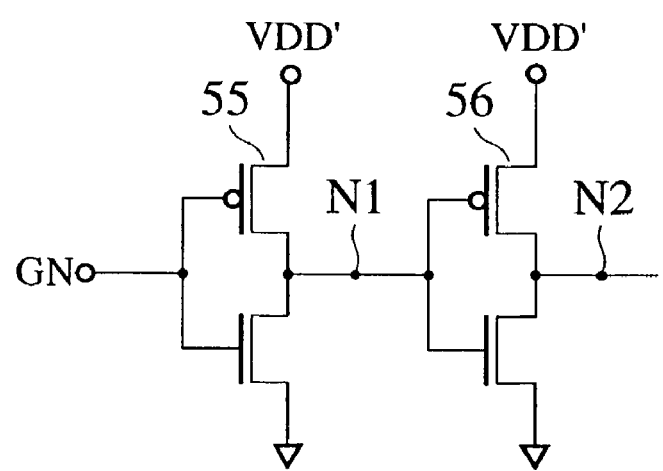
FIG. 14B is a circuit diagram of a signal generation circuit for generating control signals sent to nodes N1, N2 of FIG. 14A.

On the other hand, as shown in FIG. 14B, two-stage CMOS transistor inverters 55, 56 with the enable signal GN as an input are mounted which generate signals to be sent to control nodes N1, N2 of the tri-state inverter 52.

According to this latch 1, when the enable signal GN is in the "H" level, the tri-state inverter 52 is at a through state, and the input signal DIN, while maintaining its original state, is outputted as the output signal Q (the activation of the latch 1). In contrast with this, when the enable signal GN is in the "L" level, the tri-state inverter 52 is at a data holding state. Then, the output signal Q corresponding to a node level kept between an output of the tri-state inverter 52 and an input of the next stage CMOS transistor inverter 52 is outputted (the inactivation of the latch 1).

Figure 15A:
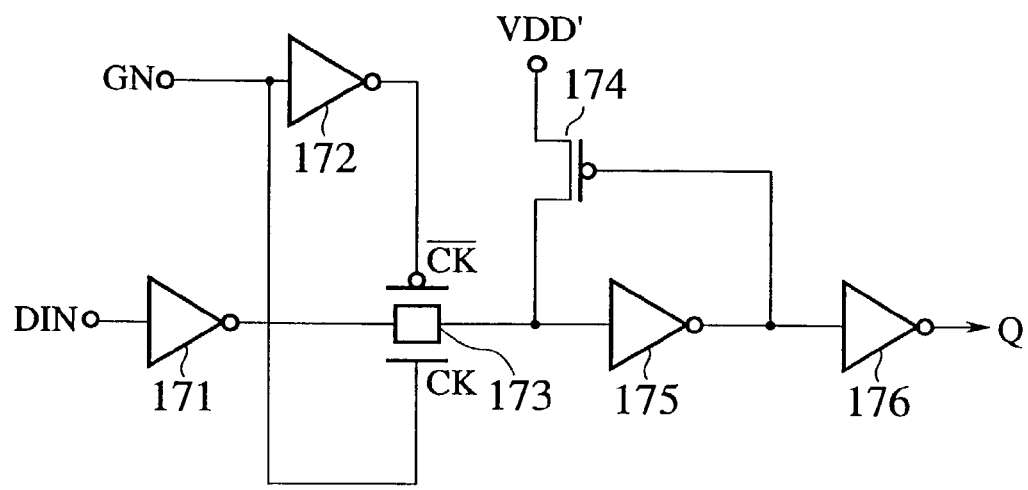
FIGS. 15A and 15B are another internal circuit diagrams of the latch used in the switching noise suppression circuit according to the third embodiment of the present invention.
Figure 15B:
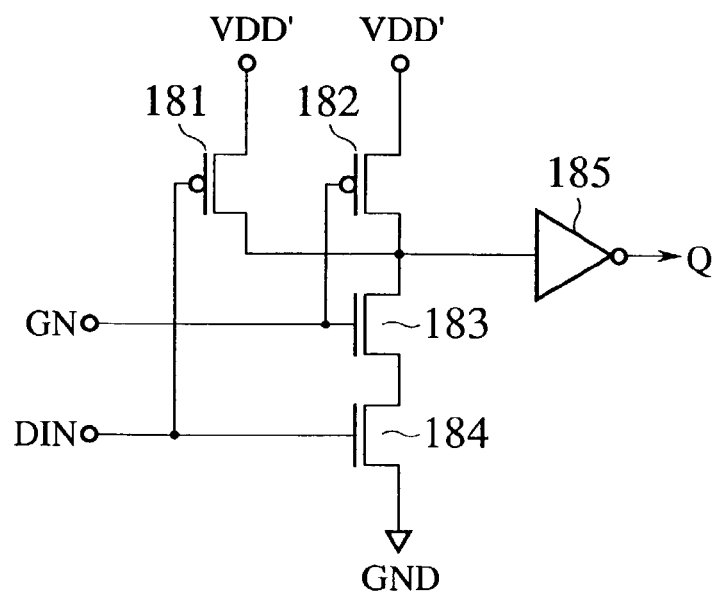

FIGS. 15A and 15B show other internal configuration of the latch 1. In FIG. 15A, an input signal DIN is inputted through an inverter 171 to a pass transistor 173. An enable signal GN is inverted by the inverter 172, and inputted to one gate of the pass transistor 173 as an inverted clock signal (CK bar). The enable signal GN, while maintaining its original state, is inputted to the other gate of the pass transistor 173 as a clock (CK) signal. An output of the pass transistor 173 becomes an output Q through an inverter 175 and an inverter 176. An output of the inverter 175 is inputted to a gate of a pMOS transistor 174 connected between a high level terminal $V_{DD}'$ and the pass transistor 173.

The internal circuit shown in FIG. 15B comprises two pMOS transistors 181, 182 connected to the high level terminals $V_{DD}'$ and two nMOS transistors 183, 184 connected between the pMOS transistor 182 and a low level power supply (GND) line. An enable signal GN is inputted to gates of the pMOS transistor 182 and the nMOS transistor 183. An input signal DIN is inputted to gates of the pMOS transistor 181 and the nMOS transistor 184. When the enable signal GN is in the "H" level, a CMOS transistor inverter is constituted by the pMOS transistor 181 and the nMOS transistor 184. An output of this CMOS transistor inverter becomes an output Q through the inverter 185.

Again referring to FIG. 13A, an operation of the noise filter in the third embodiment of the present invention added to the latch 1 is explained. When the clock signal CLK is in the "L" level, the second transistor 11 is at the conductive state, and the first transistor 12 is at the non-conductive state. Thus, the charges are supplied from the high level power supply line $V_{DD}$ to the bypass capacitor C. At this time, the current for holding the state of the latch 1 is supplied from the high level power supply line $V_{DD}$ through the resistor 21 to the latch 1. That is, when the latch 1 is not operated, an electric power is supplied to the bypass capacitor C. The supply of the electric power to the latch 1 implies the supply of the minimum electric power necessary to keep the data. When the clock signal CLK becomes in the "H" level and thereby the latch 1 is active, the first transistor 12 becomes conductive. Thus, the current is supplied from the bypass capacitor C. At this time, the second transistor 11 is not conductive, and the current does not run through the high level power supply line $V_{DD}$. That is, before the latch 1 is operated, the latch 1 and the bypass capacitor C are connected to each other, and the high level power supply line $V_{DD}$ and the bypass capacitor C are disconnected from each other.

As mentioned above, according to the third embodiment, the electric power is supplied from the bypass capacitor C to the latch 1 in the active period of the clock signal CLK, and the bypass capacitor C is charged in the inactive (negative) period of the clock signal CLK. Accordingly, since the load current consumed by the latch 1 is not supplied directly from the high level power supply line $V_{DD}$, the sudden power supply current does not flow. Thus, it is not necessary that the capacitance of the bypass capacitor C be larger than necessary. The minimum capacitance necessary for the operation of the latch 1 can sufficiently suppress the switching noise. This enables the bypass capacitor C to be easily formed by using the gate oxide film of the transistor in the integrated circuit. As necessary, it is allowable to use the bypass capacitor C formed in the substrate contact region of the gate array, or in the wiring channel of a standard cell and other vacant space as) shown in fourth to eighth embodiments of the present invention described later.

Figure 16A:
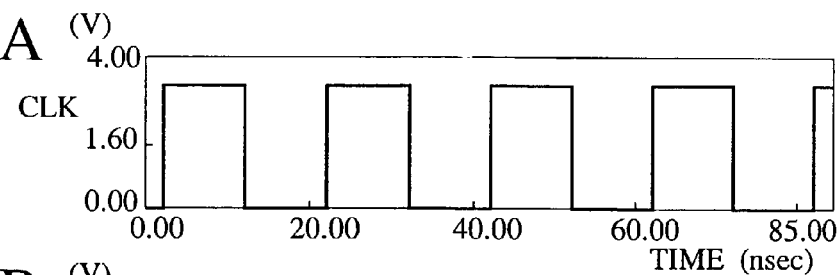
FIG. 16A is a view showing a voltage waveform of the clock signal CLK when the circuit shown in FIG. 13A is simulated by using the SPICE simulation.
Figure 16B:
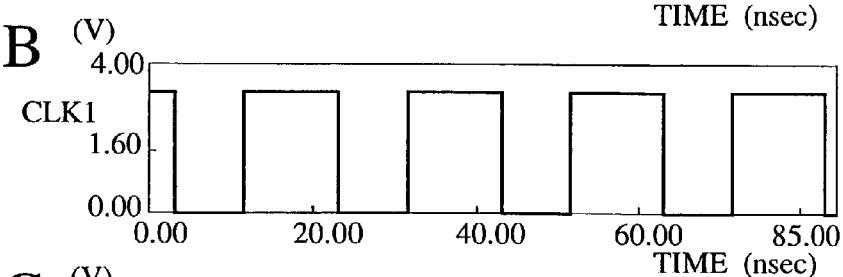
FIG. 16B is a view showing a voltage waveform of a signal CLKI when the circuit shown in FIG. 13A is simulated by using the SPICE simulation.
Figure 16C:
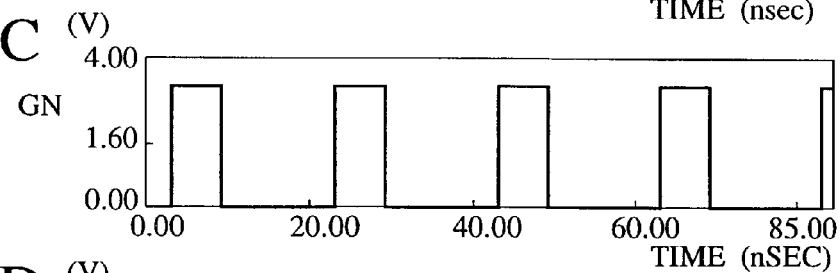
FIG. 16C is a view showing a voltage waveform of the enable signal GN when the circuit shown in FIG. 13A is simulated by using the SPICE simulation.
Figure 16D:
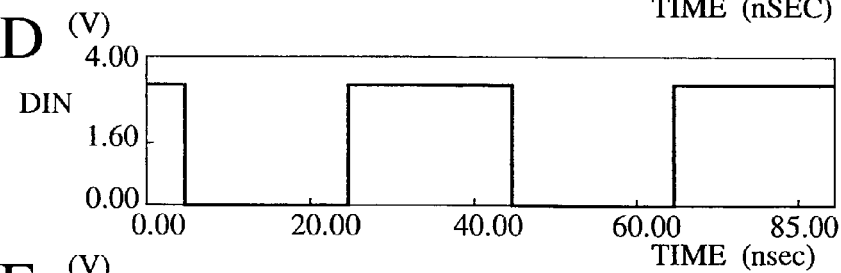
FIG. 16D is a view showing a voltage waveform of an input signal DIN when the circuit shown in FIG. 13A is simulated by using the SPICE simulation.
Figure 16E:
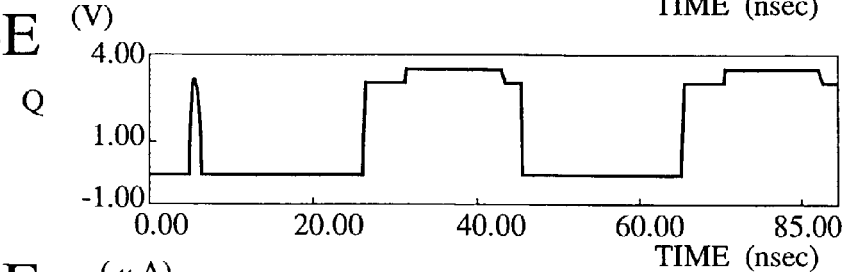
FIG. 16E is a view showing a voltage waveform of an output signal Q when the circuit shown in FIG. 13A is simulated by using the SPICE simulation.
Figure 16F:
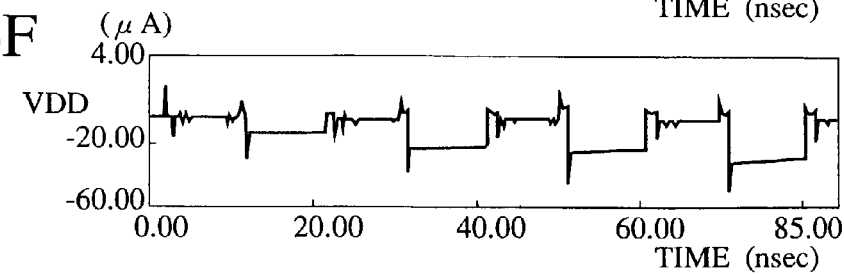
FIG. 16F is a view showing a current waveform of a high level power supply line $V_{DD}$ when the circuit shown in FIG. 13A is simulated by using the SPICE simulation.

FIGS. 16A to 16F are views showing waveforms at respective nodes when the circuit in the third embodiment of the present invention is simulated by using the SPICE simulation. FIG. 16A shows a voltage waveform of the clock signal CLK, FIG. 16B shows a voltage waveform of the CLKI, FIG. 16C shows a voltage waveform of the enable signal GN, FIG. 16D shows a voltage waveform of the input signal DIN, FIG. 16E shows a voltage waveform of the output signal Q, and FIG. 16F shows a current waveform of the high level power supply line $V_{DD}$.

Figure 3:
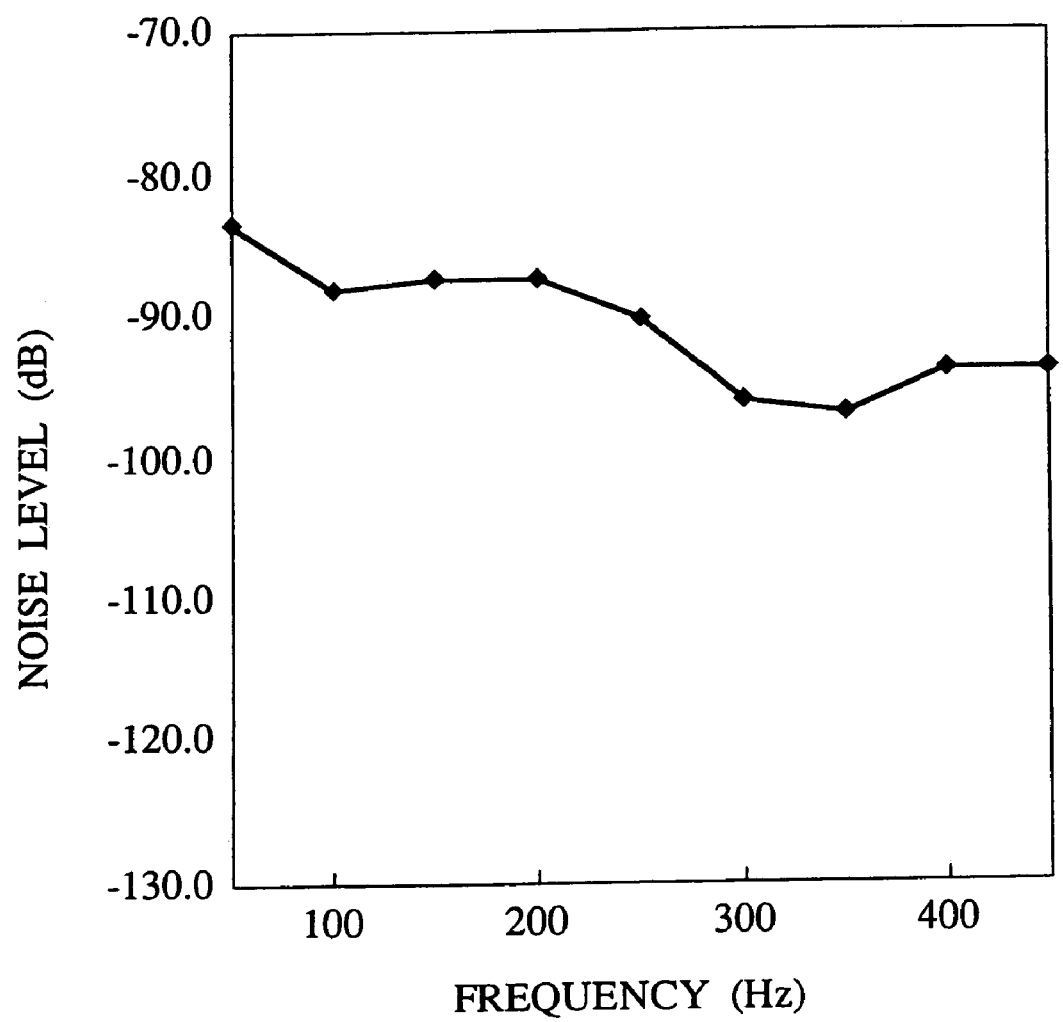
FIG. 3 is a graph showing a noise spectrum in the current waveform of the high level power supply line VDD shown in FIG. 2D.
Figure 4A:
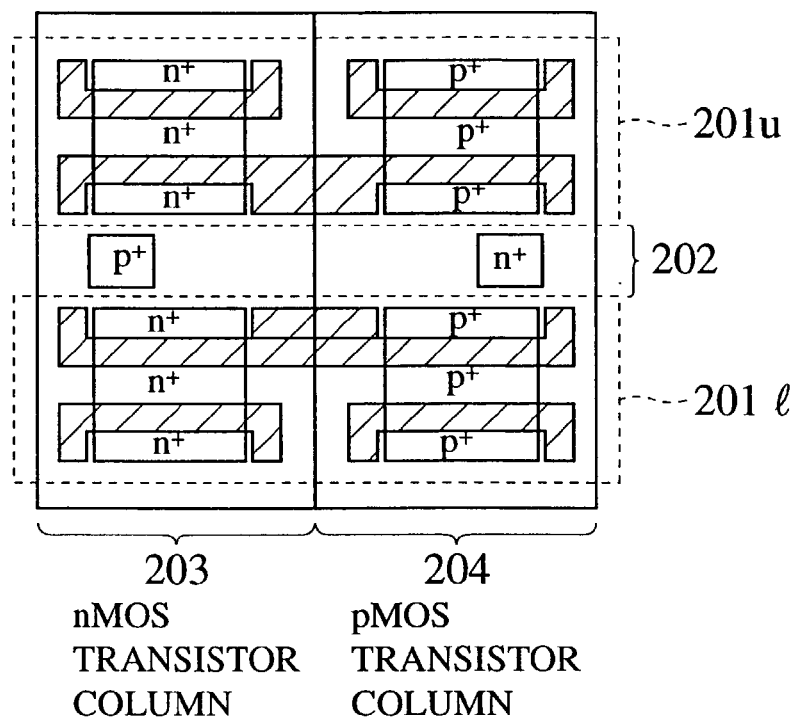
FIG. 4A is a layout showing a structure of basic cells of a gate array.
Figure 4B:
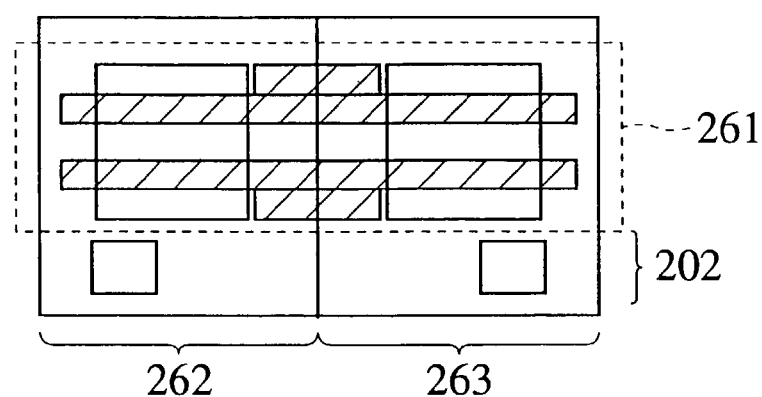
FIG. 4B is an example of a layout of a standard cell.
Figure 5A:
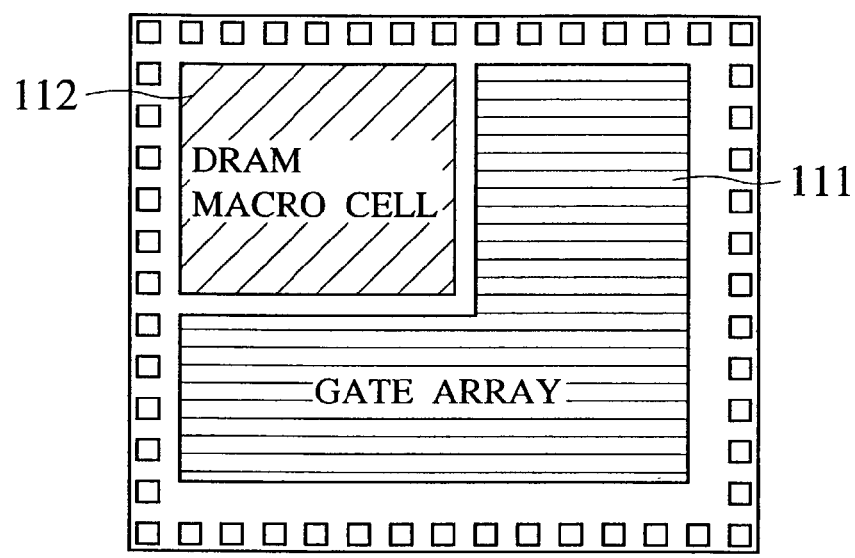
FIG. 5A is a schematic layout showing an example of a chip on which a gate array and a DRAM macro cell are mixed and mounted.
Figure 5B:
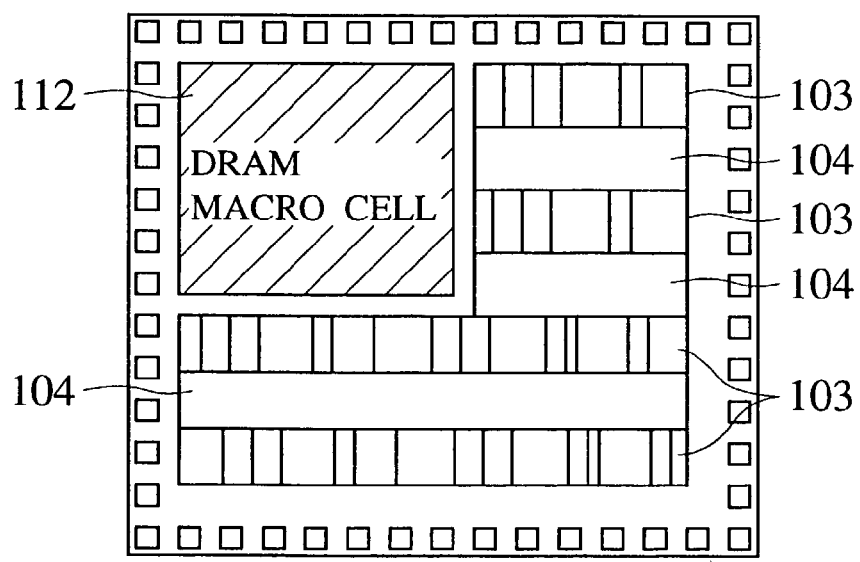
FIG. 5B is a schematic layout showing an example of a chip on which cell columns, wiring channels and a DRAM macro cell are mixed and mounted.
Figure 6:
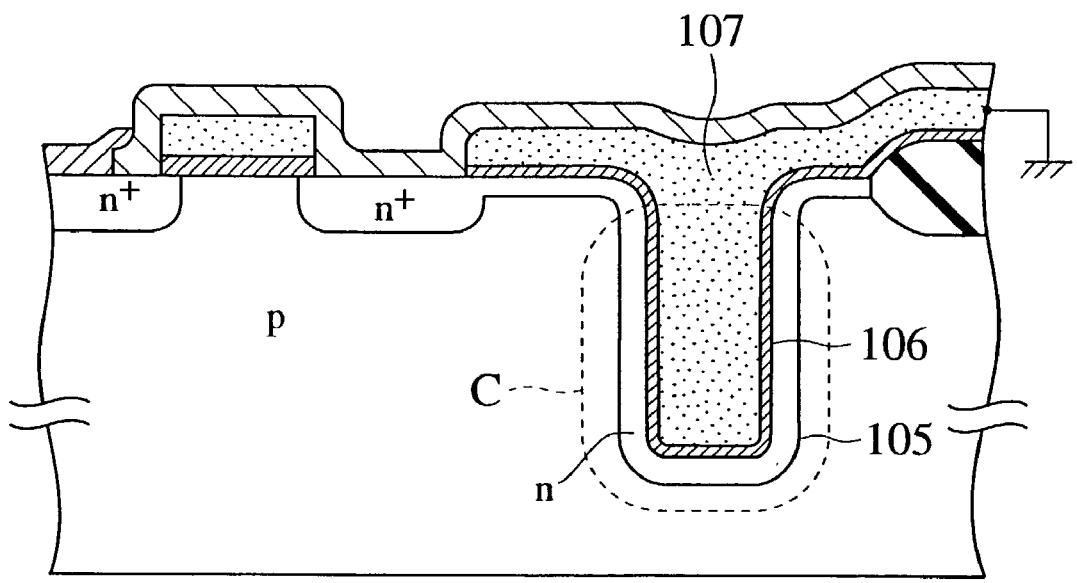
FIG. 6 is a sectional view of a capacitor used for a DRAM memory cell manufactured by a trench process.
Figure 17:
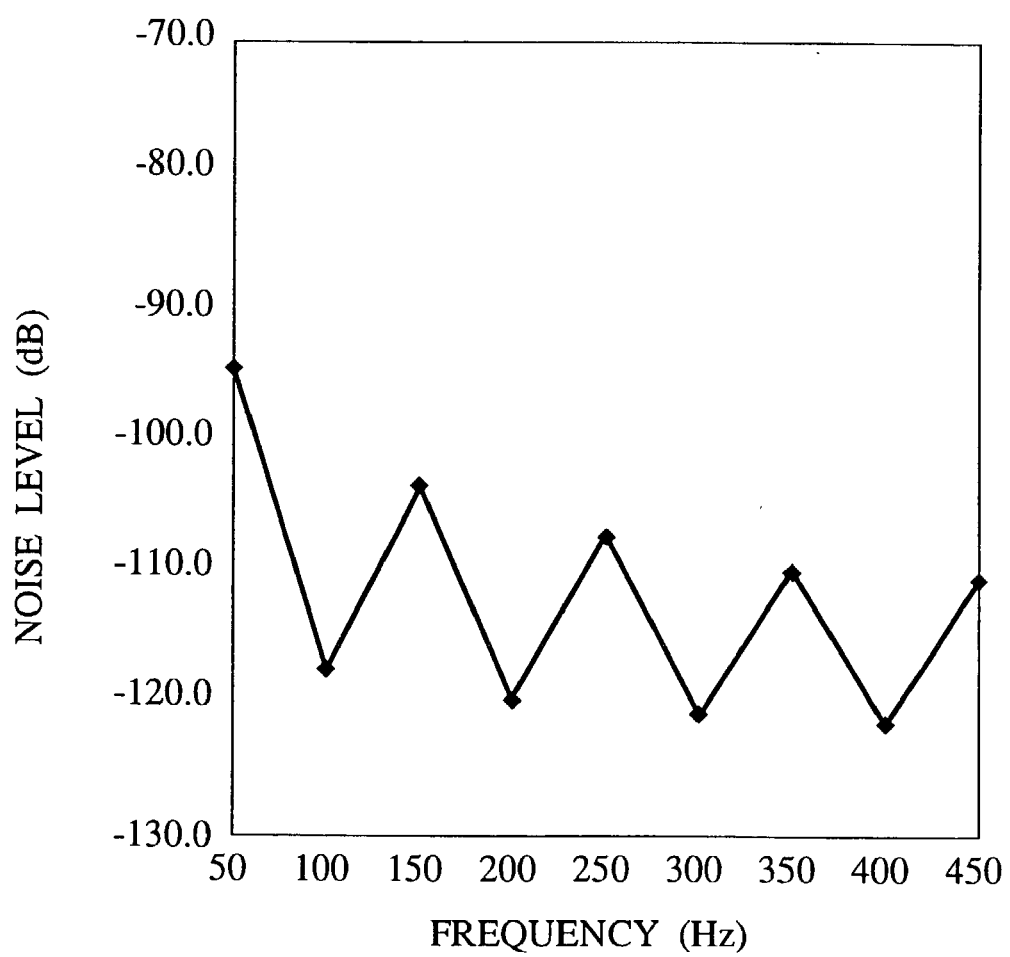
FIG. 17 is a graph showing a noise spectrum in the high level power supply line $V_{DD}$ shown in FIG. 16F.

FIG. 17 shows a spectrum of the noise level to the power supply current shown in FIG. 16F. Incidentally, the circuit elements and configurations except the noise filter in FIG. 13A are identical to those in the conventional circuit of FIG. 1, in this measurement of the spectrum. Moreover, the size of the transistor and the capacitance of the bypass capacitor C respectively have the same values as those in the conventional circuit of FIG. 1. As shown in FIG. 17, it is understood that the dB value indicative of the noise level in the third embodiment of the present invention is extremely reduced as compared with the noise level in the conventional example shown in FIG. 3.

Incidentally, the example in which the enable signal GN is activated in the "H" level is explained for the internal circuit 1 in the first to third embodiments of the present invention. However, naturally, it can be applied to even an example in which the enable signal GN is activated in the "L" level.

Fourth Embodiment

Methods of forming the bypass capacitors of the noise filter will be described in the fourth to eighth embodiments of the present invention.

In the fourth embodiment of the present invention, a bypass capacitor having a planer structure (or a stacked structure) is formed in a substrate contact region 42 between an upper basic cell 41u and a lower basic cell 41l.

Figure 18:
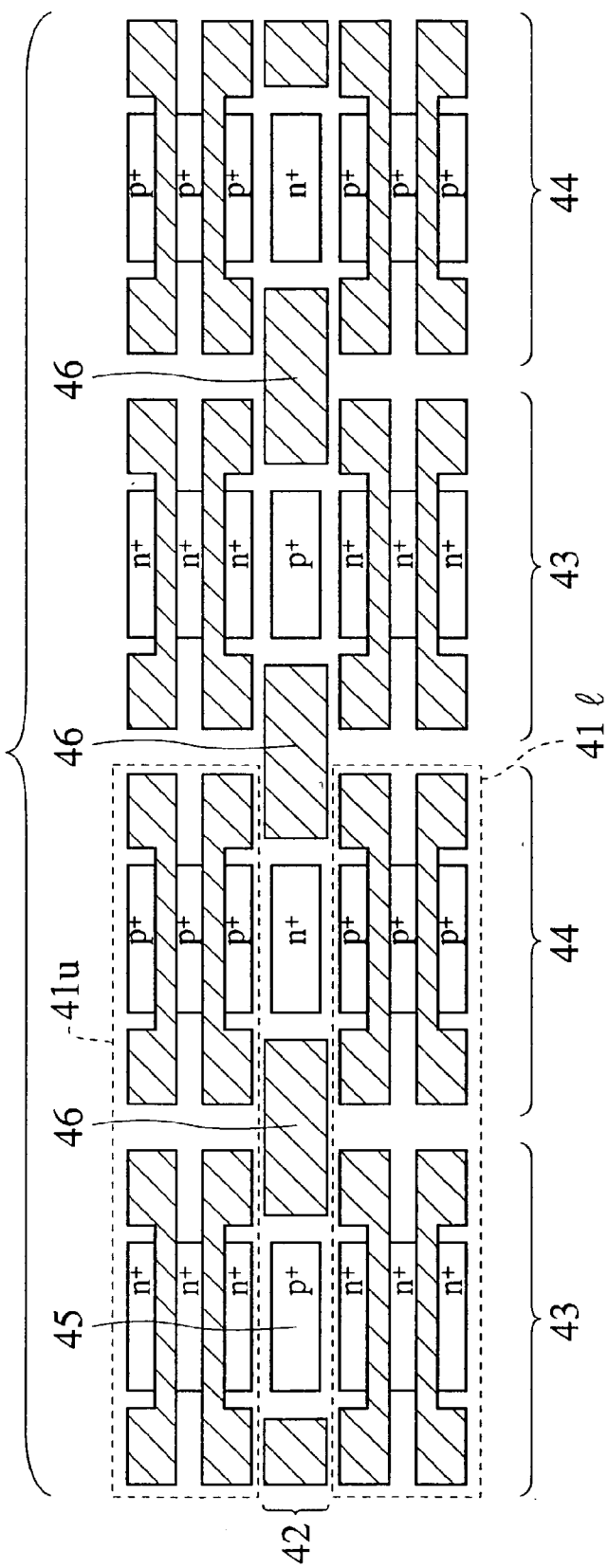
FIG. 18 is a layout of a gate array on a semiconductor wafer according to a fourth embodiment of the present invention.

FIG. 18 is a layout on a semiconductor wafer in a semiconductor device (ASIC) according to the fourth embodiment of the present invention. As shown in FIG. 18, a plurality of upper basic cells 41u and the lower basic cells 41l are regularly arranged on the semiconductor wafer to constitute a gate array. Each basic cells 41u and 41l has two nMOS transistors and two pMOS transistors. Moreover, a substrate contact region 42 on which contact holes for the sake of the ohmic contact between metal interconnects on an upper level and a well region on a lower level can be formed is disposed between adjacent basic cells 41u and 41l.

The nMOS transistors constituting the basic cells 41u and 41l are aligned in an nMOS transistor column 43. The pMOS transistors are aligned in a pMOS transistor column 44. Then, the nMOS transistor column 43 and the pMOS transistor column 44 are alternately disposed on the semiconductor wafer.

Contact holes to establish the ohmic contact between the low level power supply line (ground line) $V_{SS}$ and the well region are regularly formed on the nMOS transistor column 43 constituting the gate array. Contact holes to establish the ohmic contact between the high level power supply line $V_{DD}$ and the well region are regularly formed on the pMOS transistor column 44. These contact holes are formed on a contact formation region 45 within the substrate contact region 42. The low level power supply line $V_{SS}$ and the high level power supply line $V_{DD}$ which extend along the column direction are formed on the metal interconnect layers of the nMOS transistor column 43 and the pMOS transistor column 44, respectively. These power supply lines $V_{DD}$ and $V_{SS}$ and the respective transistor columns 43, 44 are connected to each other through the contact holes within the contact formation region 45, as necessary.

For example, a logic cell, such as an AND gate, an OR gate or the like, which is registered in advance as a cell library, is formed by connecting the respective transistors within the basic cells 41u and 41l through the substrate contact region 42 to the metal interconnects on the metal interconnect layer.

The fourth embodiment of the present invention is characterized in that a bypass capacitor C is formed in an empty space within the substrate contact region 42 as shown in FIG. 18. One of opposing electrodes of the bypass capacitor C is made with the doped polysilicon, which is a same conductive material as the polysilicon gate electrode of a transistor in the gate array. The doped polysilicon layer 46 for the bypass capacitor C can be formed in advance on the wafer at a simultaneous process with that of forming the basic cells 41u and 41l.

FIG. 18 shows an example in which the doped polysilicon layer 46 is formed in the vicinity of the boundary between the pMOS transistor column 44 and the nMOS transistor column 43 within the substrate contact region 42. The doped polysilicon layer 46 is connected through the contact hole to the low level power supply line formed on the metal interconnect layer of the nMOS transistor column 43 or the high level power supply line formed on the metal interconnect layer of the pMOS transistor column 44.

Figure 19B:
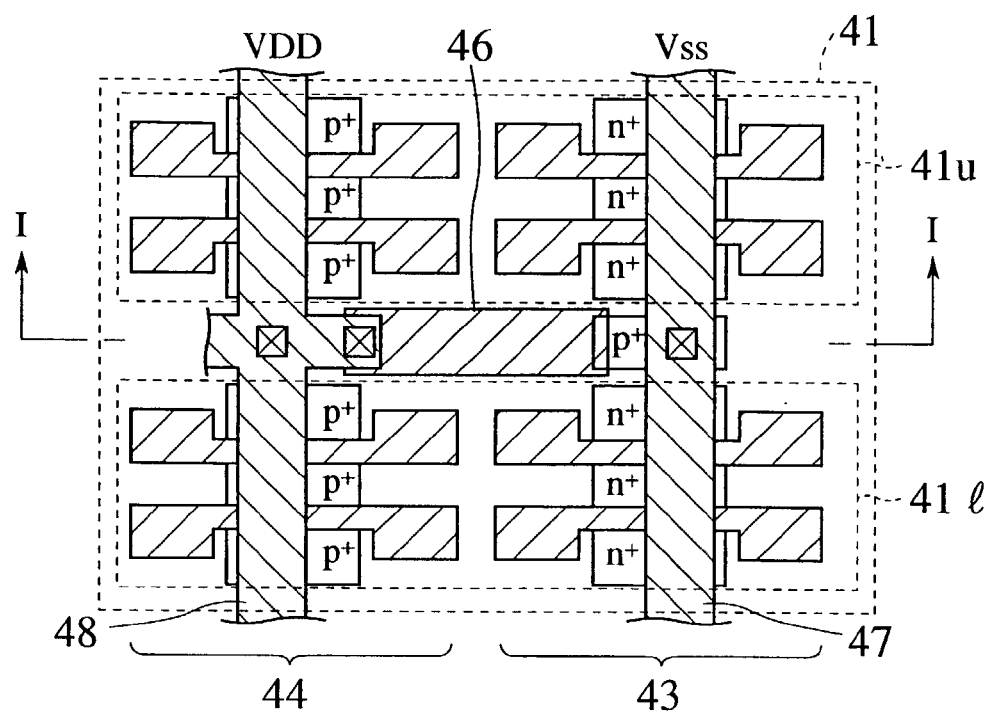
FIG. 19B is an enlarged view of part of FIG. 19A.
Figure 19C:
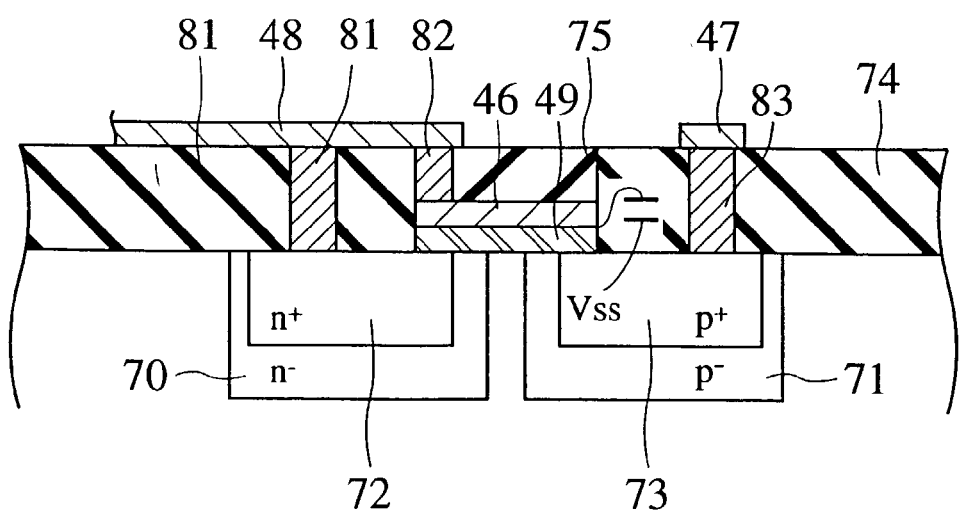
FIG. 19C is a sectional view taken on a line I—I of FIG. 19B.

For example, FIG. 19A is an example in which the doped polysilicon layers 46 are connected through the contact holes to the high level power supply lines 48 on the pMOS transistor column 44. FIG. 19B is an enlarged view of the part of FIG. 19A FIG. 19C is a sectional view taken on a line I—I of FIG. 19B. As shown in FIG. 19C, the doped polysilicon layer 46 is connected through a plug 82 embedded in a contact hole formed in an oxide film 75, to a high level power supply line ($V_{DD}$) 48 on the pMOS transistor column 44. An insulator layer 49, such as an oxide film and the like, is formed on a bottom surface of the doped polysilicon layer 46. Diffusion layers 70, 71, 72 and 73 are formed in a semiconductor substrate at a bottom surface of the insulator layer 49. A heavily doped $n^+$ contact region 72 having an impurity concentration of about $2 \times 10^{18}$ cm$^{-3}$ to $1 \times 10^{20}$ cm$^{-3}$ and a lightly doped $n^-$ well region 70 having an impurity concentration of about $2 \times 10^{15}$ cm$^{-3}$ to $1 \times 10^{18}$ cm$^{-3}$ are formed in the semiconductor substrate at the pMOS transistor column 44. It is connected to the high level power supply line ($V_{DD}$) 48 through a plug 81 embedded in a contact hole formed in an oxide film 74. On the other hand, a heavily doped $p^+$ contact region 73 having an impurity concentration of about $2 \times 10^{18}$ cm$^{-3}$ to $8 \times 10^{19}$ cm$^{-3}$ and a lightly doped $p^-$ well region 71 having an impurity concentration of about $2 \times 10^{15}$ cm$^{-3}$ to $1 \times 10^{18}$ cm$^{-3}$ are formed in the semiconductor substrate at the nMOS transistor column 43. The $p^+$ contact region 73 is connected to the low level power supply line ($V_{SS}$) 47 through a plug 83 embedded in the contact hole formed in the oxide film 74. The plugs 81, 82 and 83 may be made of doped polysilicon or refractory metal such as tungsten (W) or the like. Accordingly, the power supply voltage ($V_{DD}$-$V_{SS}$) is applied between the doped polysilicon layer 46 and the diffusion layers 71, 73, and the bypass capacitor C is formed on the side of the nMOS transistor column 43.

Figure 20A:
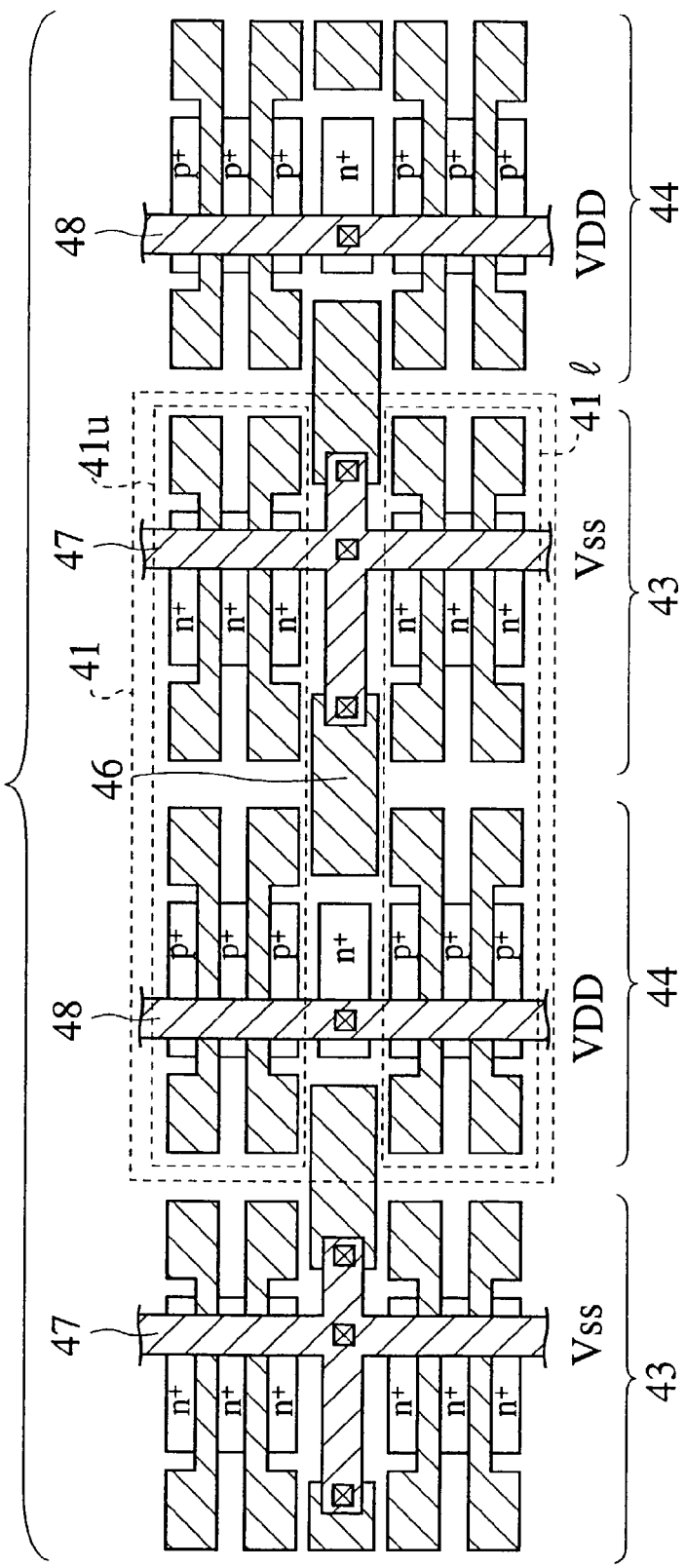
FIG. 20A is a view showing an example in which doped polysilicon layers for bypass capacitors are connected to low level power supply lines running on nMOS transistor columns.
Figure 20B:
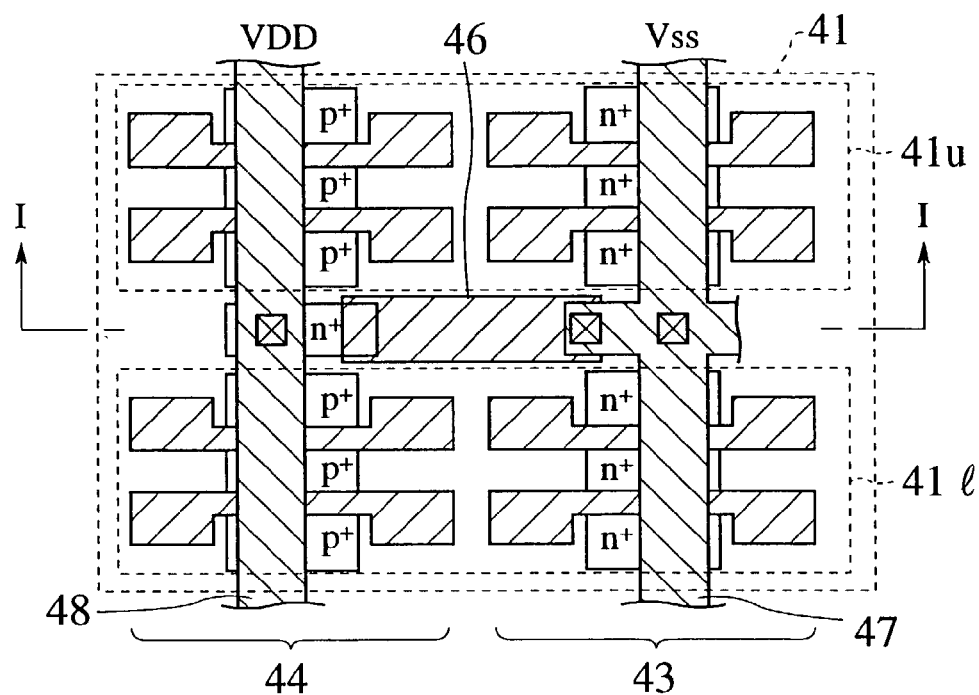
FIG. 20B is an enlarged view of part of FIG. 20A.
Figure 20C:
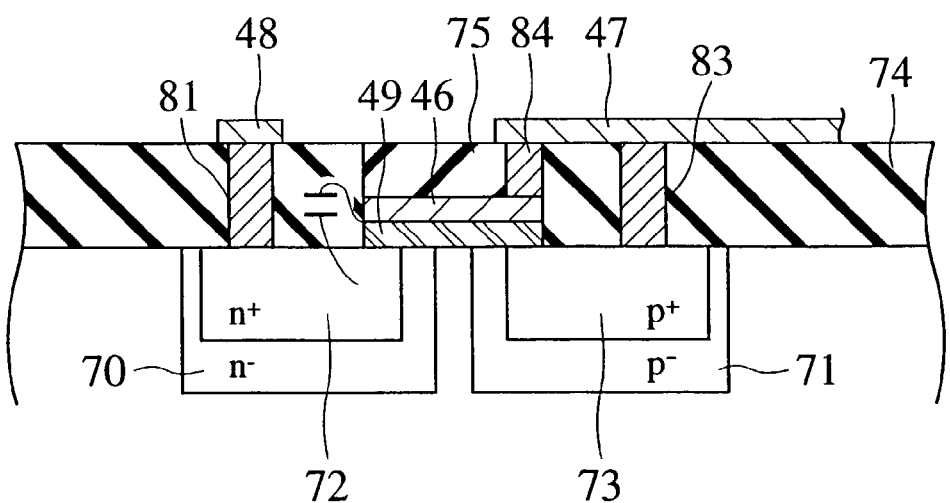
FIG. 20C is a sectional view taken on a line I—I of FIG. 20B.

On the other hand, FIG. 20A shows an example in which the doped polysilicon layer 46 is connected through the contact hole to the low level power supply line on the nMOS transistor column 43. FIG. 20B is an enlarged view of the part of FIG. 20A. FIG. 20C is a sectional view taken on a line I—I of FIG. 20B. As shown in FIG. 20C, the doped polysilicon layer 46 is connected through a plug 84 embedded in the contact hole bored in the oxide film 75, to the low level power supply line ($V_{SS}$) 43 on the nMOS transistor column 43. The plug 84 may be made of the doped polysilicon or the refractory metal such as the tungsten (W) or the like. The low level power supply line ($V_{SS}$) is connected to a $p^+$ contact region 73 through the plug 83 embedded in the contact hole bored in the oxide film 74. Moreover, an $n^+$ contact region 72 in the $n^-$ well region 70 is connected to the high level power supply line ($V_{DD}$) through the plug 81 embedded in the contact hole bored in the oxide film 74. So, the power supply voltage ($V_{DD}$-$V_{SS}$) is applied between the doped polysilicon layer 46 and the diffusion layers 70, 72, and the bypass capacitor C is formed on the side of the pMOS transistor column 44.

Figure 21:
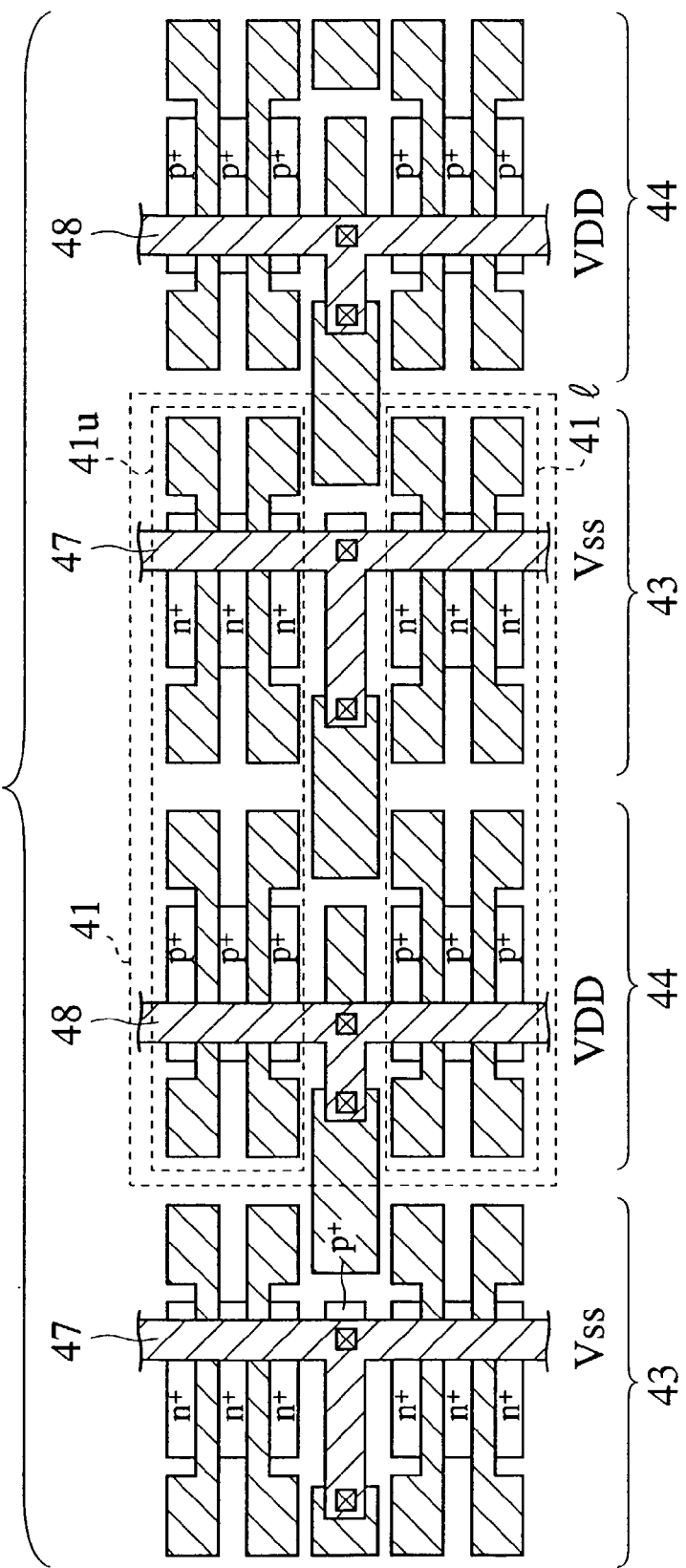
FIG. 21 is a view showing an example in which doped polysilicon layers for bypass capacitors are alternately connected to high level power supply lines and low level power supply lines.

As shown in FIG. 21, the doped polysilicon layers 46 may be alternately connected to the high level power supply line ($V_{DD}$) 44 and the low level power supply line ($V_{SS}$) 43.

The bypass capacitor C in FIGS. 19C and 20C has a so-called stacked structure. The capacitance thereof is determined by a dielectric constant of the insulator layer 49, a thickness of the insulator layer 49 and an area of the bypass capacitor C. That is, the capacitance is proportional to an area of the doped polysilicon layer 46 on the side of the nMOS transistor column 43 in FIG. 19C, and is proportional to an area of the doped polysilicon layer 46 on the side of the pMOS transistor column 44 in FIG. 20C. Hence, it is possible to form the doped polysilicon layer 46 having the maximum size in the empty space of the substrate contact region 42 to easily form the bypass capacitor C having the capacitance of about 10 times the input capacitance at the gate of the transistor, employing one or a plurality of the doped polysilicon layers. The number of polysilicon layers is determined required capacitance to suppress the switching noise in the cell. Furthermore, it is possible to attain the enough capacitance to suppress the EMI noise A thickness of the insulator layer 49 may be set to a thickness at which a tunneling current does not flow, for example, a thickness of about 8 nm to 50 nm. Also, it is effective to use a thin film having a perovskite structure such as barium strontium titanate ($Ba_xSr_{1-x}TiO_3$, hereafter referred to as BSTO) formed by multi-layer epitaxial growth as a dielectric substance used for the insulator layer 49. The utilization of the single crystal BSTO having Sr rich composition enables the dielectric constant equal to or more than 800, at a film thickness of 20 nm, for example.

As mentioned above, in the fourth embodiment of the present invention, it is possible to connect the doped polysilicon layer 46 to the low level power supply line 43 on the nMOS transistor column 43 or the high level power supply line 44 on the pMOS transistor column 44 to thereby form the bypass capacitor C in any position within the nMOS transistor column 43 or the pMOS transistor column 44. Since the formed bypass capacitor C is connected between the high level power supply ($V_{DD}$) line and the low level power supply ($V_{SS}$) line on the nMOS transistor column 43 or the pMOS transistor column 44, the dynamic current running through the basic cells 41u and 41l can be supplied from the bypass capacitor C. Thus, the change of the voltage in the power supply line is reduced, which can suppress the EMI noise radiated from the power supply line.

Figure 22A:
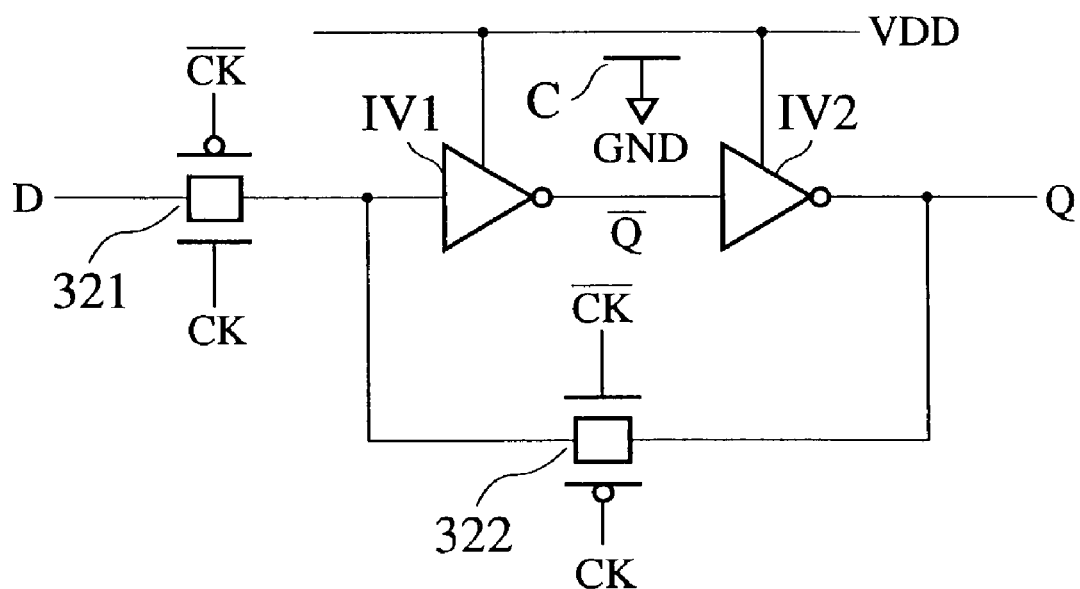
FIG. 22A is a circuit diagram showing an inner configuration of a flip-flop composed of two basic cells in FIG. 18.

FIG. 22A is a circuit diagram showing an inner configuration of a flip-flop formed by using two basic cells 41u and 41l shown in FIG. 18, and FIG. 22B is a layout of the flip-flop in FIG. 22A.

The flip-flop in FIG. 22A comprises pass transistors 321, 322 and inverters IV1, IV2. A bypass capacitor C shown in FIG. 18 is connected between a high level power supply ($V_{DD}$) line to which the inverters IV1, IV2 are connected and a low level power supply line (GND). As shown in FIG. 22B, this bypass capacitor C is formed by connecting a doped polysilicon layer 46 within a substrate contact region 42 to a high level power supply line 48 on a pMOS transistor column 44.

A basic cell shown in FIG. 22B is constituted by pMOS transistors $X_{p1}$, $X_{p2}$, $X_{p3}$ and $X_{p4}$, having p+ doped polysilicon gate electrodes 311, 312, 313 and 314, and nMOS transistors $X_{n1}$, $X_{n2}$, $X_{n3}$ and $X_{n4}$, having n+ doped polysilicon gate electrodes 315, 316, 317 and 318. A clock (CK) line 78 is connected to the p+ doped polysilicon gate electrode 312 of the pMOS transistor $X_{p2}$ and the n+ doped polysilicon gate electrode 315 of the nMOS transistor $X_{n1}$. An inverted clock (CK bar) line 77 is connected to the p+ doped polysilicon gate electrode 311 of the pMOS transistor $X_{p1}$ and the n+ doped polysilicon gate electrode 316 of the nMOS transistor $X_{n2}$. The high level power supply ($V_{DD}$) line 48 is connected to a common p+ source region 336 in the pMOS transistors $X_{p3}$, $X_{p4}$ and an n+ contact region 344 of an n well. The low level power supply ($V_{SS}$) line 47 is connected to a common n+ source region 346 in the nMOS transistors $X_{n3}$, $X_{n4}$ and a p+ contact region 344 of a p well.

The pass transistor 321 is constituted by the pMOS transistor $X_{p1}$ and the nMOS transistor $X_{n1}$. An output of the pass transistor 321 is inputted through a common p+ drain region 332 and a common n+ drain region 342 to the pass transistor constituted by the pMOS transistor $X_{p2}$ and the nMOS transistor $X_{n2}$. Moreover, the output of the pass transistor 321 is inputted through metal interconnects 401, 402 and 403 to the doped polysilicon gate electrode 313 of the pMOS transistor $X_{p3}$ and the doped polysilicon gate electrode 317 of the nMOS transistor $X_{n3}$. The inverter IV1 is constituted by the pMOS transistor $X_{p3}$ and the nMOS transistor $X_{n3}$. An output of the inverter IV1 is inputted through the metal interconnects 403, 405 and 406 to the p+ doped polysilicon gate electrode 314 of the pMOS transistor $X_{p4}$ and the n+ doped polysilicon gate electrode 318 of the nMOS transistor $X_{n4}$. The inverter IV2 is constituted by the pMOS transistor $X_{p4}$ and the nMOS transistor $X_{n4}$. Then, a p+ drain region 337 of the pMOS transistor $X_{p4}$, an n+ drain region 347 of the nMOS transistor $X_{n4}$, a p+ source region 331 of the pMOS transistor $X_{p1}$ and an n+ source region 341 of the nMOS transistor $X_{n1}$ are connected to each other through metal interconnects 411, 412. An output Q of the inverter IV2 is fed back as the input to the pass transistor 321. The flip-flop is constituted as mentioned above.

The metal interconnects 411, 412 are connected to each other through a via hole 381. Similarly, the metal interconnects 401, 402 are connected to each other through a via hole 382, the metal interconnects 402, 403 are connected to each other through a via hole 383, the metal interconnects 404, 405 are connected to each other through a via hole 385, and the metal interconnects 405, 406 are connected to each other through a via hole 386.

In the flip-flop, the output level thereof is changed in accordance with the clock. On the basis of the change, the dynamic current runs through the transistors constituting the flip-flop. However, if the bypass capacitor C as shown in FIGS. 22A and 22B is formed, the dynamic current running through the flip-flop can be supplied by the bypass capacitor C. Hence, it is possible to reduce the change of the amount of the current running through the power supply line to thereby suppress the EMI noise.

Incidentally, in FIG. 22B, the doped polysilicon layer 46 may be connected to the low level power supply line 47 on the nMOS transistor column 43.

Fifth Embodiment

Figure 23A:
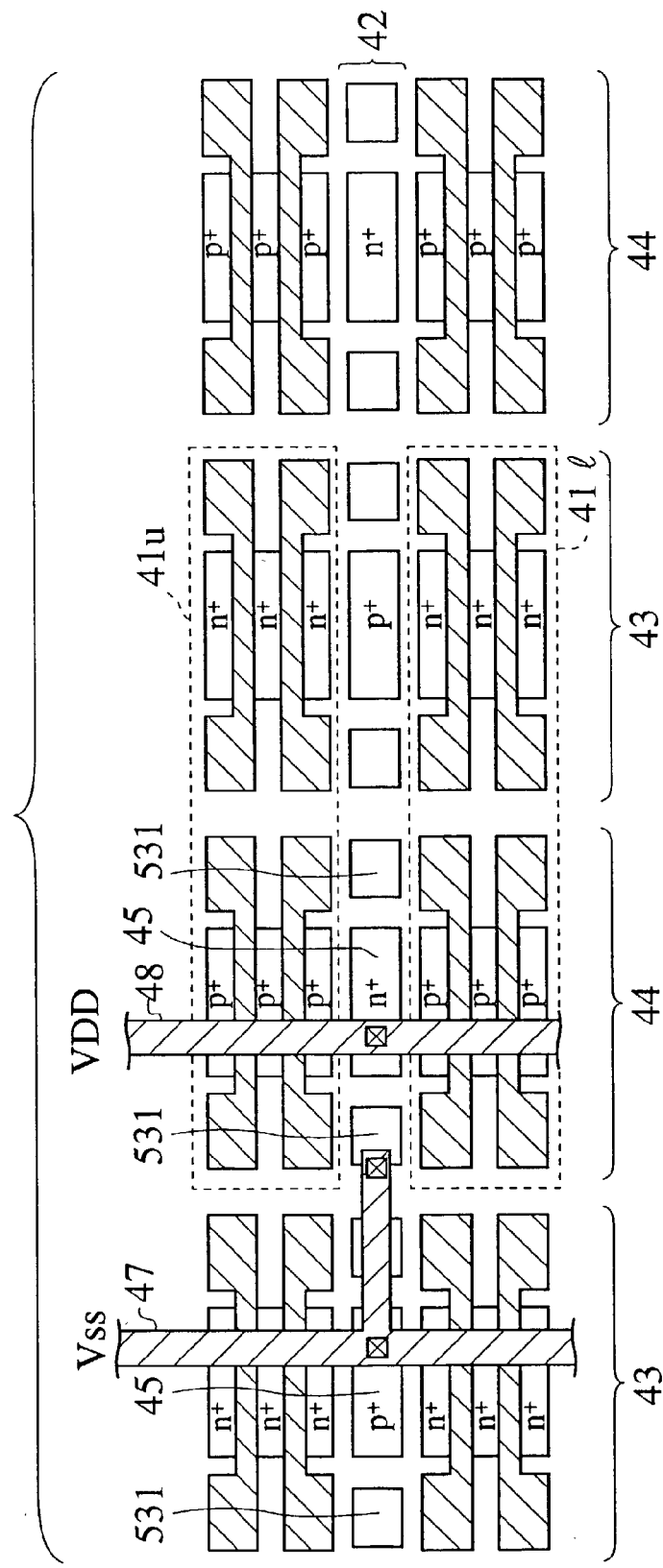
FIG. 23A is layout of a semiconductor device according to a fifth embodiment of the present invention formed on a semiconductor wafer.

In the fifth embodiment of the present invention, a bypass capacitor C having a trench structure is formed in a substrate contact region 42. FIG. 23A is a layout of a semiconductor device (ASIC) in the fifth embodiment of the present invention formed on a semiconductor wafer. As shown in FIG. 23A, a contact region 45 in which a contact hole can be formed to establish the ohmic contact between a metal interconnect on an upper level and a well region on a lower level, and a capacitor formation region 531 in which the bypass capacitor C having the trench structure is formed are disposed in a substrate contact region 42 formed between adjacent basic cells 41u and 41l. Two capacitor formation regions 531 are situated in each substrate contact region 42 of an nMOS transistor column 43 and a pMOS transistor column 44.

Figure 23B:
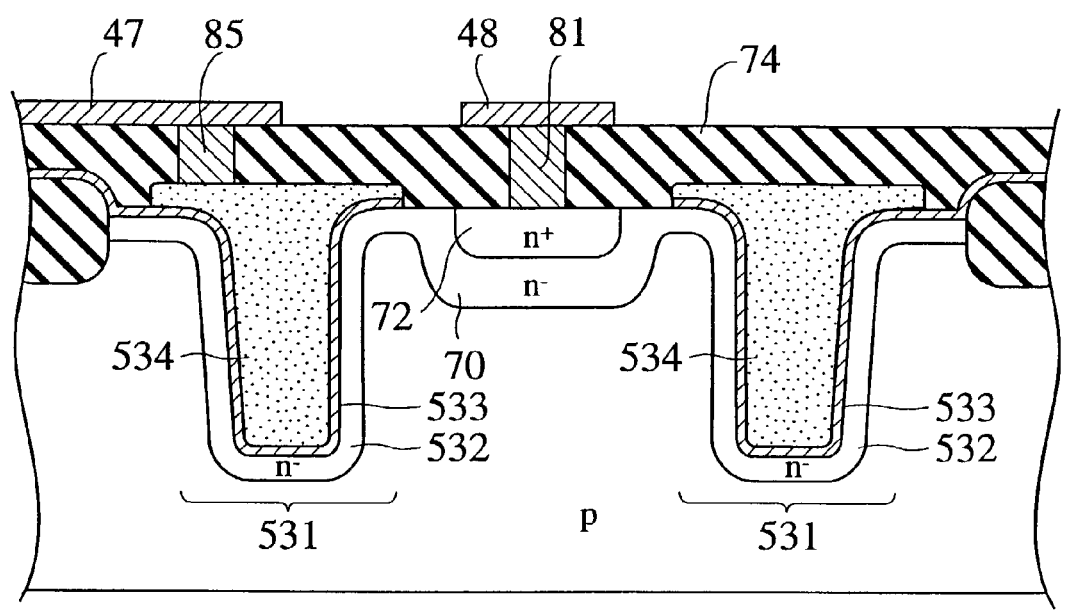
FIG. 23B is a view showing a sectional structure in a region in which a bypass capacitor is formed.

FIG. 23B is a view showing a sectional structure of the capacitor formation region 531. As shown in FIG. 23B, a groove (trench) is formed in a direction vertical to a surface of the substrate, and a diffusion layer 532 is formed on an inner wall of the groove. An insulator layer 533 is formed on a top surface of the diffusion layer 532. A doped polysilicon layer 534 is formed on a top surface of the insulator layer 533. Any one of the diffusion layer 532 and the doped polysilicon layer 533 is connected to a high level power supply ($V_{DD}$) line 48, and the other is connected to a low level power supply ($V_{SS}$) line. In a case shown in FIG. 23B, since an $n^+$ contact region 72 and the high level power supply line 48 are connected to each other through a plug 81, the n-type diffusion layer 532 is connected to the high level power supply line. Thus, the doped polysilicon layer 534 is connected to the low level power supply line 47 through a plug 85. The plugs 81 and 85 are embedded in contact holes dug in a insulator layer 74. If the diffusion layer 532 was a p-type, the diffusion layer 532 should be connected to the low level power supply line, and the doped polysilicon layer 534 should be connected to the high level power supply line 48.

As mentioned above, in the fifth embodiment of the present invention, the bypass capacitor having the trench structure is formed in each substrate contact region 42 of the nMOS transistor column 43 and the pMOS transistor column 44. Then, the formed bypass capacitor is connected between the terminal of the power supply and the terminal of the ground in the transistor column. Thus, the EMI noise can be surely suppressed by the charging and discharging operation of the bypass capacitor, similarly to the fourth embodiment. In the fourth embodiment, the bypass capacitor is formed in only one of the nMOS transistor column 43 and the pMOS transistor column 44 which are adjacent to each other. However, in the fifth embodiment, the bypass capacitor can be formed in each transistor column, which provides the excellent effect of the noise suppression.

Incidentally, FIG. 23A illustrates the example in which the two bypass capacitors C are formed in each transistor column. However, there is no special limit on the number, the shape and the size of the bypass capacitor.

Moreover, it is not necessary that all the electrodes of the bypass capacitor C of FIG. 23A formed in the substrate contact region 42 are connected to the high level power supply ($V_{DD}$) line and the low level power supply line. The electrode may be connected to only the portion where many noises are generated.

Sixth Embodiment

In the sixth embodiment of the present invention, the bypass capacitor C having the trench structure is formed on an outside edge of a basic cells 41u and 41l to thereby suppress the EMI noise.

Figure 24A:
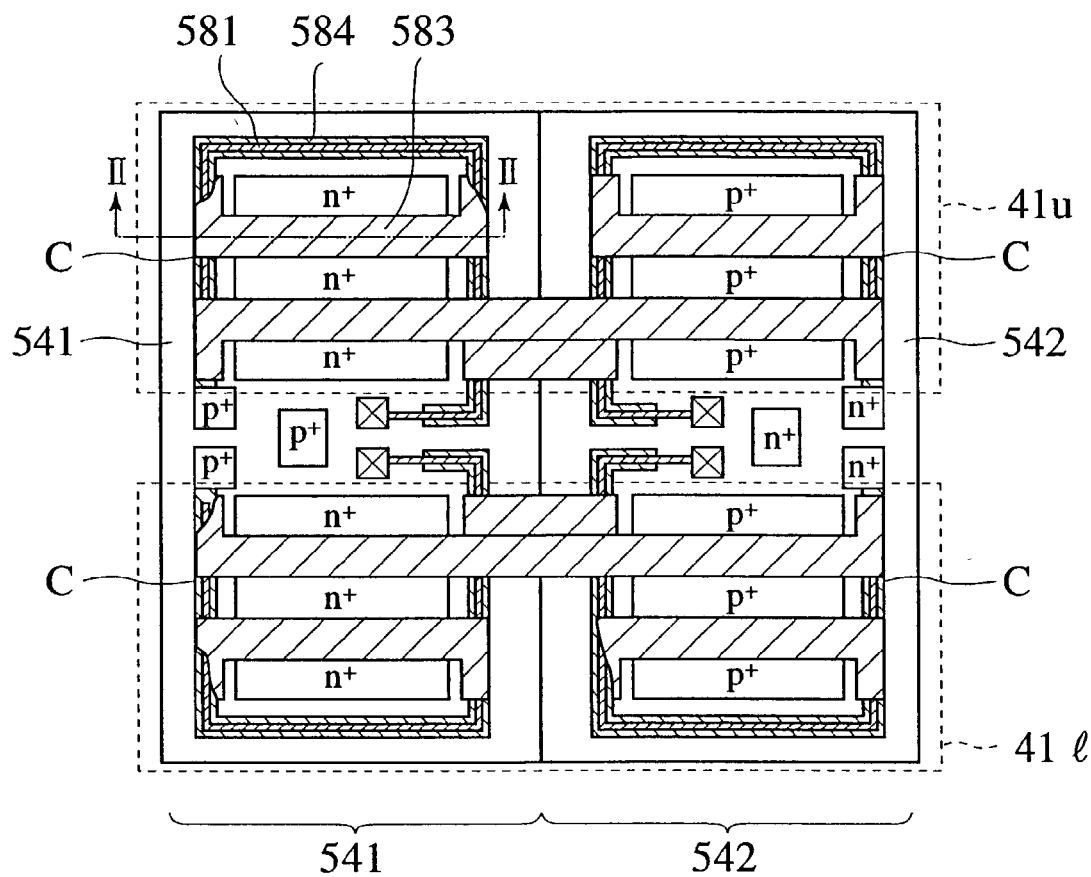
FIG. 24A is a layout of a semiconductor device in a sixth embodiment of the present invention formed on a semiconductor wafer.
Figure 24B:
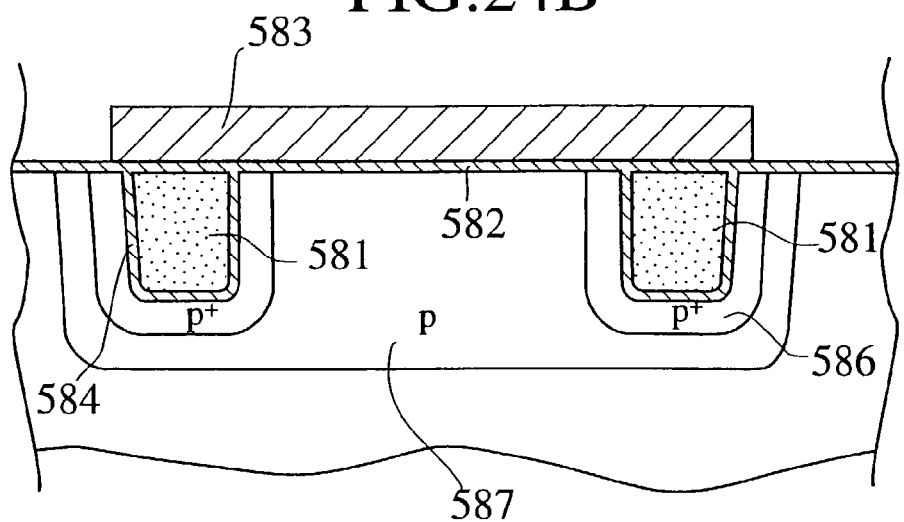
FIG. 24B is a sectional view taking on a line II—II in the layout of the semiconductor device shown in FIG. 24A.

FIG. 24A is a layout of a semiconductor device (ASIC) in the sixth embodiment of the present invention formed on a semiconductor wafer. FIG. 24B is a sectional view taking on a line II—II in the layout of the semiconductor device shown in FIG. 24A. The semiconductor device in FIG. 24A shows a basic configuration of a gate array in which an upper basic cell 41u having two nMOS transistors and two pMOS transistors are regularly arranged on the semiconductor wafer. The basic configuration of the semiconductor device in FIG. 24A further shows a lower basic cell 41l having two nMOS transistors and two pMOS transistors. The basic cells 41u and 41l has an nMOS transistor region 541 in which two nMOS transistors are formed and a pMOS transistor region 542 in which two pMOS transistors are formed. The bypass capacitor C having the trench structure is formed around each perimeter of these regions.

As shown in FIG. 24B, this bypass capacitor C is constituted by forming a groove in a direction vertical to the surface of the substrate, forming a $p^+$ diffusion layer 586 on the inner wall of this groove, forming an insulator layer 584 on the top surface of this $p^+$ diffusion layer 586 and forming a first doped polysilicon layer 581 on the top surface of this insulator layer 584 so as to fill up the groove. Moreover, a second doped polysilicon layer 583 is formed on this first doped polysilicon layer 581 through the insulation film 582. The insulation film 582 may be a film coupled to a gate insulation film. Another layer insulation film thicker than the gate insulation film may be formed on the first doped polysilicon layer 581. The second doped polysilicon layer 583 is a doped polysilicon layer connected to gate electrodes of the nMOS transistor region 541 and the pMOS transistor region 542. That is, the gate array shown in FIGS. 24A and 24B has a double-polysilicon structure. The doped polysilicon layer 581 of the bypass capacitor C formed in the nMOS transistor region 541 is connected to, for example, the low level power supply line, and the diffusion layer 586 is connected to, for example, the high level power supply line. The first doped polysilicon layer of the bypass capacitor C in the pMOS transistor region 542 is connected to, for example, the high level power supply line, and the diffusion layer is connected to, for example, the low level power supply line. Accordingly, a power supply voltage is applied to one end of the bypass capacitor C, and the other end thereof is grounded.

As mentioned above, in the sixth embodiment of the present invention, the bypass capacitors C having the trench structure are formed at the outer edges of the nMOS transistor region 541 and the pMOS transistor region 542 within the basic cells 41u and 41l. Thus, it is possible to form the bypass capacitor C with a small area and a sufficient capacitance to surely suppress the generation of the EMI noise. Moreover, this has little influence on the structure of the basic cells 41u and 41l. Hence, it is possible to relatively easily change the design and also possible to reduce the increase of the manufacturing cost.

FIGS. 24A and 24B show the example in which the bypass capacitor C is formed so as to surround the nMOS transistor and the pMOS transistor. However, there is no special limit on the shape of the bypass capacitor C. For example, the bypass capacitor C may be formed only at one side or two sides of the nMOS transistor region 541 and the pMOS transistor region 542. Moreover, a position at which the bypass capacitor C is formed may be formed at a position that is not a bottom of the second doped polysilicon layer 583, as shown in FIGS. 24A and 24B. That is, it may be formed so as to surround the further outsides of the nMOS transistor and the pMOS transistor, as shown in FIGS. 24C and 24D.

Figure 24C:
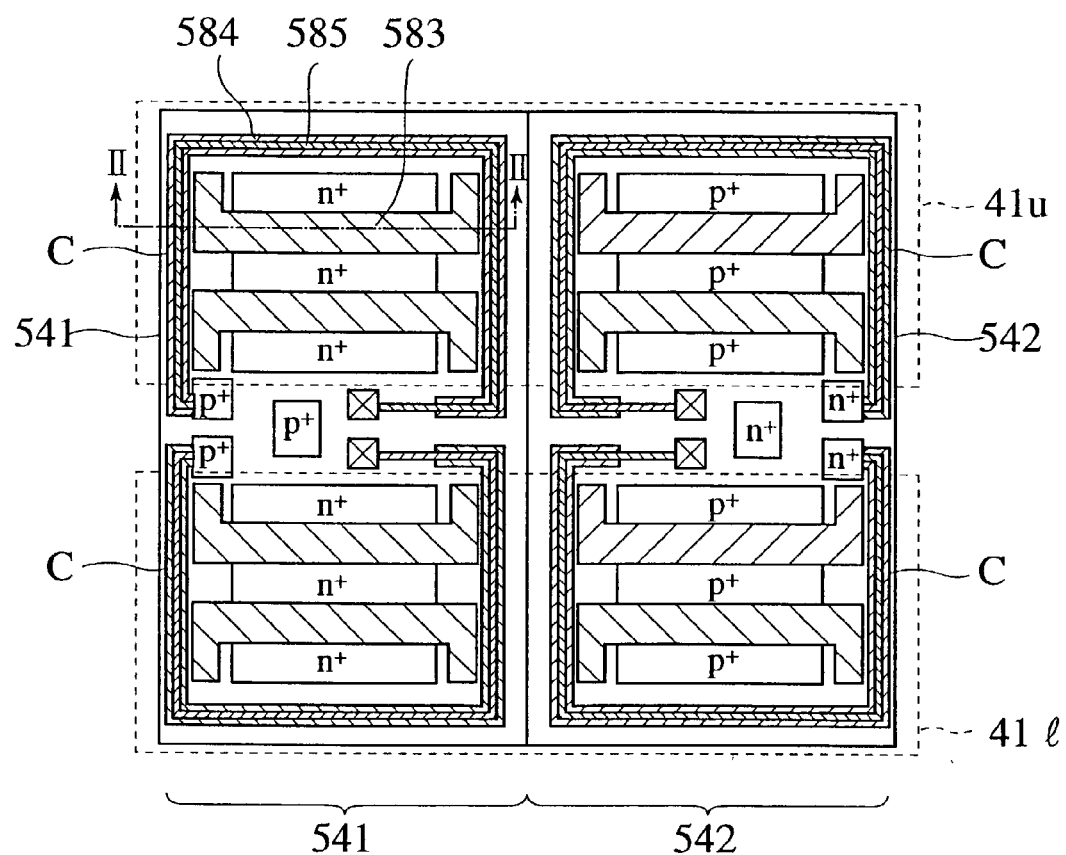
FIG. 24C is a layout of a semiconductor device according to a variation of the sixth embodiment of the present invention formed on a semiconductor wafer.
Figure 24D:
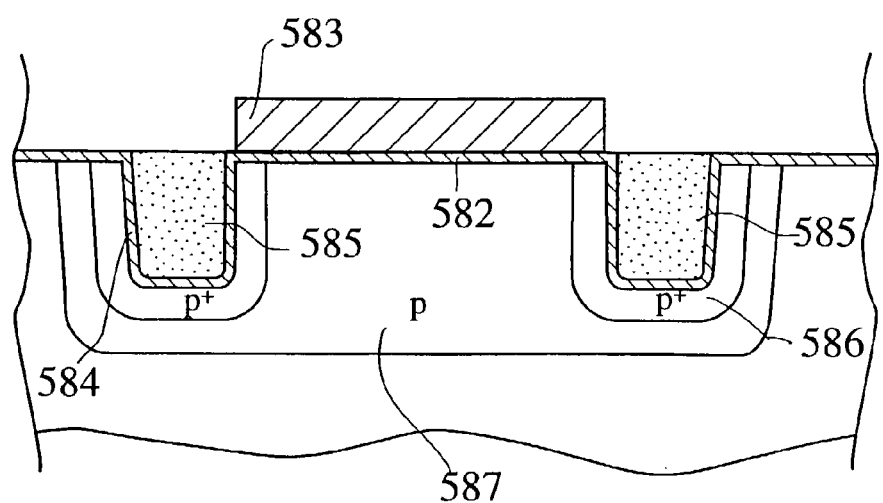
FIG. 24D is a sectional view taking on a line II—II in the layout of the semiconductor device shown in FIG. 24C.

FIG. 24C is a layout of a semiconductor device (ASIC) according to a variation of the sixth embodiment of the present invention formed on a semiconductor wafer. FIG. 24D is a sectional view taking on a line II—II in the layout of the semiconductor device shown in FIG. 24C. The semiconductor device shown in FIG. 24C has an upper basic cell 41u comprising two nMOS transistors and two pMOS transistors and a lower basic cell 41l comprising two nMOS transistors and two pMOS transistors. As shown in FIG.

24D, this bypass capacitor C is constituted by forming a groove in a direction vertical to the surface of the substrate, forming a diffusion layer 586 on the inner wall of this groove, forming an insulator layer 584 on the top surface of this diffusion layer 586 and forming a doped polysilicon layer 585 at the same level as gate electrodes 583 of the nMOS transistor and the pMOS transistor on the top surface of this insulator layer so as to fill up the groove. The insulation film 584 on the top surface of the diffusion layer can be formed at the same process as a gate oxide film 582. Such a configuration does not require the double-polysilicon structure as shown in FIGS. 24A and 24B. Hence, at a simpler process and with a simpler structure, the bypass capacitor C having the trench structure can be formed around the boundary of the nMOS transistor region 541 and the pMOS transistor region 542 within the basic cell 1.

Seventh Embodiment

In the seventh embodiment of the present invention, the bypass capacitor C having the trench structure is formed in a standard cell architecture.

Figure 25A:
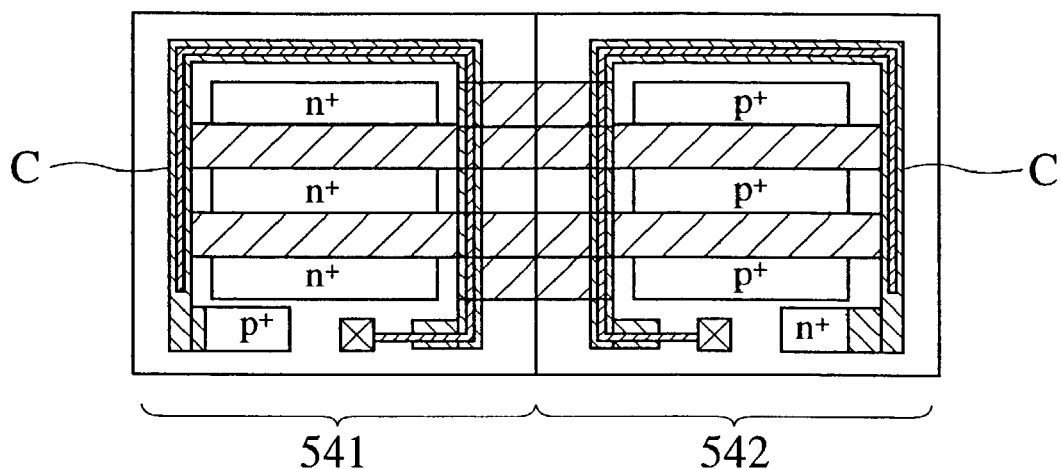
FIG. 25A is a layout of a semiconductor device in a seventh embodiment of the present invention formed on a semiconductor wafer.

FIG. 25A is a layout of a semiconductor device (ASIC) in the seventh embodiment of the present invention formed on a semiconductor wafer, and shows a layout of an example of a standard cell. The standard cell in FIG. 25A has an nMOS transistor region 541 composed of two nMOS transistors and a pMOS transistor region 542 composed of two pMOS transistors. The bypass capacitors C having the trench structure are formed around outside edges of the respective transistor regions, similarly to FIGS. 24A and 24B. That is, similarly to FIG. 24B, this bypass capacitor C is constituted by forming the groove in the direction vertical to the surface of the substrate, forming the diffusion layer on the inner wall of this groove, forming the insulator layer on the top surface of this diffusion layer and forming the first doped polysilicon layer on the top surface of this insulator layer 584 so as to fill up the groove. Moreover, the second doped polysilicon layer is formed on this first doped polysilicon layer through the layer insulation film. The second doped polysilicon layer is the doped polysilicon layer connected to the gate electrodes of the nMOS transistor region 541 and the pMOS transistor region 542. That is, the standard cell shown in FIG. 25A has the double-polysilicon structure. That is, the respective bypass capacitors C in FIG. 25A are connected similarly to the sixth embodiment shown in FIGS. 24A and 24B.

It is possible to form the bypass capacitor C such as FIG. 25A to thereby attain the effect similar to that of the sixth embodiment of the present invention. Especially, the bypass capacitor C having the trench structure has a larger capacitance per unit area as compared with the conventional bypass capacitor C using the gate oxide film. This enables the sufficient capacitance as the noise filter to be obtained. Moreover, since the bypass capacitor C can be formed by using the empty space of the conventional standard cell, the structure of the cell can be easily changed to thereby reduce the cost necessary for the change of the design.

Figure 25B:
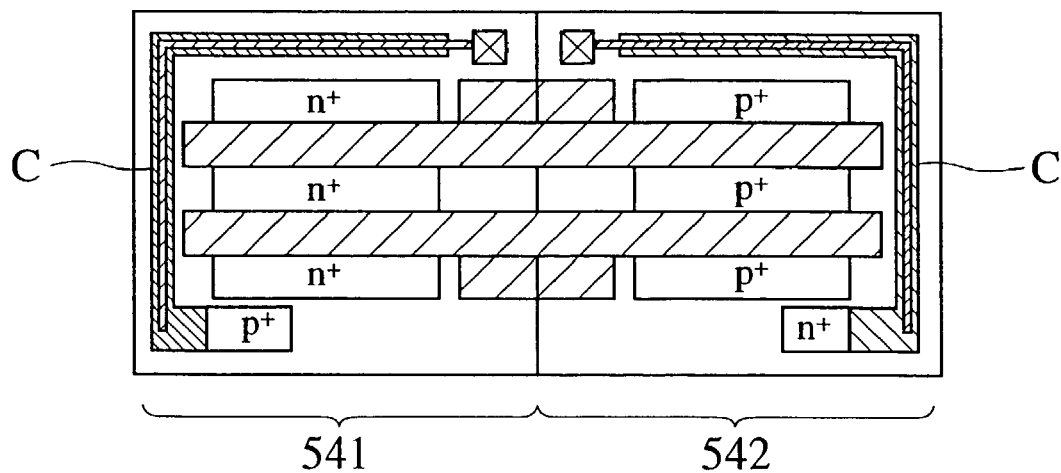
FIG. 25B is a layout of a semiconductor device according to a variation of the seventh embodiment of the present invention formed on a semiconductor wafer.

A position at which the bypass capacitor C is formed may be formed at a position that is not a bottom of the second doped polysilicon layer. That is, it may be formed so as to surround the further outsides of the nMOS transistor and the pMOS transistor, as shown in FIG. 25B. FIG. 25B is a layout of a semiconductor device according to a variation of the seventh embodiment of the present invention formed on a semiconductor wafer. The bypass capacitor C shown in FIG. 25B is constituted by forming a groove in a direction vertical to the surface of the substrate, forming a diffusion layer on the inner wall of this groove, forming an insulator layer on the top surface of this diffusion layer and forming a doped polysilicon layer at the same level as gate electrodes of the nMOS transistor and the pMOS transistor on the top surface of this insulator layer so as to fill up the groove. The insulation film on the top surface of the diffusion layer can be formed at the same process as a gate oxide film. Such a configuration does not require the double-polysilicon structure as shown in FIG. 25A. Hence, at a simpler process and with a simpler structure, the bypass capacitor C having the trench structure can be formed around perimeter of the nMOS transistor region 541 and the pMOS transistor region 542 within the basic cell.

Eighth Embodiment

In the eighth embodiment of the present invention, the bypass capacitor C having the trench structure is formed on a lower level of a cell base LSI or a gate array.

Figure 26A:
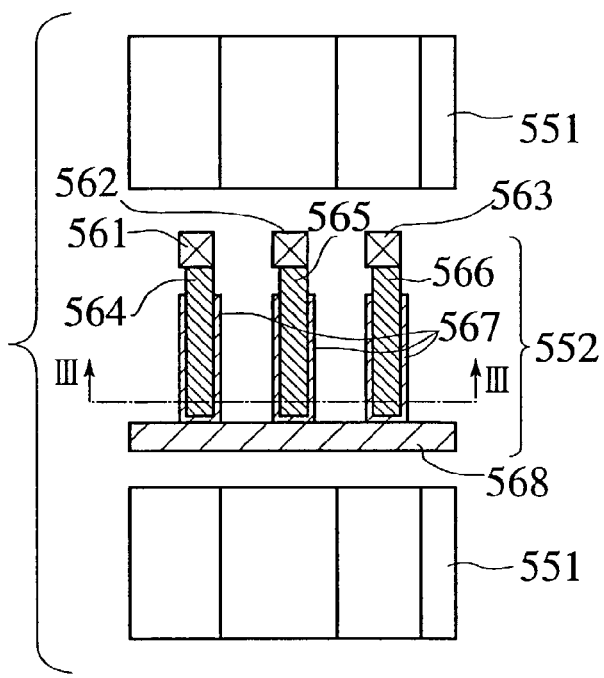
FIG. 26A is layout of a semiconductor device in an eighth embodiment of the present invention formed on a semiconductor wafer.
Figure 26B:
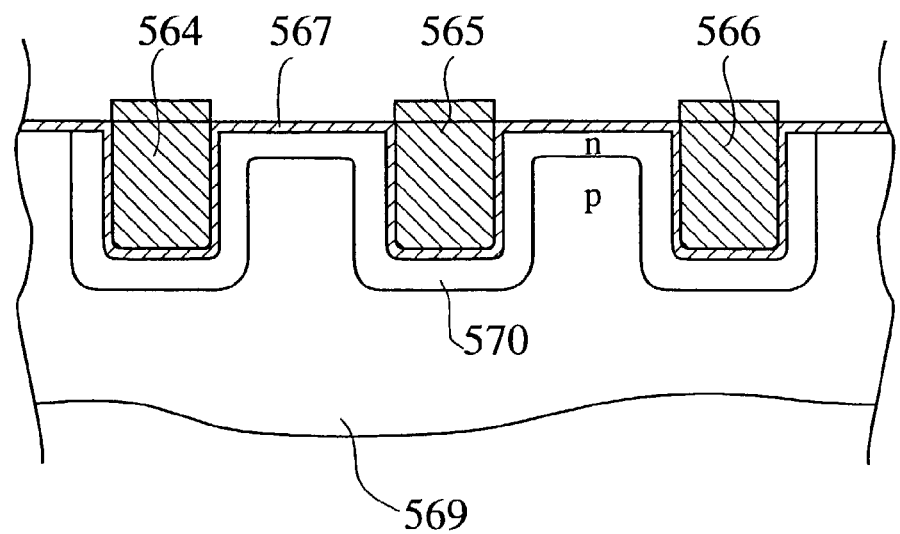
FIG. 26B is a sectional view taking on a line III—III in the layout of the semiconductor device shown in FIG. 26A.

FIG. 26A is a layout of a semiconductor device (ASIC) in the eight embodiment of the present invention formed on a semiconductor wafer, and shows a layout of a wiring channel of a standard cell. FIG. 26B is a sectional view taking on a line III—III in the layout of the semiconductor device shown in FIG. 26A. As shown in FIG. 26A, cell columns 551 composed of a plurality of standard cells are arranged at an interval of a distance on the semiconductor wafer, and a wiring channel 552 is disposed between these cell columns. The wiring channel 552 is used to establish the metal interconnects for the respective standard cells.

The bypass capacitor C having the trench structure is formed directly in the wiring channel 552. As shown in FIG. 26B, this bypass capacitor C is constituted by forming a groove in a direction vertical to the surface of the substrate, forming an n-type diffusion layer 570 on the inner wall of this groove, forming an insulator layer 567 on the, top surface of this n-type diffusion layer 570 and forming doped polysilicon layers 564, 565 and 566 on the top surface of this insulator layer 567 so as to fill up the groove. The insulation film 567 on the top surface of the n-type diffusion layer 570 can be formed at the same process as a gate oxide film or formed singly. There is no special limit on a formation area of the bypass capacitor C. However, a certain capacitance is required to suppress the EMI noise. Hence, it is desirable to form as long as possible the bypass capacitor C along a width direction of the wiring channel or make a depth of the trench (groove) deeper or increase the number of the trenches (grooves).

One electrode of the bypass capacitor C is connected through the n-type diffusion layer 570 to the high level power supply line or the low level power supply line, and the other electrode is connected through an aluminum wire and the like to the high level power supply line or the low level power supply line. For example, if the wiring channel 552 is formed within a p well region 569 and the diffusion layer 570 is in an n-type as shown in FIG. 26B, the n-type diffusion layer 570 servicing as one electrode of the bypass capacitor C is connected to the high level power supply line, and the doped polysilicon layers 564, 565 and 566 servicing as the other electrode are connected through contact holes 561, 562 and 563, the aluminum wire and the like to the low level power supply line. If the wiring channel 552 is formed within the p well region 569 and the diffusion layer is in a p-type, the diffusion layer servicing as the one electrode of the bypass capacitor C is connected to the low level power supply line, and the doped polysilicon layers servicing as the other electrode are connected to the high level power supply line. Conversely, if the wiring channel 552 is formed within an n well region and the diffusion layer is in the n-type, the diffusion layer servicing as the one electrode of the bypass capacitor C is connected to the high level power supply line, and the doped polysilicon layers servicing as the other electrode are connected through the contact holes, the aluminum wire and the like to the low level power supply line. If the wiring channel 552 is formed within the n well region and the diffusion layer is in the p-type, the diffusion layer servicing as the one electrode of the bypass capacitor C is connected to the low level power supply line, and the doped polysilicon layers servicing as the other electrode are connected to the high level power supply line Incidentally, the strength of the EMI noise is largely different depending on the position within the chip. Thus, when forming the bypass capacitor C explained in the fourth to eighth embodiments of the present invention, it is desirable to use a CAD tool and the like to then specify the place in which the EMI noise can be suppressed most effectively.

There is no special limit on the structure of the trench. For example, the trench may be formed associated with only a part of the metal interconnects within the wiring channel 552, or the trench may be formed associated with all the metal interconnects within the wiring channel 552.

Ninth Embodiment

Ninth to eleventh embodiments of the present invention relate to techniques of reducing the change of the current which causes the generation of the noise.

Figure 27:
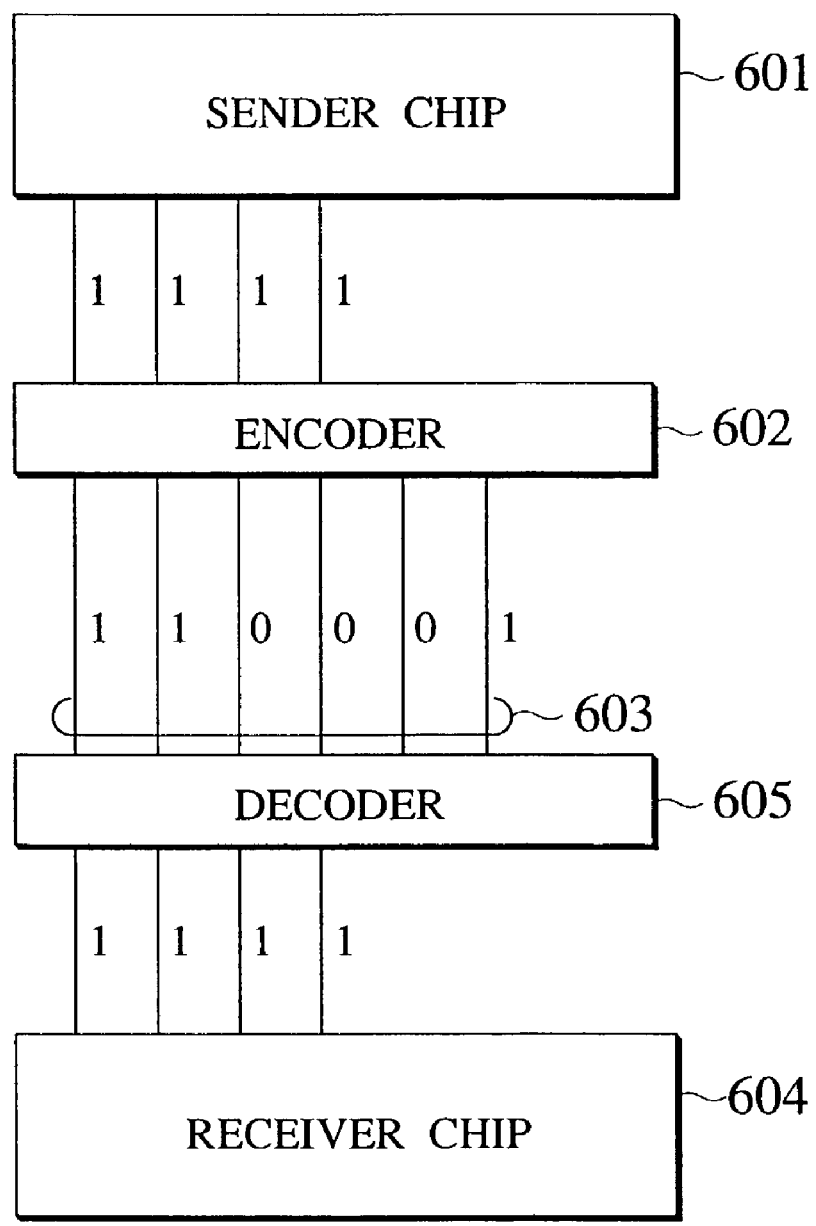
FIG. 27 is a view showing a configuration of a communication circuit according to a ninth embodiment of the present invention.

FIG. 27 is a view showing a configuration of a communication circuit according to the ninth embodiment of the present invention. This ninth embodiment of the present invention is characterized in that in order to always make the number of "0" equal to the number of "1" in all bits of the data to be sent through the data buses, the number of buses is set to m (m>n) by newly adding several buses to the buses of the n-bit data. The minimum m in which the number of combinations where m/2 data buses have the value of "0" and m/2 data buses have the value of "1" in the m data buses is equal to or greater than the number of combinations of bits of the n-bit data is set to be the number of the buses. Then, the bit patterns of the n-bit data are correlated with the bit patterns in which the number of "0" is equal to the number of "1" in the m data buses, in a one-to-one relationship. That is, the minimum m which satisfies the equation:

$$2^n \leq {}_mC_{m/2} \qquad (2)$$

for the n bit data is defined as the number of the data buses in the ninth embodiment.

The actual transmission example, for example, when n=4 bits will be explained below. When n=4 bits, the number of the bit patterns of the 4 bits is $2^4=16$.

$$m=n+1=5 \ {}_mC_{m/2}={}_5C_3=10<2^4=16 \qquad (3)$$

$$m=n+2=6, \ {}_mC_{m/2}={}_6C_3=20>2^4=16 \qquad (4)$$

When calculating sequentially in this way, it is possible to satisfy the above mentioned condition of the number of the buses at m=6. When the number of the buses at n=4 bits is judged as 6, the 4-bit data is assigned to a signal pattern of 6 bits in a one-to-one relationship and encoded. The encoded sent 6-bit data is decoded to the original 4-bit data by the receiving side.

Figure 9A:
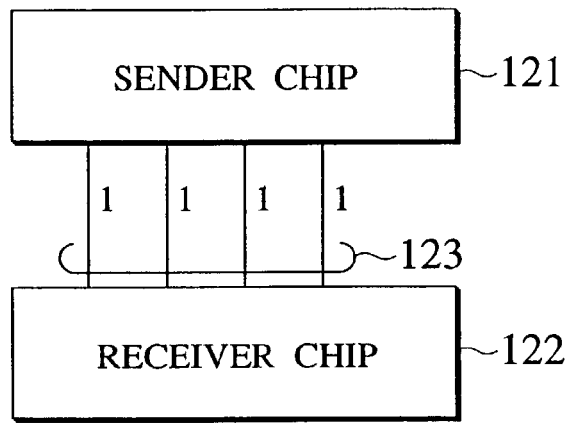
FIG. 9A is a view showing a conventional configuration of sending and receiving signals.
Figure 9B:
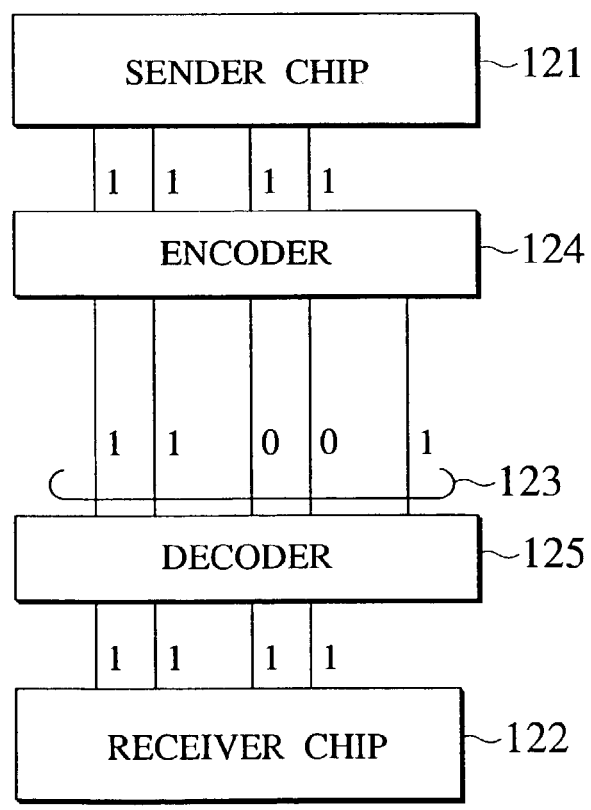
FIG. 9B is a view showing the conventional configuration of sending and receiving signals shown in FIG. 9A.

In order to carry out this process, as shown in FIG. 27, the communication circuit comprises an encoder 602 for receiving 4-bit data from, for example, a sender chip 601 servicing as a sending side circuit and encoding it, a 6-bit data bus 603 through which the 6-bit data encoded by the encoder 602 is sent, and a decoder 605 for receiving the 6-bit data sent through the data bus 603, decoding to the original 4-bit data and sending the transmission data to, for example, a receiver chip 604 servicing as a receiving side circuit. Incidentally, in FIG. 27, the encoder 602 is provided apart from the sender chip 601, and the decoder 605 is provided apart from the receiver chip 604. However, it may be implemented such that the sender chip 601 contains the encoder 602 and then the receiver chip 604 contains the decoder 605. Incidentally, FIG. 27 shows the example in which the signal of the 4-bit data (1, 1, 1, 1) is sent and received. However, the conventional configurations when the sending and receiving operation equivalent to this example should be performed corresponds to those shown in FIGS. 9A and 9B.

Figure 28D:
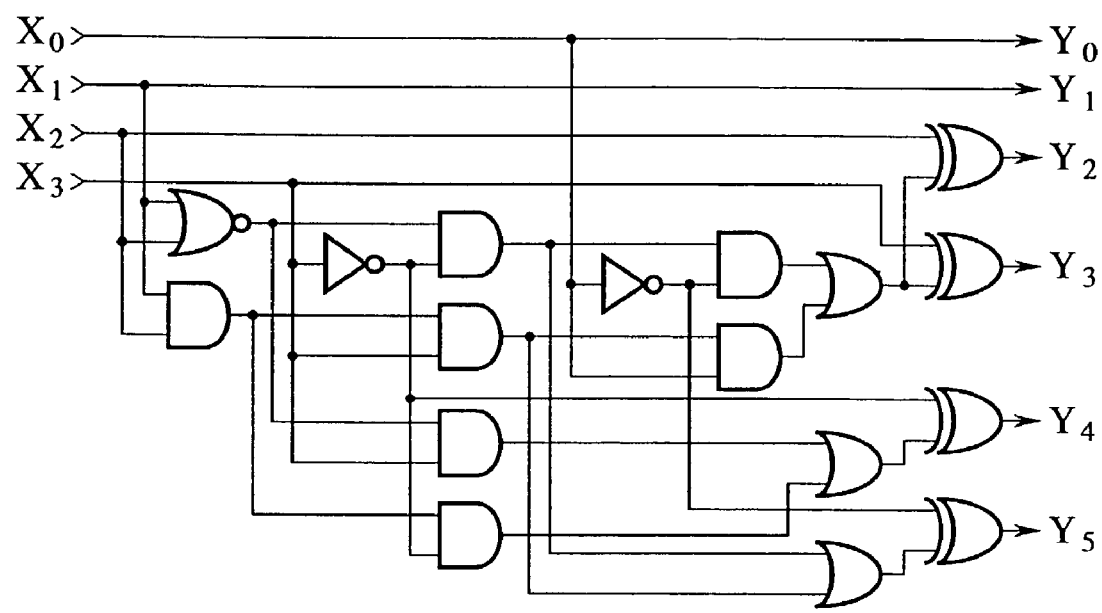
FIG. 28D is a view showing a configuration of an encoder.
Figure 28E:
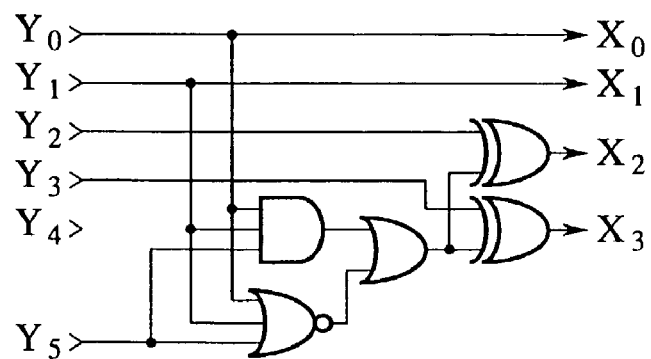
FIG. 28E is a view showing a configuration of a decoder.

In the pattern of the signal sent through the data bus 603 in the ninth embodiment of the present invention, in order to always make the number of "0" equal to the number of "1", the pattern is determined and assigned such that the signal is sent and received through the data bus 603 in which the number of "0" is always 3 and the number of "1" is always 3 in the six data buses 603. The signal pattern based on this assignment is, for example, as shown in FIG. 28A. The mathematical symbols and circuit symbols are explained in FIG. 28B. The logic equations (the Boolean equations) for the conversion of the signal pattern shown in FIG. 28A are as shown in FIG. 28C using the mathematical symbols shown in FIG. 28B. In order to implement the logic equations for the conversion, the encoder 602 is constituted by, for example, a combination of logic gates shown in FIG. 28D, and the decoder 605 is constituted by, for example, a combination of logic gates shown in FIG. 28E, in which the circuit symbols shown in FIG. 28B are employed.

An EMI noise in a simultaneous switching is proportional to an absolute value of a difference between the numbers of "0" and "1" in all bit data of the data buses. Thus, a condition effective for the suppression of a common phase power supply noise in an output buffer having a super high band width, such as DRAM and the like, is a situation in which the numbers of "0" and "1" are a half of the number of all bit outputs, respectively. Hence, in the ninth embodiment of the present invention, the difference between the numbers of "0" and "1" is always 0 in the data sent through the data bus 603. This can always keep the EMI noise to a minimum. Moreover, since the number of the data buses to be newly added is less than two times the transmission data. Therefore, it is possible to reduce the increase of the area of the data bus as much as possible.

Tenth Embodiment

Figure 29:
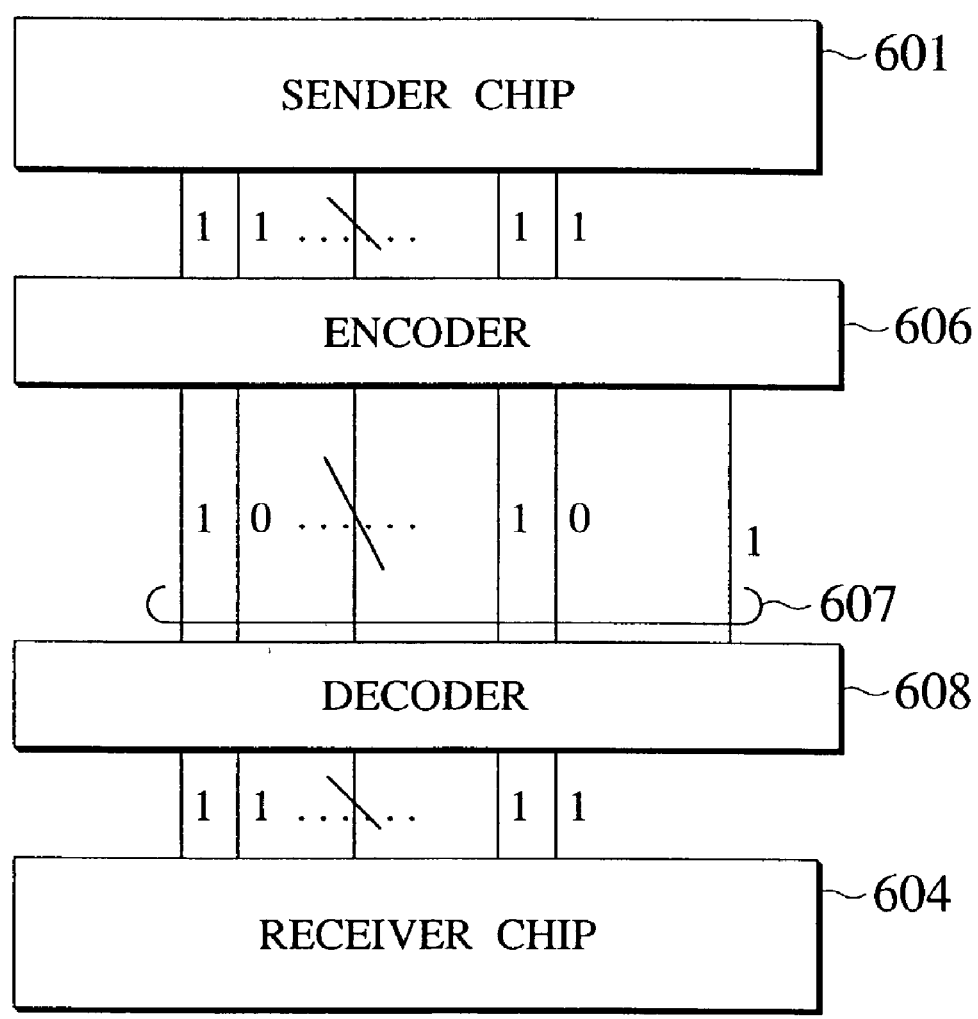
FIG. 29 is a view showing a configuration of a communication circuit according to a tenth embodiment of the present invention.

FIG. 29 is a view showing a configuration of a communication circuit according to the tenth embodiment of the present invention. The tenth embodiment of the present invention has the feature described below. That is, when n-bit data is sent, a flag bit is established, and a bus through which this flag bit is sent is added to a data bus. Then, the n bit data is sent and received through the (n+1) data buses. The absolute value of the difference between the numbers of "0" and "1" is assumed to be "s". If s<t (t=a reference value), the flag bit is set to "0" and then the data is sent while maintaining its original state. If s≧t, the flag bit is set to "1" and then the data is encoded and sent.

An example of n=64 bits will be explained below.

In n bit output data, there are $nC_{n/2}$ combinations in the patterns where the number of "0" is equal to the number of "1". And, there are $nC_{n/2} \times 2$ combinations in the patterns where the absolute value of the difference of the number of "0" and the number of "1" is 2. These combinations are correlated with output patterns in a one-to-one relationship when the flag is in "1". Then, "k" is assumed to be the number of "0" (or, the number of "1") in the n-bit output data. The reference value "t" to the absolute value "s" is given by the equation:

$$t = n - 2 \times k \tag{5}$$

At this time, the maximum "k" which satisfies the equation:

$$2 \times (_nC_0 + _nC_1 + _nC_2 + \ldots + _nC_k) \leq _nC_{n/2} + 2 \times _nC_{n/2-1} \tag{6}$$

is determined.

An example of determining and assigning the maximum "k" and the reference value "t" when n=64 will be calculated and determined below. The data patterns in which the absolute value "s" is large are sequentially assigned to the (I) and (II) patterns:

(I) a bit column pattern in which the number of "0" is 32 and the number of "1" is 32, at the maximum "k" equal to 0 to 24, $$2 \times (_{64}C_0 + _{64}C_1 + _{64}C_2 + \ldots + _{64}C_{24}) \leq _{64}C_{32} \tag{7}$$

$$\text{a left side} = 2 \times (1 + 64 + 2016 + \ldots + _{64}C_{24}) \tag{8}$$
$$= 2 \times 5.52859E + 17$$

$$\text{a right side} = 1.83262E + 18 \tag{9}$$

at the maximum "k" equal to 0 to 25, $$2 \times (_{64}C_0 + _{64}C_1 + _{64}C_2 + \ldots + _{64}C_{25}) \leq _{64}C_{32} \tag{10}$$

$$\text{a left side} = 2 \times (1 + 64 + 2016 + \ldots + _{64}C_{25}) \tag{11}$$
$$= 2 \times 9.53898E + 17$$

$$\text{a right side} = 1.83262E + 18 \tag{12}$$

all the patterns from k=0 to k=24, that is, all the patterns from the time at k=0 in which the number of "0" is 64 and the number of "1" is 0, or the number of "0" is 0 and the number of "1" is 64 to the time at k=24 in which the number of "0" is 24 and the number of "1" is 40, or the number of "0" is 40 and the number of "1" is 24 are assigned to the (I) pattern. Further, a part of the patterns at k=25 in which the number of "0" is 25 and the number of "1" is 39, or the number of "0" is 39 and the number of "1" is 25 are assigned to the (I) pattern. In this case, the value of the absolute value "s" is $64 \geq s \geq 14$.

(II) a bit column pattern in which the number of "0" is 31 and the number of "1" is 33 or the number of "0" is 33 and the number of "1" is 31, at the maximum "k" equal to 26 to 27, $$2 \times (_{64}C_{26} + _{64}C_{27}) \leq 2 \times _{64}C_{31} \tag{13}$$

$$\text{a left side} = 2 \times 1.44819E + 18 = 2.89638E + 18 \tag{14}$$

$$\text{a right side} = 2 \times 1.77709E + 18 = 3.55418E + 18 \tag{15}$$

The patterns remaining at k=25 and all the patterns from k=26 to k=27 are assigned to this (II) pattern. In this case, the value of the absolute value "s" is $14 \geq s \geq 10$. From the (I) and (II) cases, k=27 is calculated. Thus, from (I) $64 \geq s \geq 14$, (II) $14 \geq s \geq 10$ and $t = n - 2 \times k = 64 - 2 \times 27 = 10$, the value of reference value "t" is 10.

Accordingly, if the absolute value "s" is larger than or equal to t=10 ($s \geq t = 10$), the flag bit is set to "1", and the data to be sent is encoded, and the received data is decoded. On the other hand, if the absolute value "s" is smaller than t=10 ($s < t = 10$), the flag bit is set to "0", and the data is sent while maintaining its original state. As mentioned above, most of the signal patterns in which the absolute values "s" are large are sequentially assigned to the patterns in which the absolute values "s" are small, in a one-to-one relationship. Such an assignment is performed by an encoder 606 shown in FIG. 29. The encoded data together with the flag bit is sent through a data bus 607. The sent data is decoded to the original signal pattern by a decoder 608 shown in FIG. 29. Then, the decoded signal is sent to the receiver chip 604.

As mentioned above, according to the tenth embodiment of the present invention, the absolute value of the difference between the numbers of "0" and "1" in the output data is "0" or a value dose to "0", and is extremely small. Thus, the EMI noise is always at the minimum or dose to the minimum level. Moreover, since the number of the newly added bus is one and very small, the increase of the area is slight in the portion of the bus. Hence, this tenth embodiment can reduce the increase of the number of the data buses to the utmost to thereby suppress the generation of the EMI noise. Furthermore, this tenth embodiment can attain the stable operation of the circuit and have little influence on peripheral devices.

Eleventh Embodiment

Figure 30A:
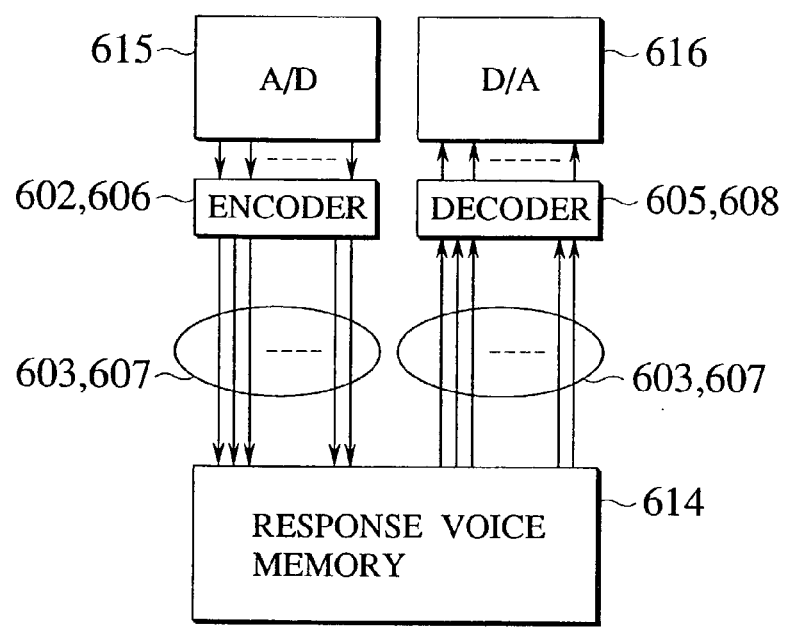
FIG. 30A is a view showing a configuration of main sections in a communication apparatus according to an eleventh embodiment of the present invention.
Figure 30B:
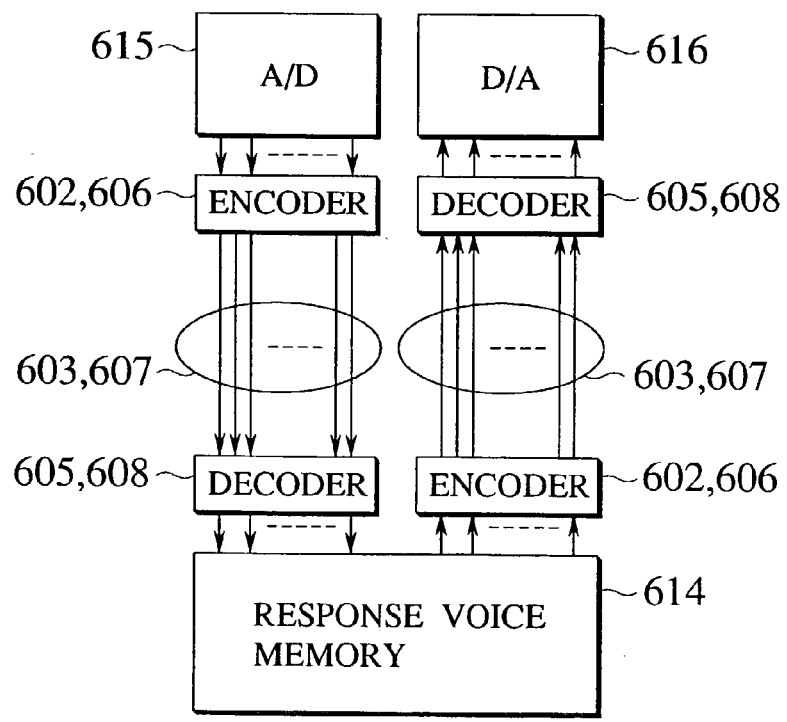
FIG. 30B is a view showing a configuration of other main sections in the communication apparatus according to the eleventh embodiment of the present invention.

FIGS. 30A and 30B are views showing configurations of main sections in a portable information communication apparatus according to an eleventh embodiment of the present invention. These configurations shown in FIGS. 30A and 30B can be applied to a portable information communication apparatus shown in FIG. 31.

Figure 31:
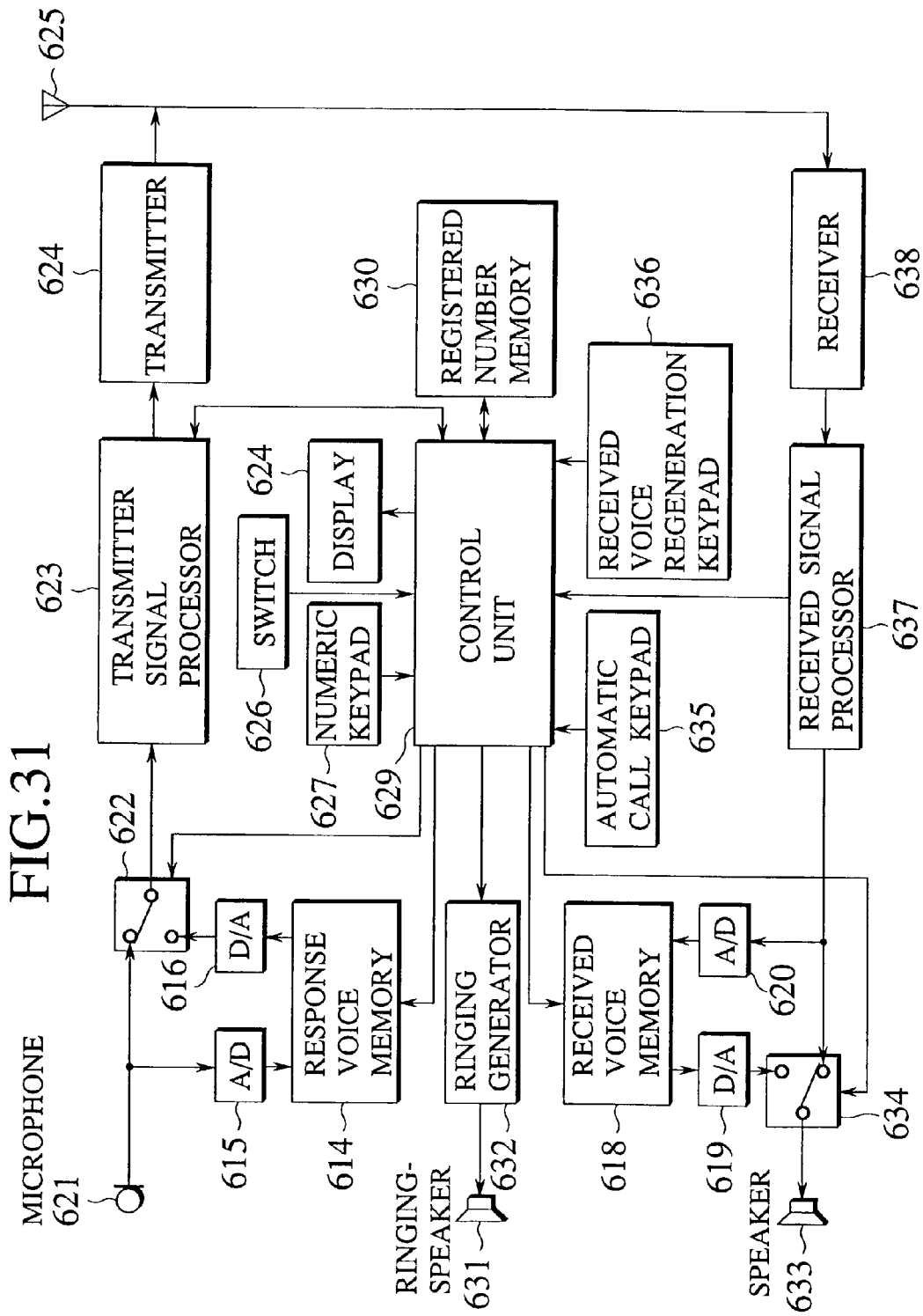
FIG. 31 is a view showing a configuration of the communication apparatus according to the eleventh embodiment of the present invention.

The portable information communication apparatus shown in FIG. 31 comprises a first A/D converter 615, a transmission memory (response voice memory) 614, a first D/A converter 616, a transmitter signal processor 623 connected to the first D/A converter 616, and a wireless transmitter 624 connected to the transmitter signal processor 623. The portable information communication apparatus shown in FIG. 31 further comprises a wireless receiver 638, a received signal processor 637 connected to the wireless receiver 638, a second A/D converter 620 which is connected to the received signal processor 637, a reception memory (received voice memory) 618, a second D/A converter 619, and a speaker 633. The portable information communication apparatus uses the transmission memory (response voice memory) 614, the A/D converter 615, the D/A converter 616, the reception memory (received voice memory) 618, the D/A converter 619 and the A/D converter 620 to then perform an operation of an automatic call mode, and has a function of ringing a call-accepted tone in response to a call from a particular originator in accordance with a flowchart shown in FIG. 32.

Figure 32:
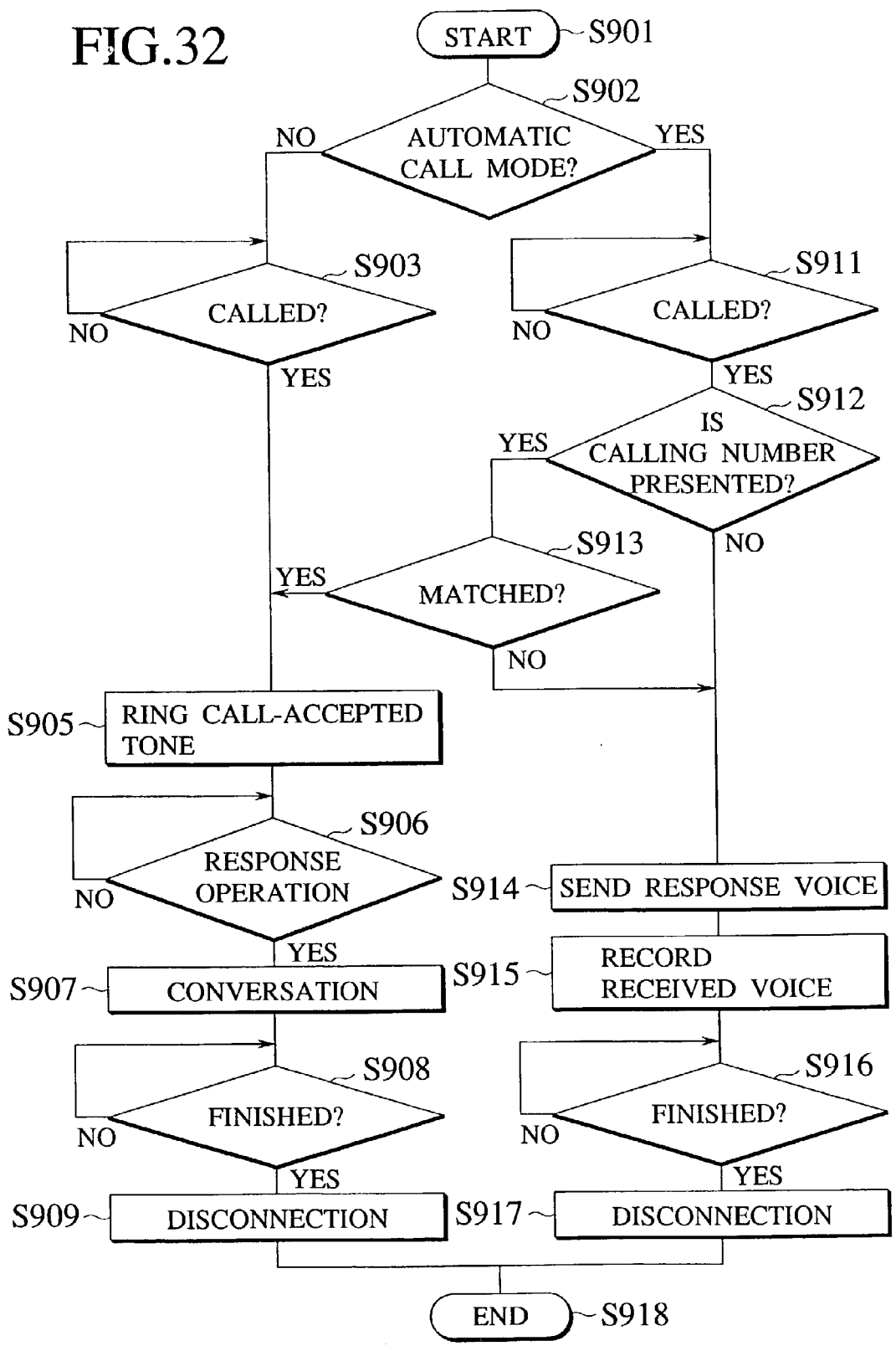
FIG. 32 is a view showing an operation flowchart in the apparatus shown in FIG. 31.

The flowchart in FIG. 32 will be schematically explained below.

(a) The operation starts at a step S901. It is judged at a step S902 whether or not a mode is the automatic call mode. If it is not the automatic call mode, the operation proceeds to a step S903. If it is the automatic call mode, the operation proceeds to a step S911.

(b) It is judged at a step S903 whether or not there is a call. If there is the call, the call-accepted tone is ringed at a step S905. It is judged at a step S906 whether or not a response operation is needed. If the response operation is needed, a conversation is performed at a step S907. It is judged at a step S908 whether or not the call is finished. If the call is finished, the circuit is disconnected at a step S909.

(c) On the other hand, if the mode is the automatic call mode, it is judged at a step S911 whether or not there is the call. If there is the call, it is judged at a step S912 whether or not an originator number is presented. If the originator number is presented, the operation proceeds to a step S913. If the originator number matches with a set number at the step S913, the operation proceeds to a step S905. If the originator number does not match with the set number, the operation proceeds to a step S914.

(d) Even if it is judged at the step S912 that the originator number is not presented, the operation proceeds to the step S914. The response voice is sent out at the step S914, and the received voice is recorded at a step S915. It is judged at a step S916 whether or not the recording is finished. If the recording is finished, the circuit is disconnected at a step S917.

In such a portable telephone apparatus, an analog signal inputted from a microphone 621 is converted into a digital signal having many bits by the A/D converter 615, and accumulated in response voice memory 614 through a bus. The accumulated digital signal has an extremely high frequency as compared with an analog voice signal. The passage of the digital signal through the bus causes the generation of the electromagnetic radiation with the bus wire as an antenna. This has a bad influence resulting from an unnecessary EMI noise on the whole apparatus. Since the portable telephone apparatus comprises an antenna 625 and wireless receiver circuits 637, 638, there may be a fear that even a slight unnecessary electromagnetic wave causes the apparatus to suffer from the obstacle to the sending and receiving operation. Similarly, a bus between the response voice memory 614 and the D/A converter 616, a bus between the A/D converter 620 and the received voice memory 618 and a bus between the received voice memory 618 and the D/A converter 619 cause the electromagnetic radiation.

In FIG. 30A, the response voice memory 614 and the A/D converter 615 are connected to each other through the encoder 602 and the data bus 603 which are explained in the ninth embodiment of the present invention and shown in FIG. 27 or the encoder 606 and the data bus 607 which are explained in the tenth embodiment and shown in FIG. 29. The transmission memory (response voice memory) 614 and the D/A converter 616 are connected to each other through the decoder 605 and the data bus 603 shown in FIG. 27 or the decoder 608 and the data bus 607 shown in FIG. 29. Such a configuration causes the signal encoded by the encoder 602 or 606 to be accumulated in the response voice memory 614. Thus, it is necessary to make the memory size slightly larger. However, this configuration has the merit of only requiring one encoder and one decoder. Incidentally, in the configuration shown in FIG. 31, even if the connections similar to the above mentioned connections are established between the received voice memory 618 and the D/A converter 619 and between the received voice memory 618 and the A/D converter 620, the similar effectiveness can be attained.

On the other hand, in the configuration shown in FIG. 30B, the transmission memory (response voice memory) 614 is connected to the A/D converter 615 through the communication circuit composed of the encoder 602, the data bus 603 and the decoder 605 shown in FIG. 27, and further the response voice memory 614 is connected to the D/A converter 616 through the communication circuit composed of the encoder 606, the data bus 607 and the decoder 608 shown in FIG. 29. Such a configuration does not require the modification of the memory size of the response voice memory 614, but requires two combinations of the encoder and the decoder. Incidentally, even if the connections similar to the above mentioned connections are established between the reception memory (received voice memory) 618 and the D/A converter 619 and between the received voice memory 618 and the A/D converter 620, the similar effectiveness can be attained In the configuration shown in FIG. 30A or FIG. 30B, the number of the signal bits changed from a high level to a low level and the number of the signal bits changed from the low level to the high level are equal to or substantially equal to each other, on the bus through which the signal having the many bits is transferred between the response voice memory and the A/D converter and between the response voice memory and the D/A converter. Thus, substantially, the current does not run through the bus as a whole. This can suppress the EMI noise due to the signal transfer, to a minimum. Therefore, this can avoid the obstacle to the sending and receiving operation resulting from the unnecessary electromagnetic wave.

Twelfth Embodiment

Finally, a car navigation apparatus to which the noise suppression circuits according to the first to third embodiments are applied is explained as the twelfth embodiment of the present invention. The car navigation apparatus is comprised by and used in a car, and can receive radio waves from more than two Global Positioning System (GPS) satellites circulating on an orbit at an altitude of 2100 km. And a present position is determined by relative times of arrival of signals from GPS satellites.

Figure 33A:
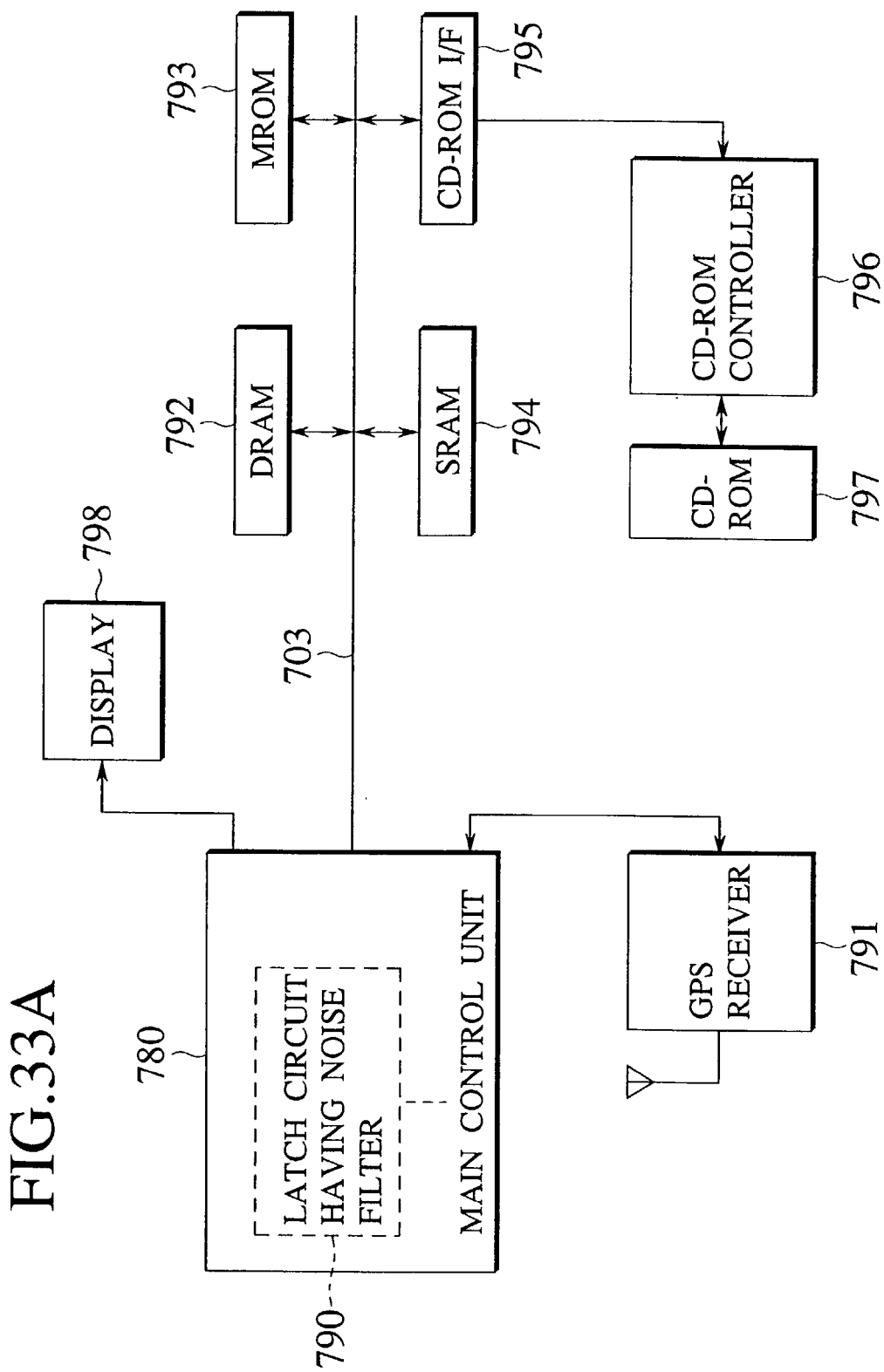
FIG. 33A is a configuration block diagram of a car navigation apparatus according to a twelfth embodiment of the present invention.

FIG. 33A is a configuration block diagram of the car navigation apparatus according to the twelfth embodiment of the present invention. A main control unit 780 is a control unit for controlling the whole operation of the car navigation apparatus, and comprises respective elements shown in FIGS. 33B and 33C. This main control unit 780 comprises, for example, a 32-bit custom RISC microprocessor.

Figure 33B:
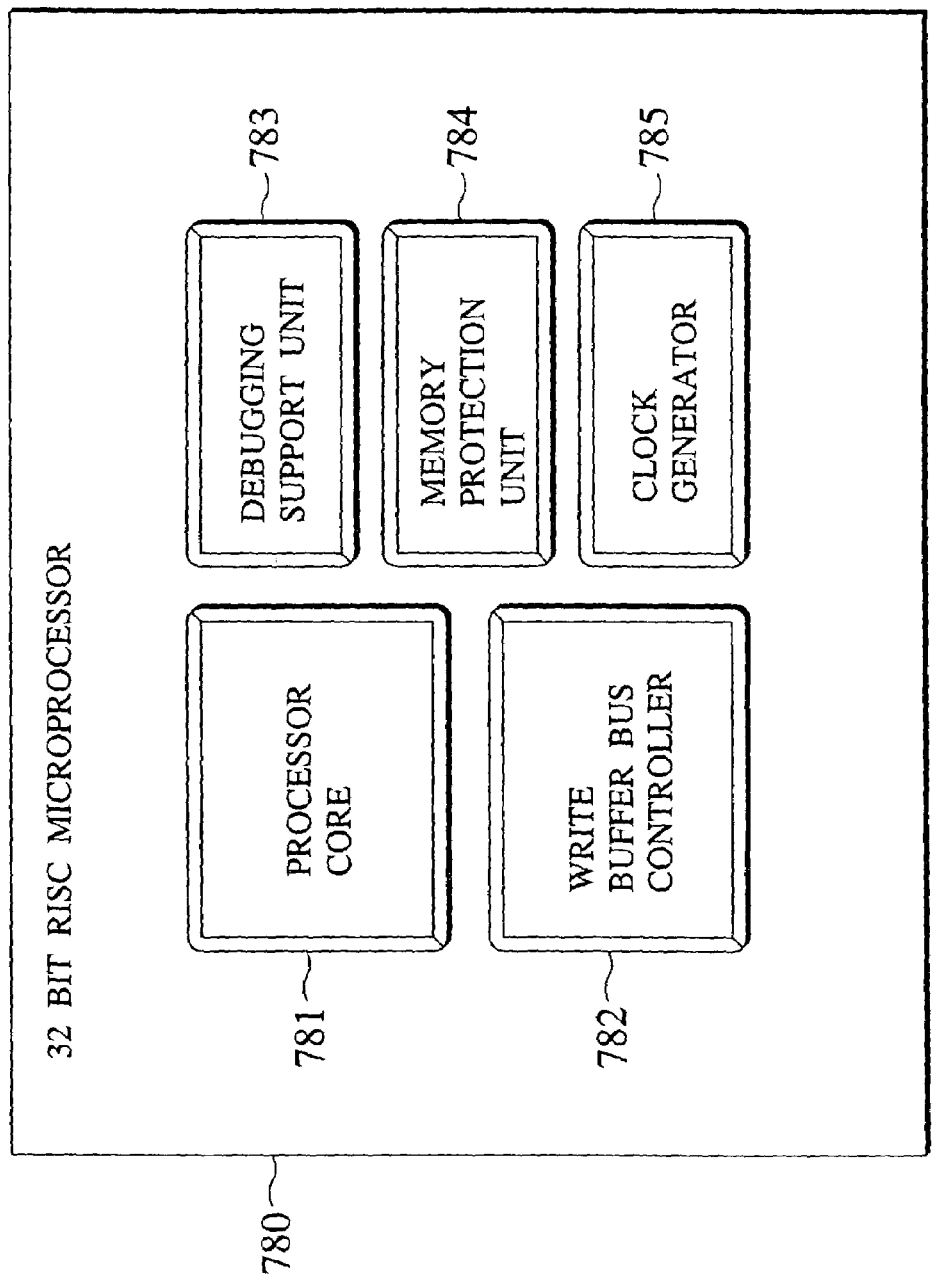
FIG. 33B is a block diagram showing an inner configuration of a microprocessor 780 in FIG. 33A.

As shown in FIG. 33B, this microprocessor 780 comprises a processor core 781 servicing as a core of a processor operation, a write buffer/bus controller 782, a debugging support unit 783, a memory protection unit 784 and a clock generator 785, which are contained in one chip.

Figure 33C:
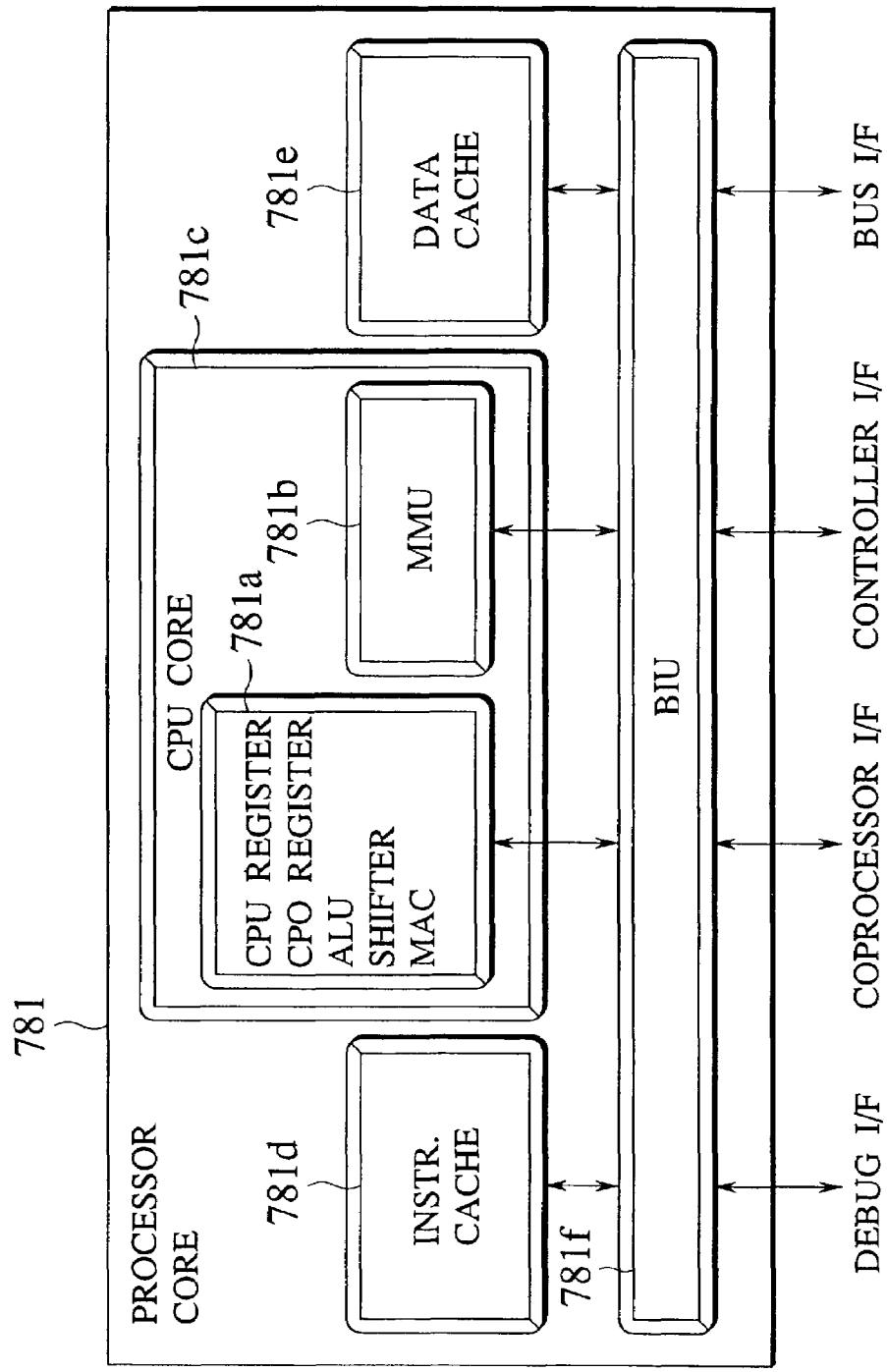
FIG. 33C is a block diagram showing an inner configuration of a processor core 781 in FIG. 33B.

Moreover, as shown in FIG. 33C, the processor core 781 comprises a CPU core 781$c$ composed of a multiplication and addition calculation unit 781$a$ for performing a digital signal processing (DSP) function and a memory management unit (MMU) 781$b$, an instruction cache 781$d$, a data cache 781$e$ and a bus interface unit (MU) 781$f$ for an interface between the respective elements and an external portion.

The all or a part of latch circuits mounted in the respective elements in the main control unit 780 shown in FIGS. 33A and 33B are constituted by the noise suppression latch circuit 790, respectively, in which the noise filter shown in FIGS. 10, 12 and 13A is built. Incidentally, a bypass capacitor C used in the latch circuit 790 may be made according to the gate capacitance of a transistor, or may be the bypass capacitor using the empty space of the gate array or the standard cell shown in the fourth to eight embodiments of the present invention. A limiter resistor R may be made of a polysilicon-resistor or an aluminum resistor.

A GPS receiver 791 in FIG. 33A receives a radio wave of 1575.42 MHz from the GPS satellite and obtains a necessary radio wave of 20 MHz through an RF down converter, a filter, an IF down converter and the like. In FIG. 33A, a system bus 703 is connected to a DRAM 792 used as a frame buffer and a system memory, a mask ROM (MROM) 793 used as a program memory and a character generator, an SRAM 794 used as a work area and a CD-ROM interface 795. A CD-ROM controller 796 is connected to the CD-ROM interface 795. The CD-ROM controller 796 has a function of controlling a drive for a CD-ROM 797 in which a map software and the like are stored and decoding the stored data. That is, the DRAM 792, the mask ROM 793, the SRAM 794 and the CD-ROM interface 795 are connected through the system bus 703 to the main control unit 780. Then, a map information and the like are displayed on a display 798.

Usually, in many cases, the car navigation apparatus employs a method of drawing out the map information from the CD-ROM 797 and displaying on the display 798 installed in the car and then selecting the shortest course from its present position to a destination. In the operation, there may be a case that a strong EMI noise is generated in the conventional car navigation apparatus, which causes the EMI noise to enter, for example, an FM radio receiver mounted near the apparatus.

In contrast with this, the car navigation apparatus comprising the latch circuit 790 having the noise filter in the twelfth embodiment of the present invention can largely suppress the switching noise resulting from the latch circuit operated in synchronization with the clock signal within the integrated circuit and thereby suppresses the generation of the EMI noise as the whole system and accordingly obviates the trouble in the prior art.

Various modifications will become possible for those skilled in the art after receiving the teachings of the present disclosure without departing from the scope thereof.

What is claimed is:

1. A communication apparatus comprising:
   (a) a first A/D converter for converting a first analog signal to be sent into a first n-bit digital signal composed of "0" and "1";
   (b) a first encoder which is connected to the first A/D converter and that encodes all bit column patterns composed of said first n-bit digital signal, by correlating with a first m-bit (m>n) bit column pattern, in which the number of "0" is equal to the number of "1", in a one-to-one relationship;
   (c) first m data buses which are connected to the first encoder and that send the first m-bit bit column pattern obtained by the first encoder;
   (d) a transmission memory connected to the first data buses;
   (e) second m data buses which are connected to the transmission memory and that send said first m-bit bit column pattern;
   (f) a first decoder which is connected to the second data buses, that receives the first m-bit bit column pattern sent through the second data buses and decodes the first m-bit bit column pattern to the corresponding second n-bit transmission data;
   (g) a first D/A converter which is connected to the first decoder and that converts said second n-bit transmission data into a second analog signal;
   (h) a transmitter signal processor connected to the first D/A converter; and
   (i) a wireless transmitter connected to the transmitter signal processor.

2. The communication apparatus of claim 1, further comprising:
   (j) a wireless receiver;
   (k) a received signal processor connected to the wireless receiver;
   (l) a second A/D converter which is connected to the received signal processor and that converts a received third analog signal into a third n-bit digital signal composed of "0" and "1";
   (m) a second encoder which is connected to the second A/D converter and that encodes all bit column patterns composed of said third n-bit digital signal, by correlating with a second m-bit (m>n) bit column pattern, in which the number of "0" is equal to the number of "1", in a one-to-one relationship;
   (n) third m data buses which are connected to the second encoder and that send the second m-bit bit column pattern obtained by the second encoder;
   (o) a reception memory connected to the third data bus;
   (p) fourth m data buses which are connected to the reception memory and that send said second m-bit bit column pattern;
   (q) a second decoder which is connected to the fourth data buses, that receives the second m-bit bit column pattern sent through the fourth data buses and decodes the second m-bit bit column pattern to the corresponding fourth n-bit reception data;
   (r) a second D/A converter which is connected to the second decoder and that converts said fourth n-bit reception data into a fourth analog signal; and
   (s) a speaker for reproducing the fourth analog signal to a voice.

3. The communication apparatus of claim 2, further comprising:
   (t) a third decoder which is connected between said first data buses and said transmission memory, that receives said first m-bit bit column pattern sent through said first data buses and decodes the first m-bit bit column pattern to the corresponding fifth n-bit transmission data;
   (u) a third encoder which is connected between said transmission memory and said second data buses and that encodes all bit column patterns composed of said fifth n-bit digital signal stored in said transmission memory, to said first m-bit (m>n) bit column pattern;
   (v) a fourth decoder which is connected between said third data buses and said reception memory, that receives said second m-bit bit column pattern sent through said third data buses and decodes the second m-bit bit column pattern to the corresponding sixth n-bit reception data; and
   (w) a fourth encoder which is connected between said reception memory and said fourth data buses and that encodes all bit column patterns composed of said sixth n-bit digital signal stored in said reception memory, to said second in-bit (m>n) bit column pattern.

* * * * *